(12) United States Patent
Lan et al.

(10) Patent No.: US 11,257,903 B2
(45) Date of Patent: Feb. 22, 2022

(54) METHOD FOR MANUFACTURING SEMICONDUCTOR STRUCTURE WITH HYBRID NANOSTRUCTURES

(71) Applicant: Taiwan Semiconductor Manufacturing Co., Ltd., Hsinchu (TW)

(72) Inventors: Wen-Ting Lan, Hsinchu (TW); Guan-Lin Chen, Baoshan Township, Hsinchu County (TW); Shi-Ning Ju, Hsinchu (TW); Kuo-Cheng Chiang, Zhubei (TW); Chih-Hao Wang, Baoshan Township, Hsinchu County (TW); Ching-Wei Tsai, Hsinchu (TW); Kuan-Lun Cheng, Hsin-Chu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 27 days.

(21) Appl. No.: 16/697,647

(22) Filed: Nov. 27, 2019

(65) Prior Publication Data
US 2021/0159311 A1    May 27, 2021

(51) Int. Cl.
| | |
|---|---|
| H01L 29/06 | (2006.01) |
| H01L 27/088 | (2006.01) |
| H01L 29/78 | (2006.01) |
| H01L 21/8234 | (2006.01) |
| H01L 29/66 | (2006.01) |

(52) U.S. Cl.
CPC .. *H01L 29/0673* (2013.01); *H01L 21/823431* (2013.01); *H01L 21/823481* (2013.01); *H01L 27/0886* (2013.01); *H01L 29/66795* (2013.01); *H01L 29/785* (2013.01); *H01L 2029/7858* (2013.01)

(58) Field of Classification Search
CPC ..... H01L 2029/7858; H01L 21/823431; H01L 21/823481; H01L 27/0886; H01L 29/0673; H01L 29/66795; H01L 29/785
See application file for complete search history.

(56) References Cited

U.S. PATENT DOCUMENTS

| | | | |
|---|---|---|---|
| 2015/0061154 A1* | 3/2015 | Choi | H01L 23/528 257/774 |
| 2021/0043763 A1* | 2/2021 | Jung | H01L 29/42392 |

* cited by examiner

*Primary Examiner* — Mohammed Shamsuzzaman
(74) *Attorney, Agent, or Firm* — McClure, Qualey & Rodack, LLP

(57) ABSTRACT

Semiconductor structures and method for manufacturing the same are provided. The method for manufacturing the semiconductor structure includes forming a first fin structure including first semiconductor material layers and second semiconductor material layers alternately stacked over a substrate and forming an isolation structure surrounding the first fin structure. The method for manufacturing the semiconductor structure also includes forming a first capping layer over the isolation structure and covering a top surface and sidewalls of the first fin structure and etching the isolation structure to form a first gap between the first capping layer and a top surface of the isolation structure. The method for manufacturing the semiconductor structure also includes forming a protection layer covering a sidewall of the first capping layer and filling in the first gap.

20 Claims, 46 Drawing Sheets

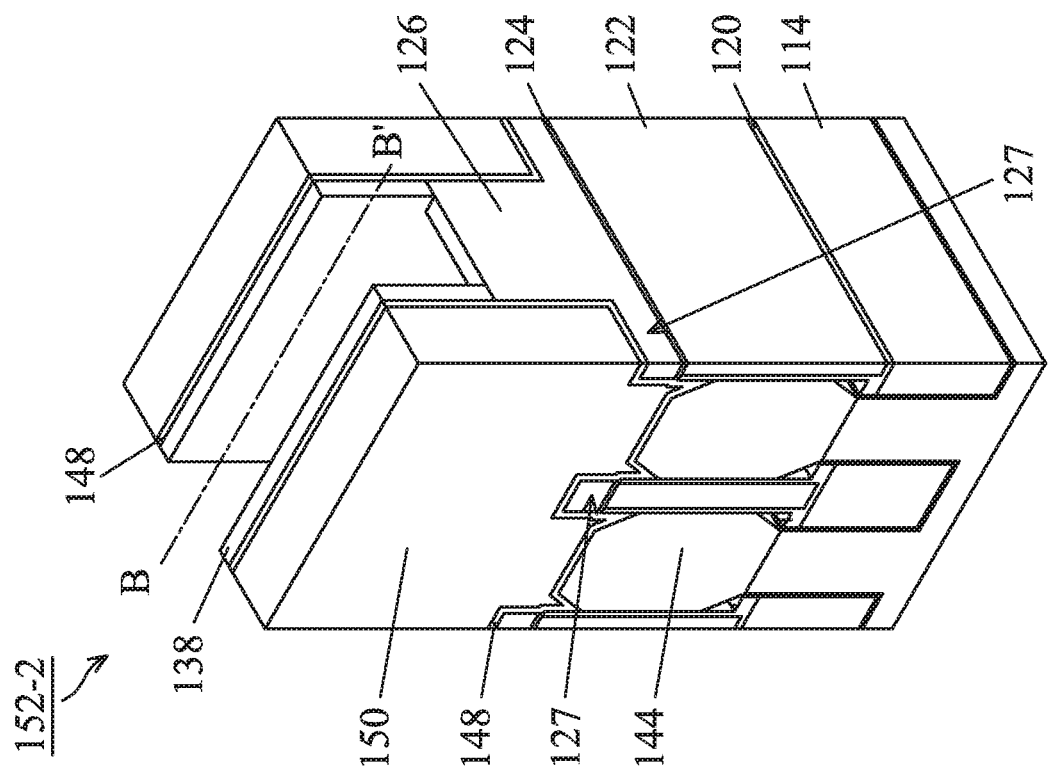
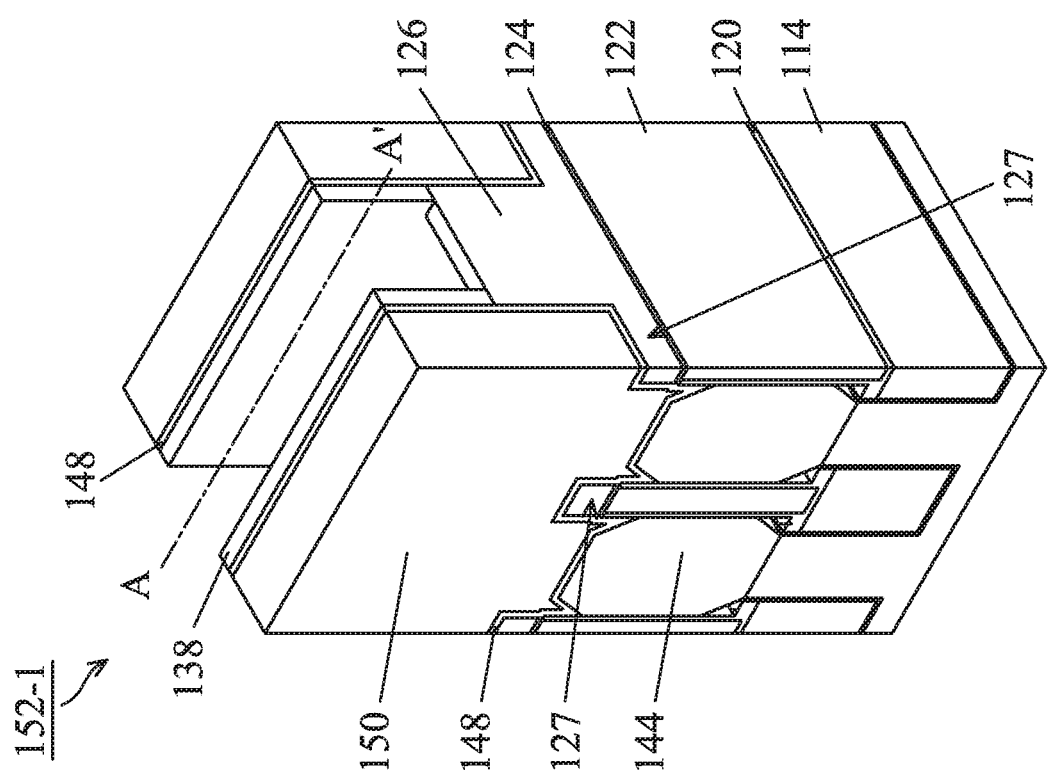

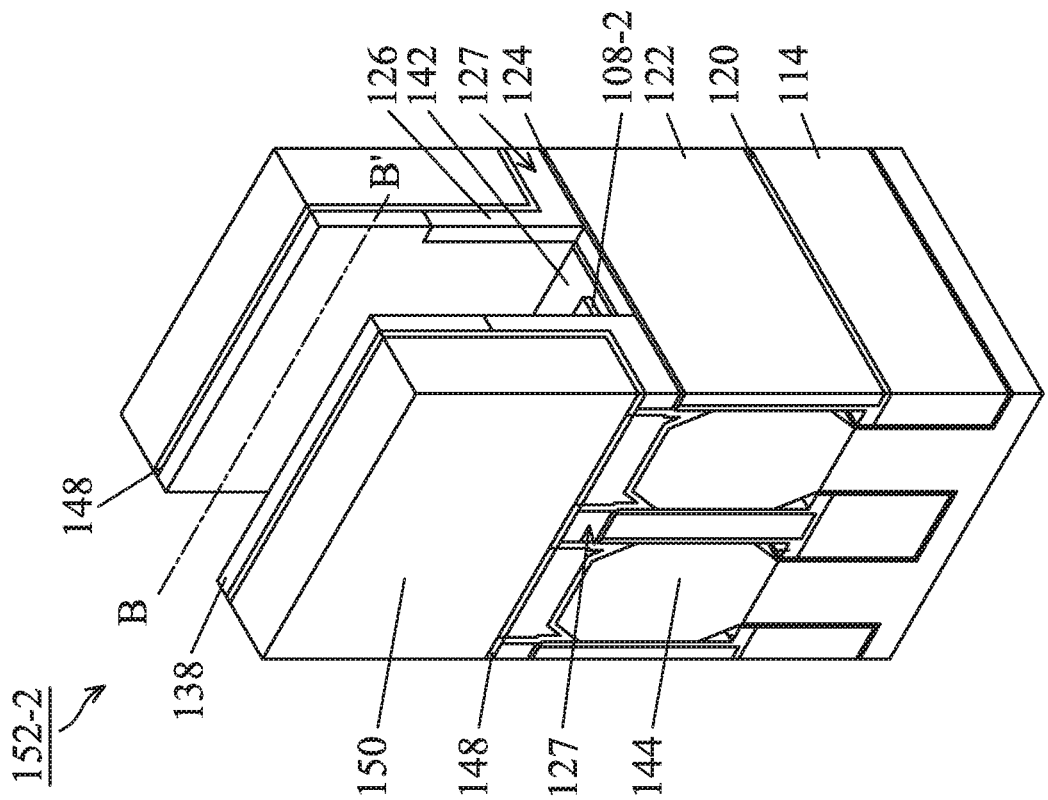
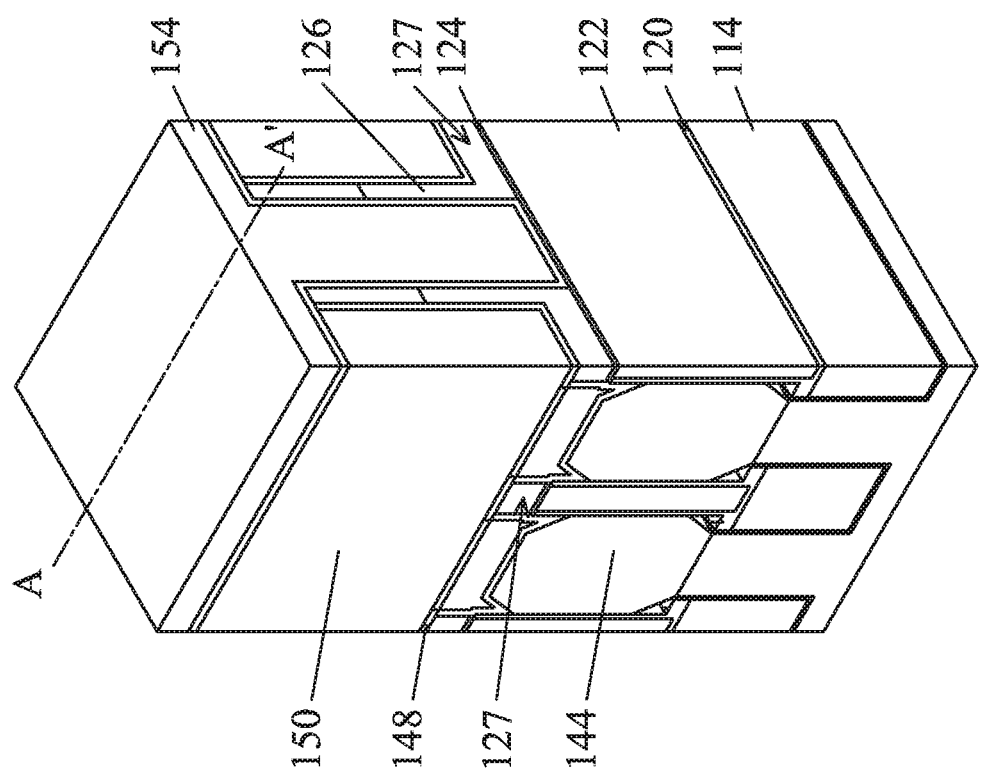
FIG. 1Q-1
FIG. 1Q-2

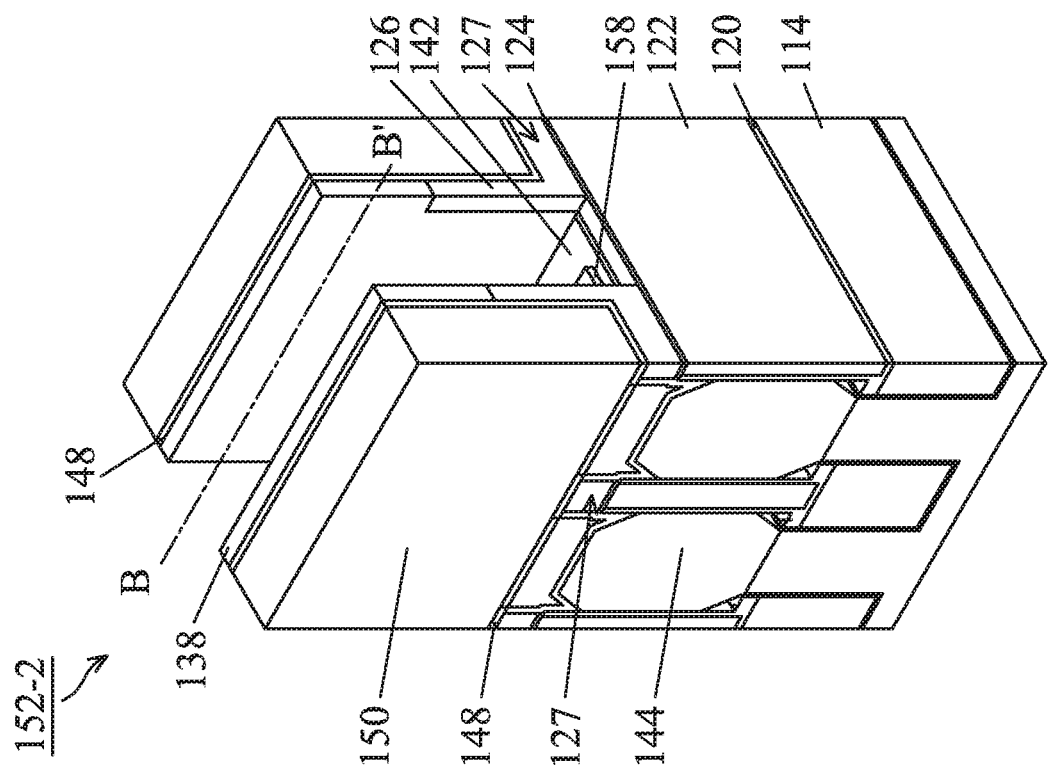
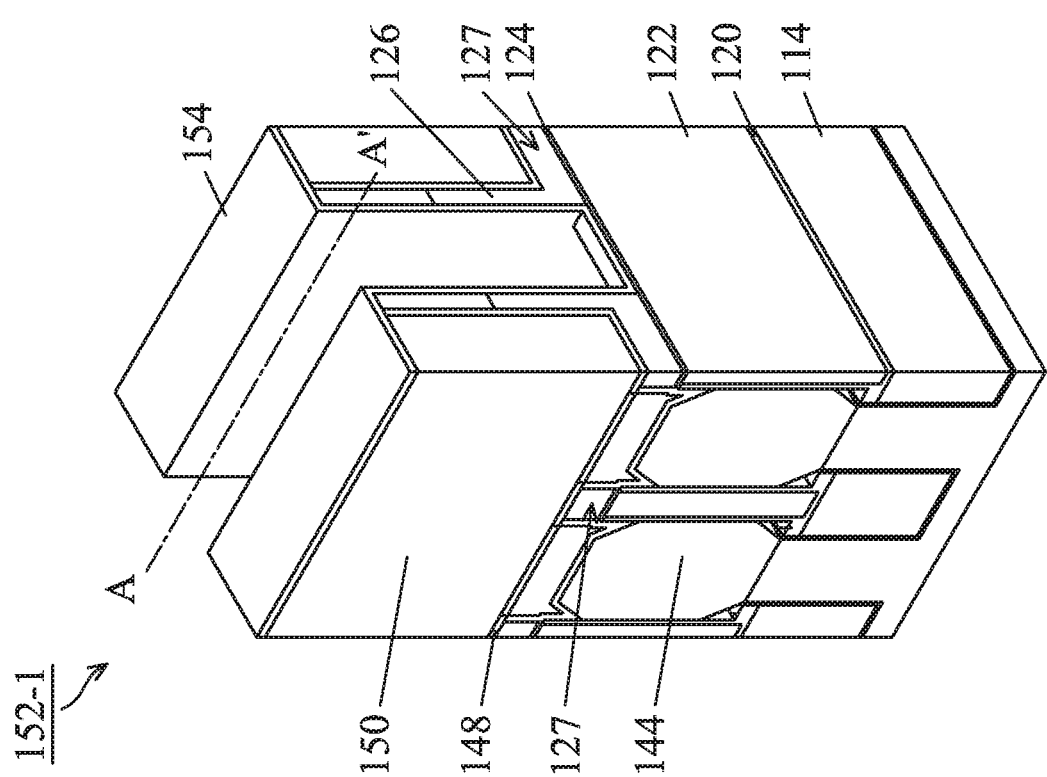

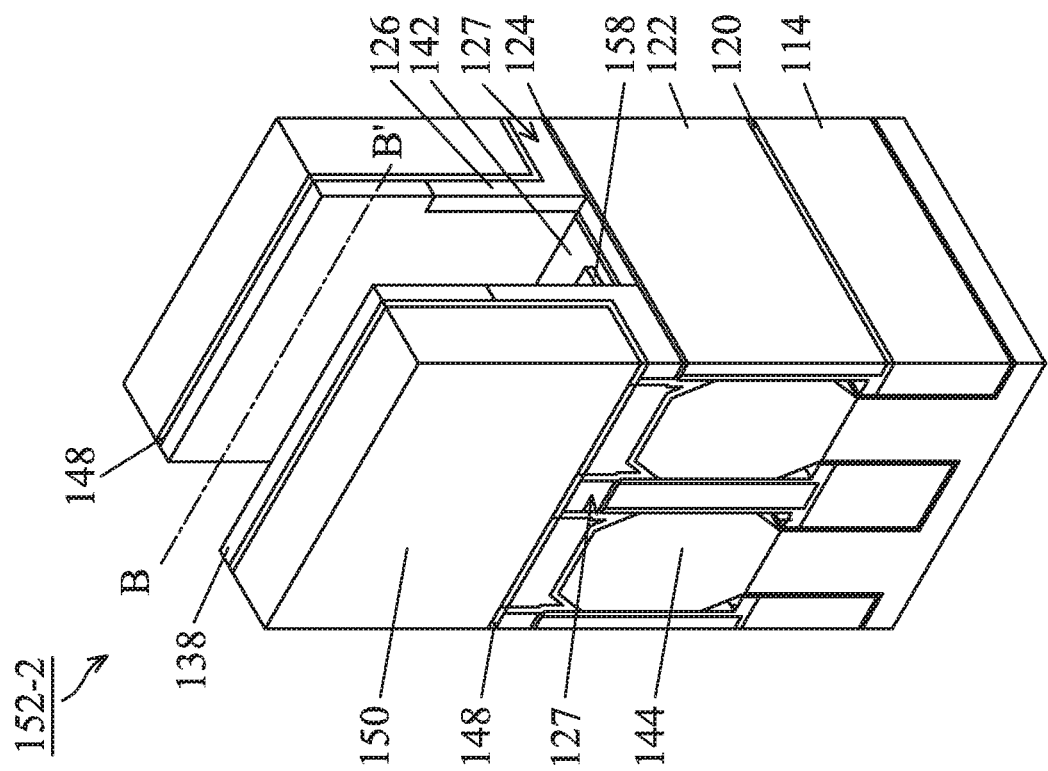
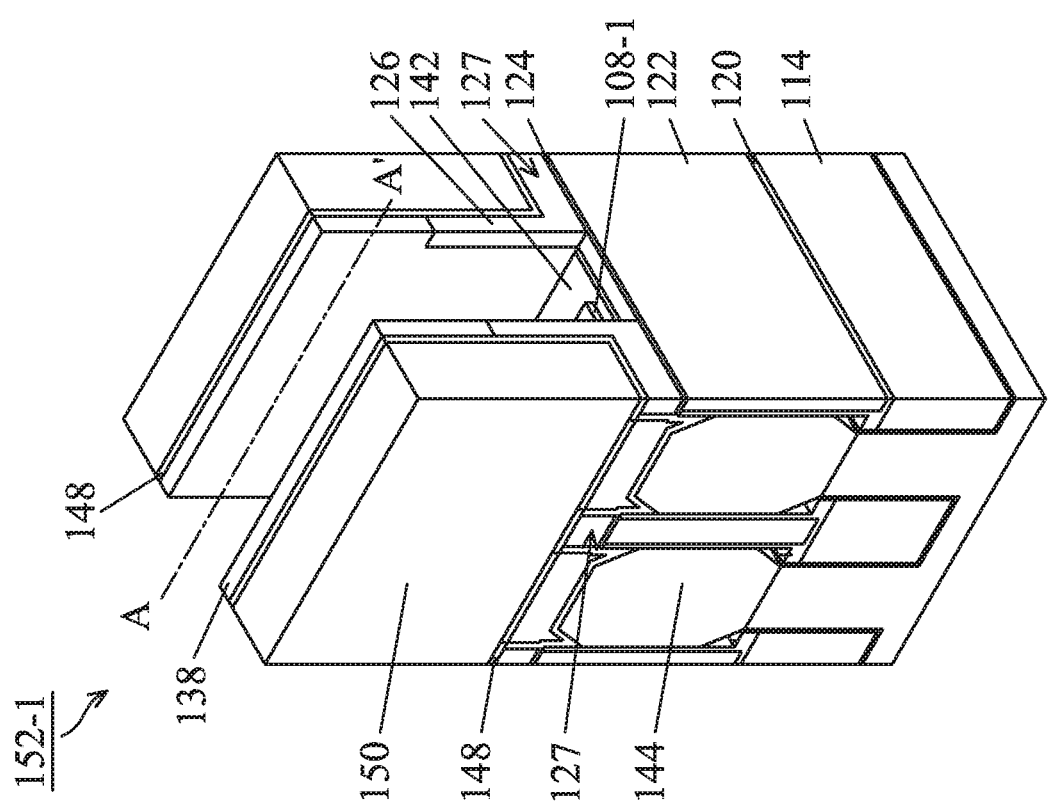
FIG. 1S-1
FIG. 1S-2

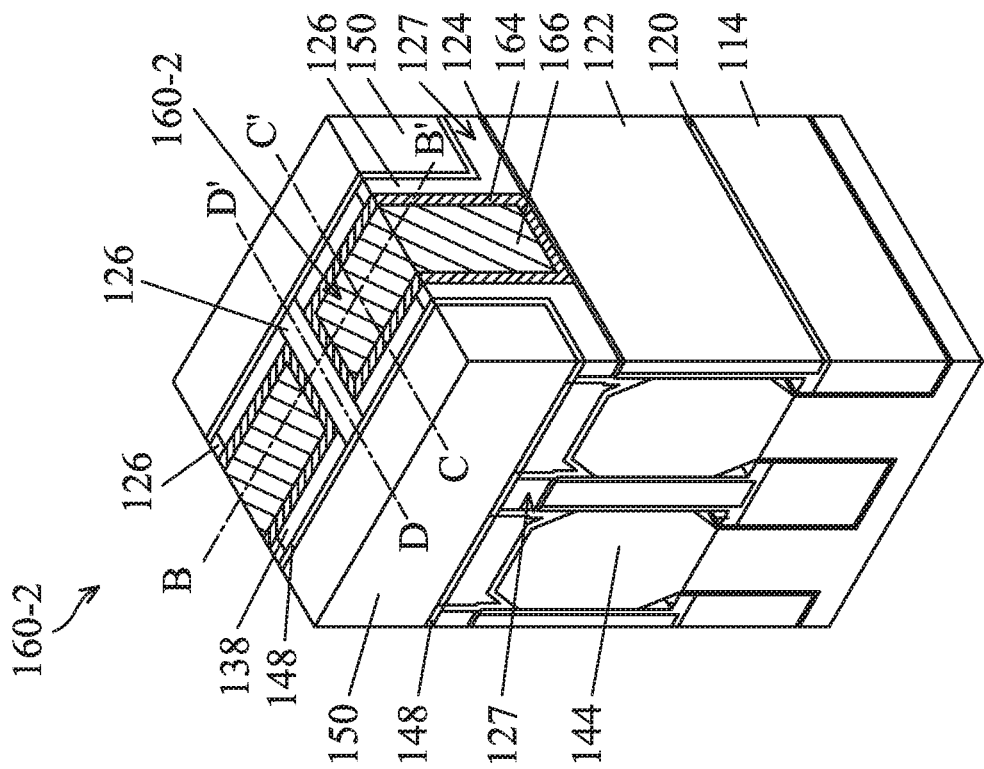
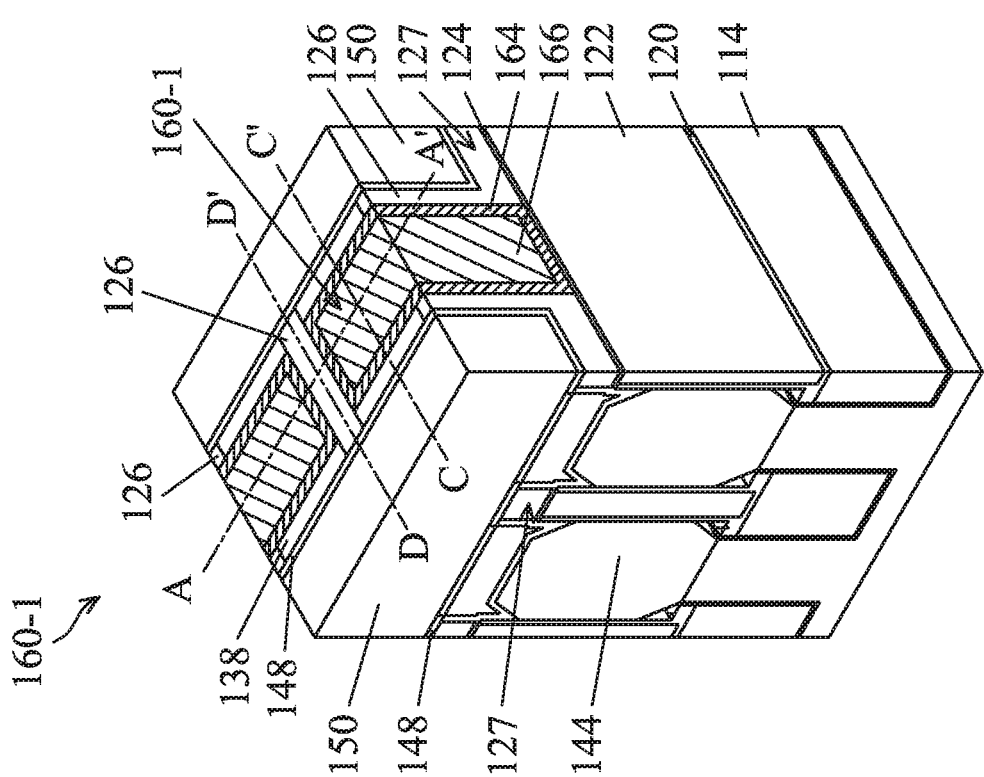
FIG. 1T-1
FIG. 1T-2

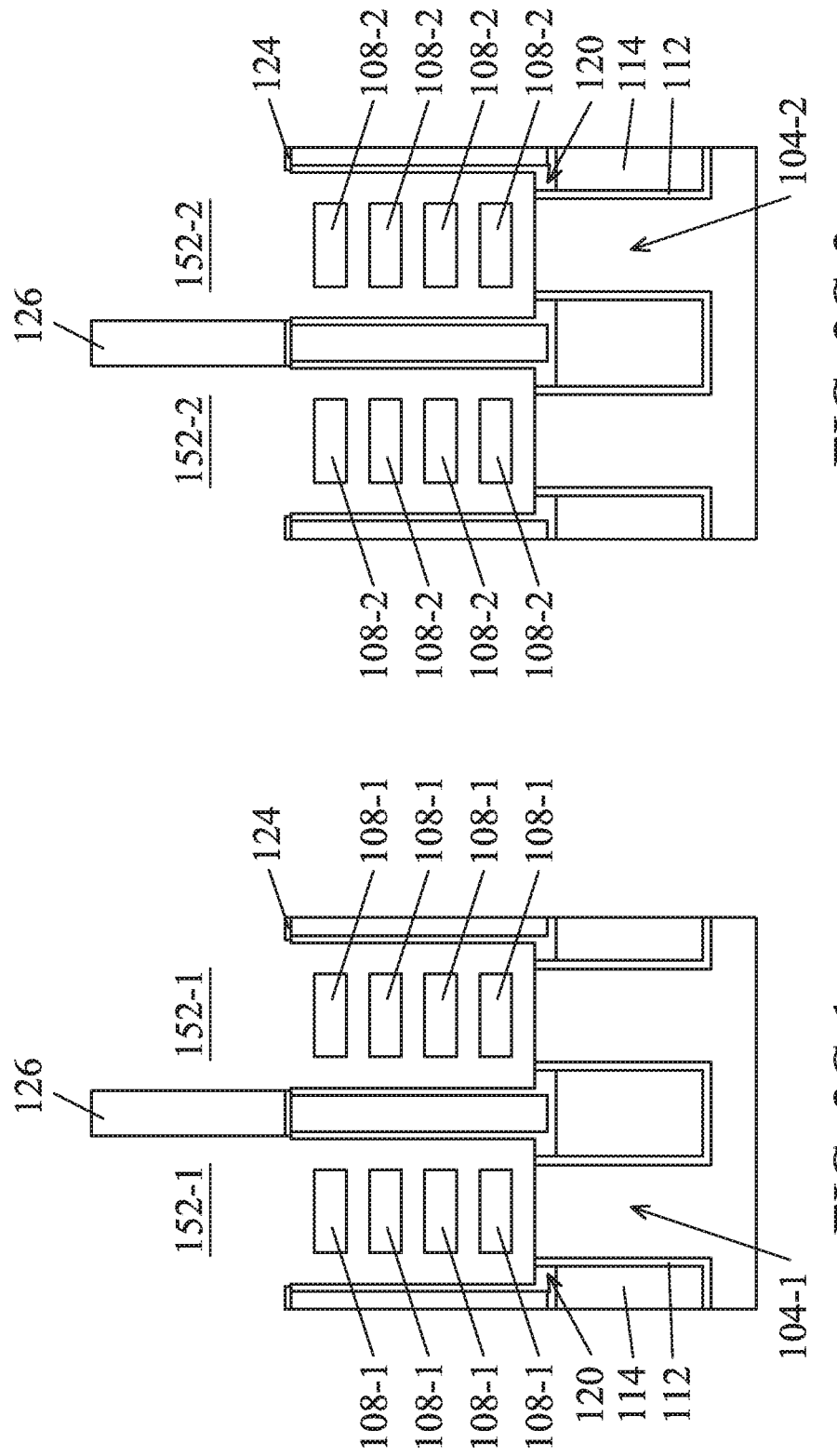

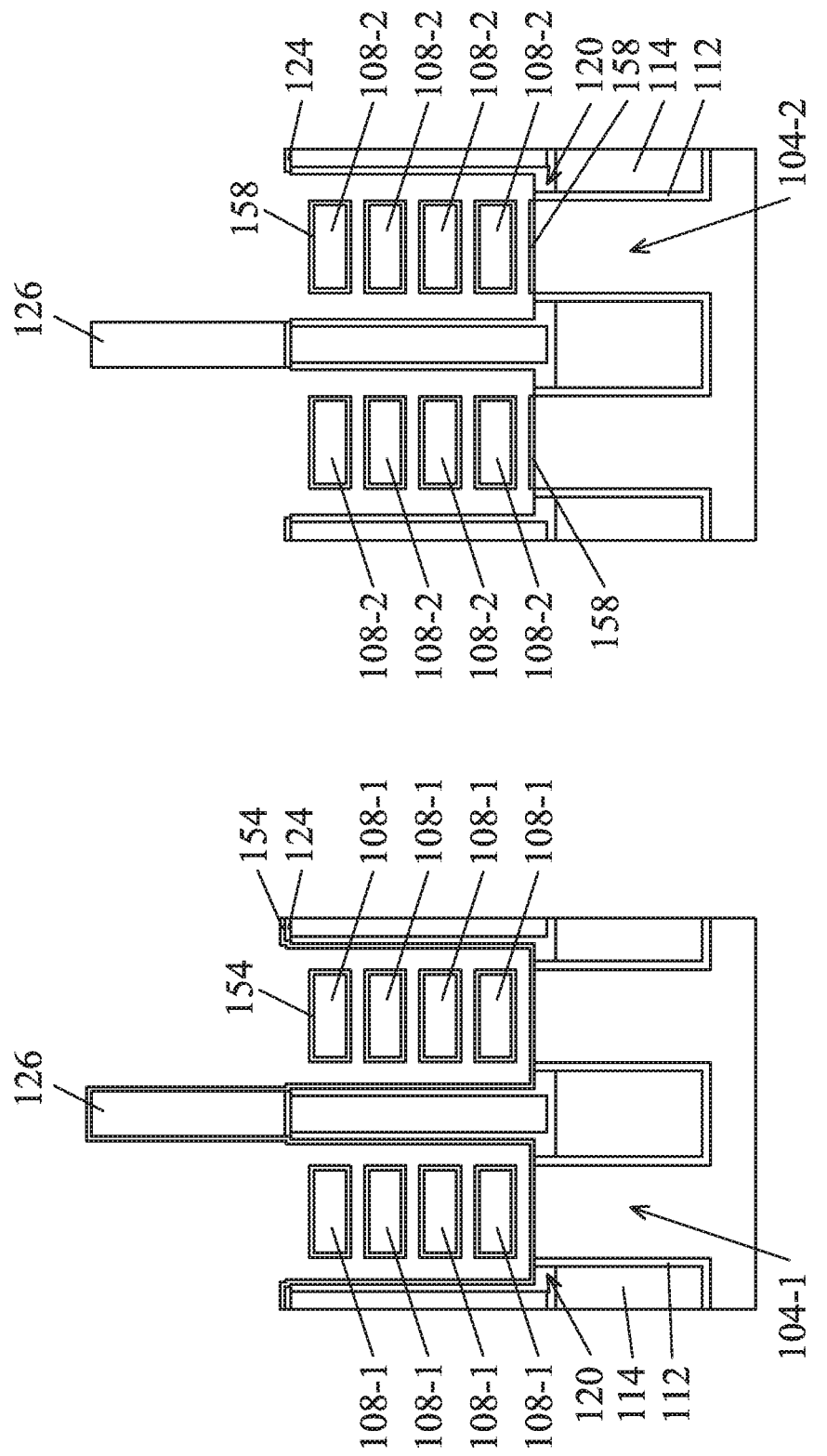

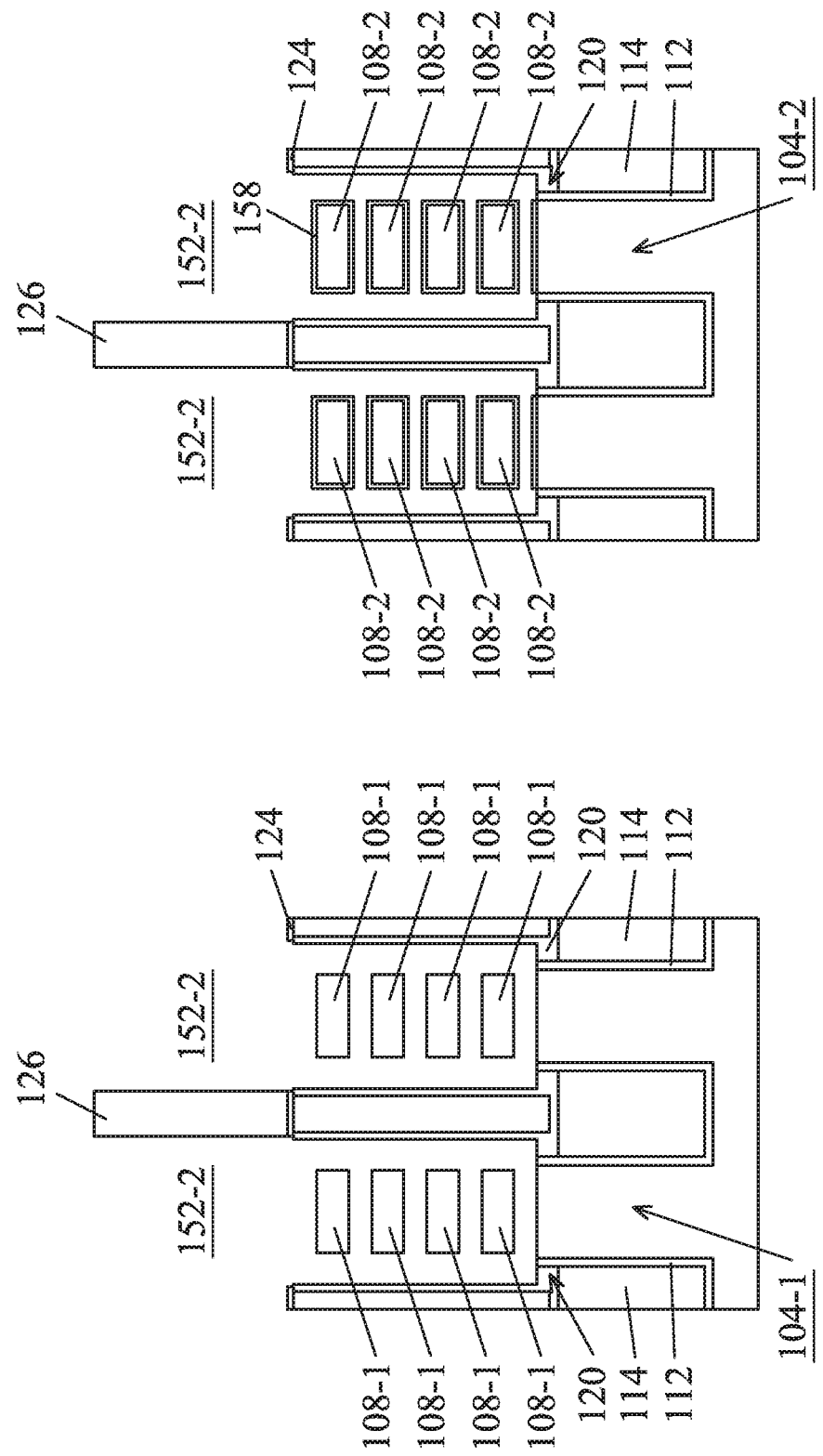

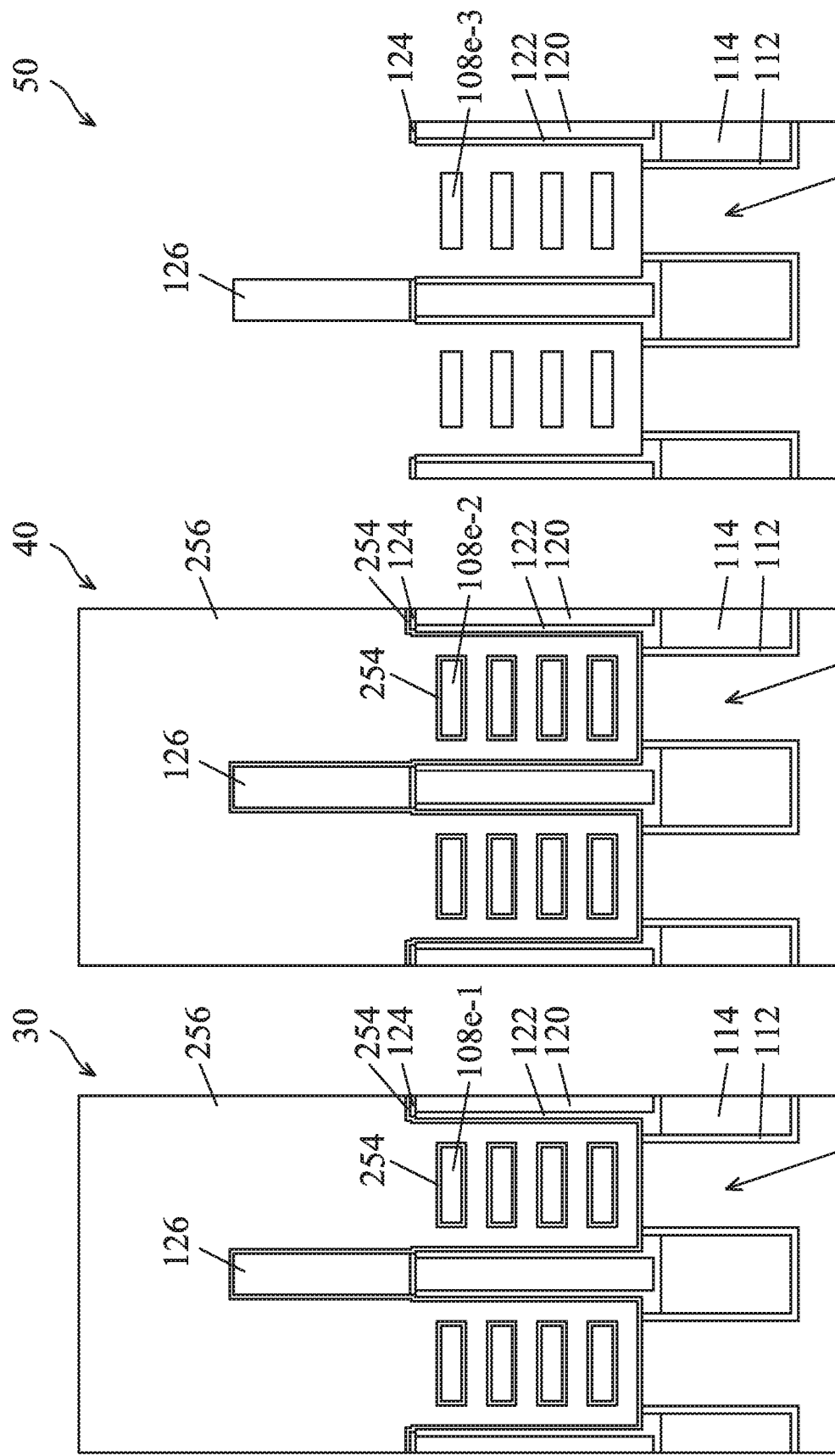

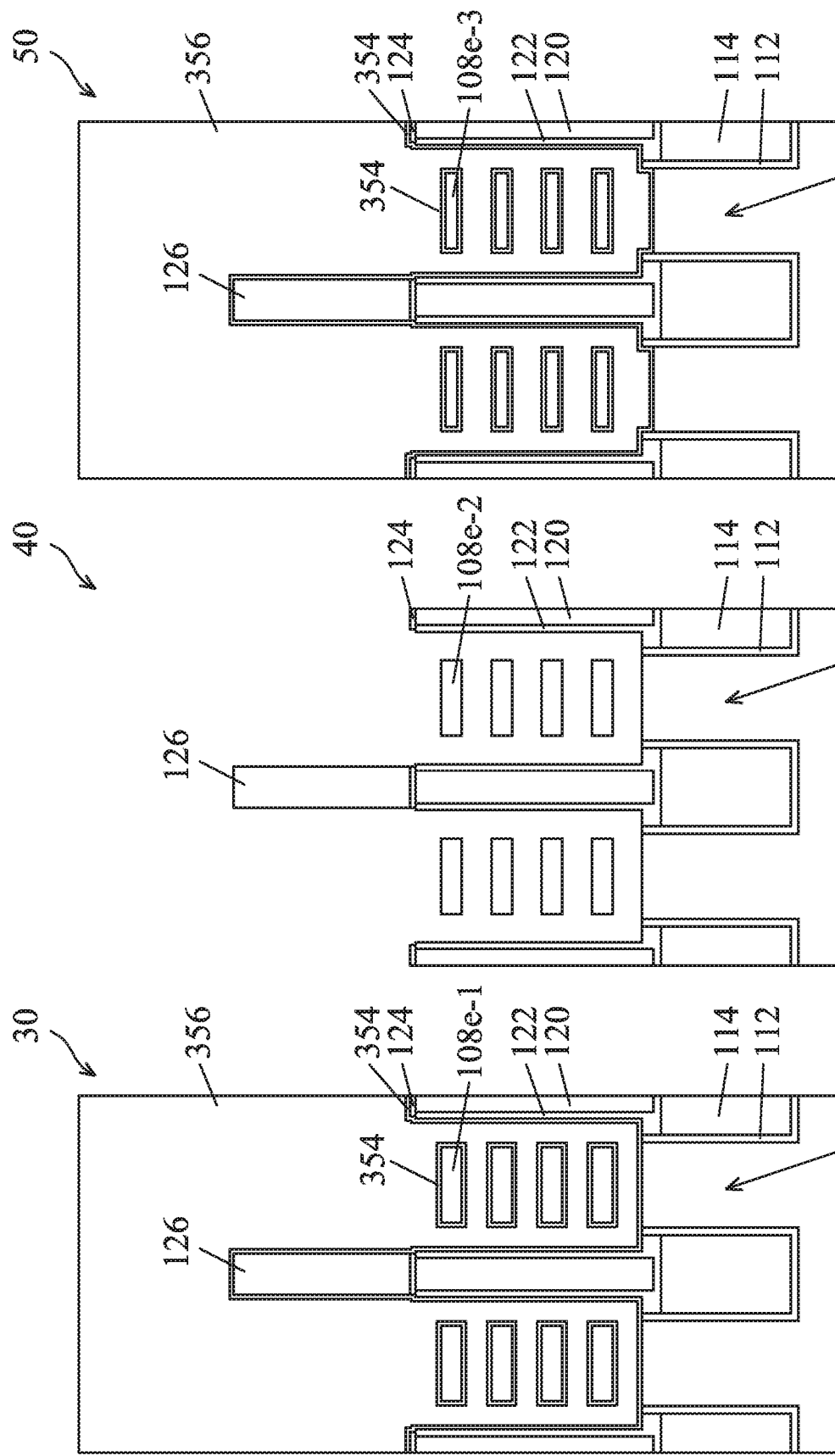

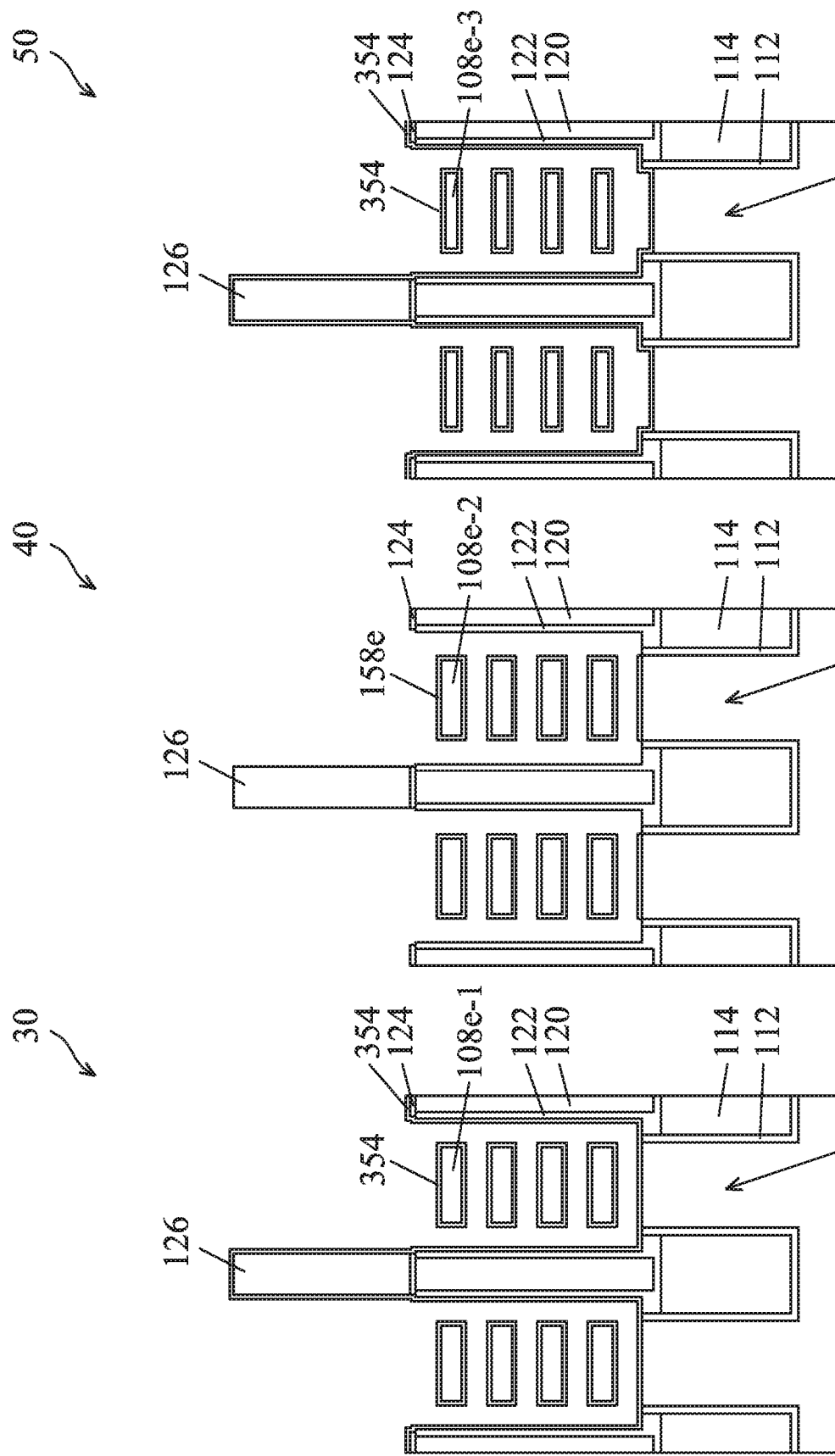

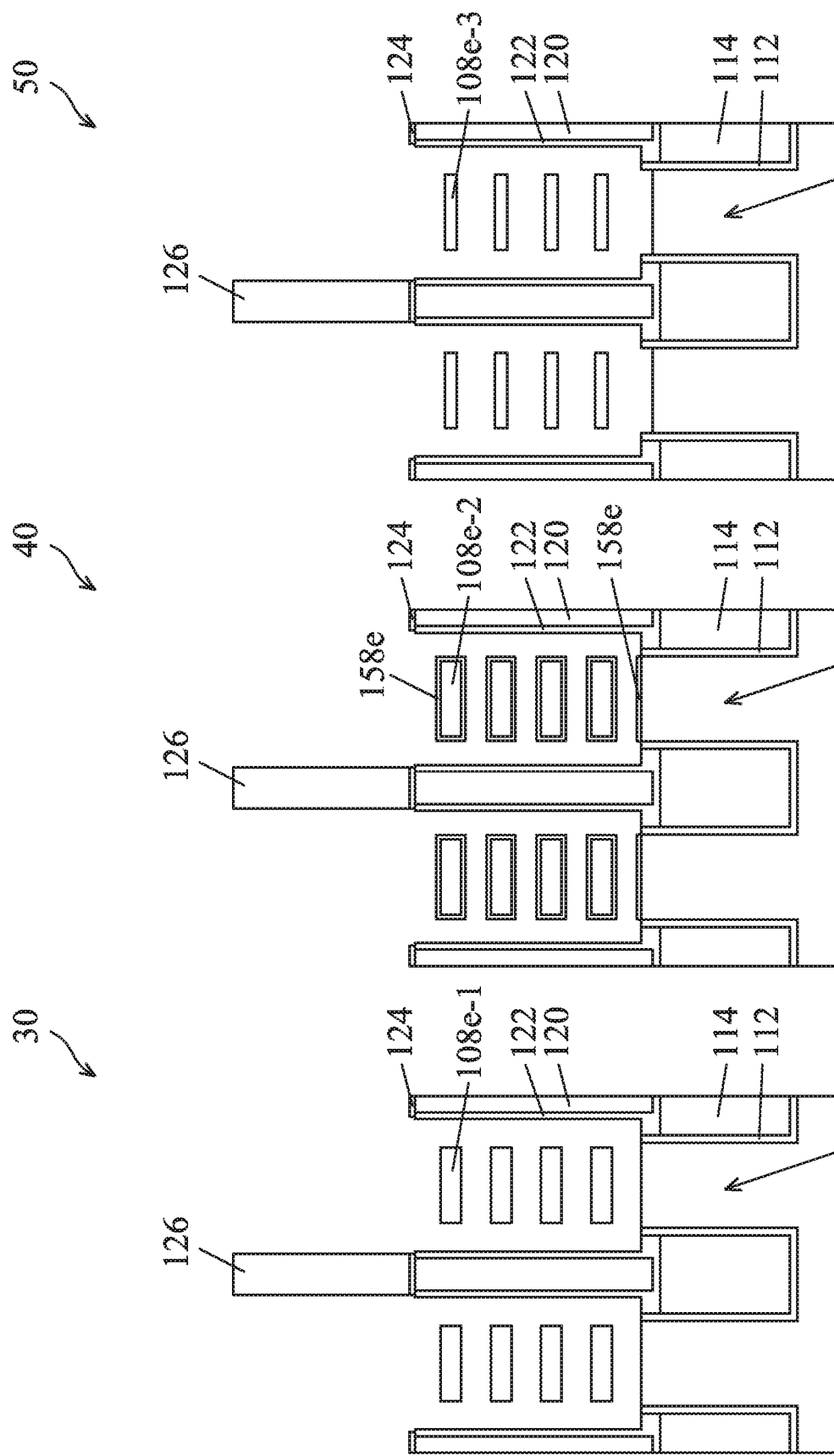

METHOD FOR MANUFACTURING SEMICONDUCTOR STRUCTURE WITH HYBRID NANOSTRUCTURES

BACKGROUND

The electronics industry is experiencing an ever-increasing demand for smaller and faster electronic devices which are able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. However, integration of fabrication of the GAA features can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 1A-1 to 1T-1 and 1A-2 to 1T-2 illustrate perspective views of intermediate stages of manufacturing a semiconductor structure in accordance with some embodiments.

FIGS. 2A-1 to 2G-1 illustrate cross-sectional representations of various stages of manufacturing the semiconductor structure shown along line A-A' in the first region in FIGS. 1N-1 to 1T-1 in accordance with some embodiments.

FIGS. 2A-2 to 2G-2 illustrate cross-sectional representations of various stages of manufacturing the semiconductor structure shown along line B-B' in the second region in FIG. 1N-2 to 1T-2 in accordance with some embodiments.

FIGS. 3A-1 and 3A-2 illustrate cross-sectional representations of the semiconductor structure alone C-C' shown in FIGS. 1T-1 and 1T-2 respectively in accordance with some embodiments.

FIGS. 3B-1 and 3B-2 illustrates a cross-sectional representation of the semiconductor structure alone D-D' shown in FIGS. 1T-1 and 1T-2 respectively in accordance with some embodiments.

FIGS. 10A-1 to 10E-1, 10A-2 to 10E-2, and 10A-3 to 10E-3 illustrate cross-sectional representations of various stages of manufacturing the semiconductor structure in accordance with some embodiments.

DETAILED DESCRIPTION

Figures 1, 1A:
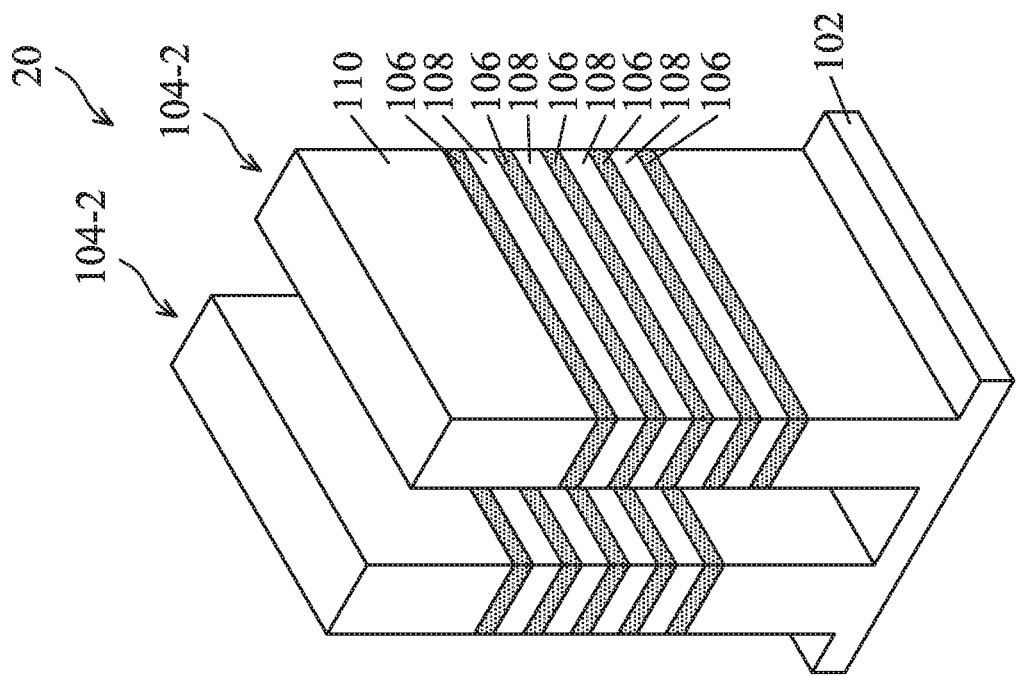

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Generally, a semiconductor device may include transistors with different designs. For example, the channel regions in gate-all-around transistors may have different thicknesses and/or spacing, and they may be made of different materials. However, if the channel regions in these transistors are made separately, complicated manufacturing processes may be required. Accordingly, embodiments for manufacturing semiconductor structures with different channel regions are provided.

The semiconductor structures may include nanostructures as channel regions formed between source/drain structures. The manufacturing of the semiconductor structures may include forming semiconductor material stacks over a substrate and patterning the semiconductor material stacks to form fin structures. An isolation structure may be formed around the fin structures, and a protection layer may be formed over the isolation structure. Afterwards, some portions of the semiconductor material stacks may be removed to form the channel regions, and the protection layer may protect the isolation structure from being removed (e.g. etched) during the processes. Accordingly, the risk of circuit short between the source/drain structure and the gate structure due to the loss of the isolation structure may be reduced.

FIGS. 1A-1 to 1T-1 and 1A-2 to 1T-2 illustrate perspective views of intermediate stages of manufacturing a semiconductor structure 100 in accordance with some embodiments. More specifically, FIGS. 1A-1 to 1T-1 illustrate perspective views shown in a first region 10 of the semiconductor structure 100, and FIGS. 1A-2 to 1T-2 illustrate perspective views shown in a second region 20 of the semiconductor structure 100 in accordance with some embodiments.

Figures 1, 1A, 2:
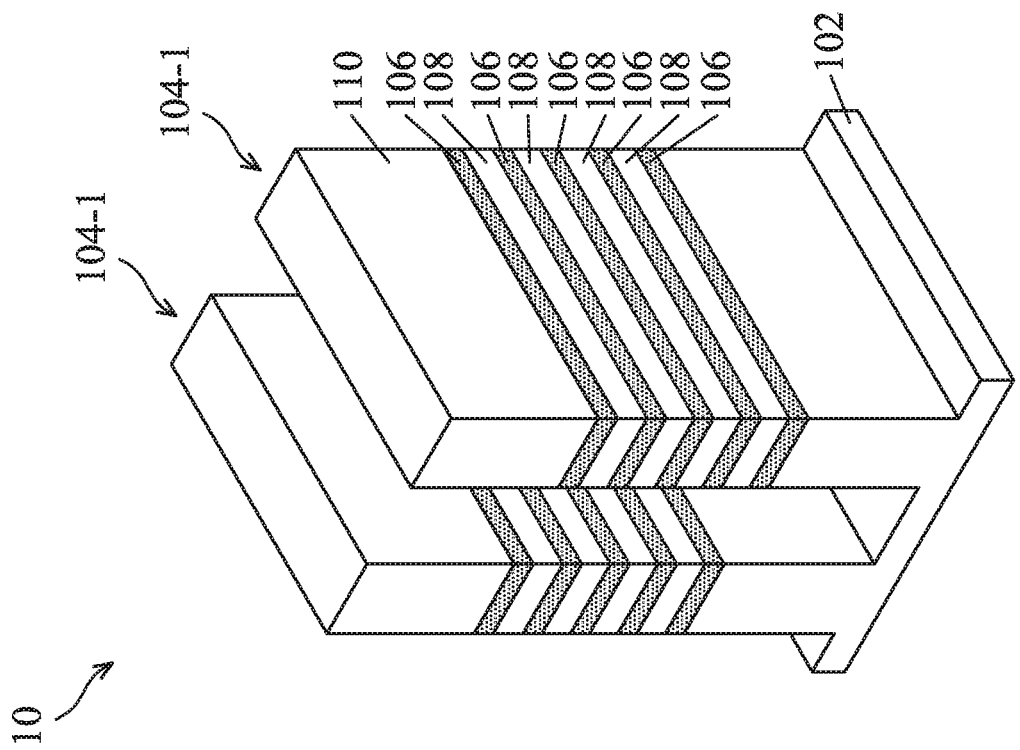

As show in FIGS. 1A-1 and 1A-2, fin structures 104-1 and 104-2 are formed over a substrate 102 in accordance with some embodiments. More specifically, the fin structures 104-1 are formed over the first region 10 of the substrate 102, and the fin structures 104-2 are formed in the second region 20 of the substrate 102 in accordance with some embodiments.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, first semiconductor material layers 106 and second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although five first semiconductor material layers 106 and four second semiconductor material layers 108 are formed, the semiconductor structure may include more or less numbers of the first semiconductor material layers 106 and the second semiconductor material layers 108. For example, the semiconductor structure may include two to five of the first semiconductor material layers 106 and the second semiconductor material layers individually.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

After the first semiconductor material layers 106 and the second semiconductor material layers 108 are formed as a semiconductor material stack over the substrate 102, the semiconductor material stack is patterned to form the fin structures 104-1 and 104-2, as shown in FIGS. 1A-1 and 1A-2 in accordance with some embodiments. In some embodiments, the patterning process includes forming a hard mask layer 110 over the semiconductor material stack, and etching the semiconductor material stack and the underlying substrate 102 through the hard mask layer 110. In some embodiments, the hard mask layer 110 is a multilayer structure including a pad oxide layer and a nitride layer formed over the pad oxide layer. The pad oxide layer may be made of silicon oxide, which is formed by thermal oxidation or CVD, and the nitride layer may be made of silicon nitride, which is formed by CVD, such as LPCVD or plasma-enhanced CVD (PECVD).

Figures 1, 1B:
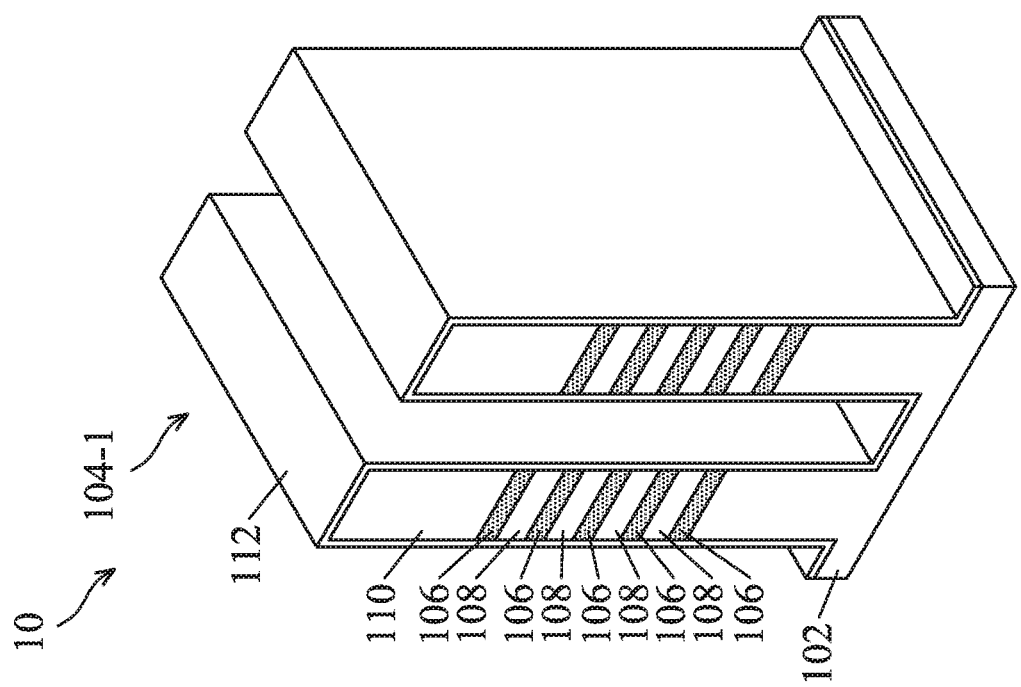
Figures 1, 1B, 2:
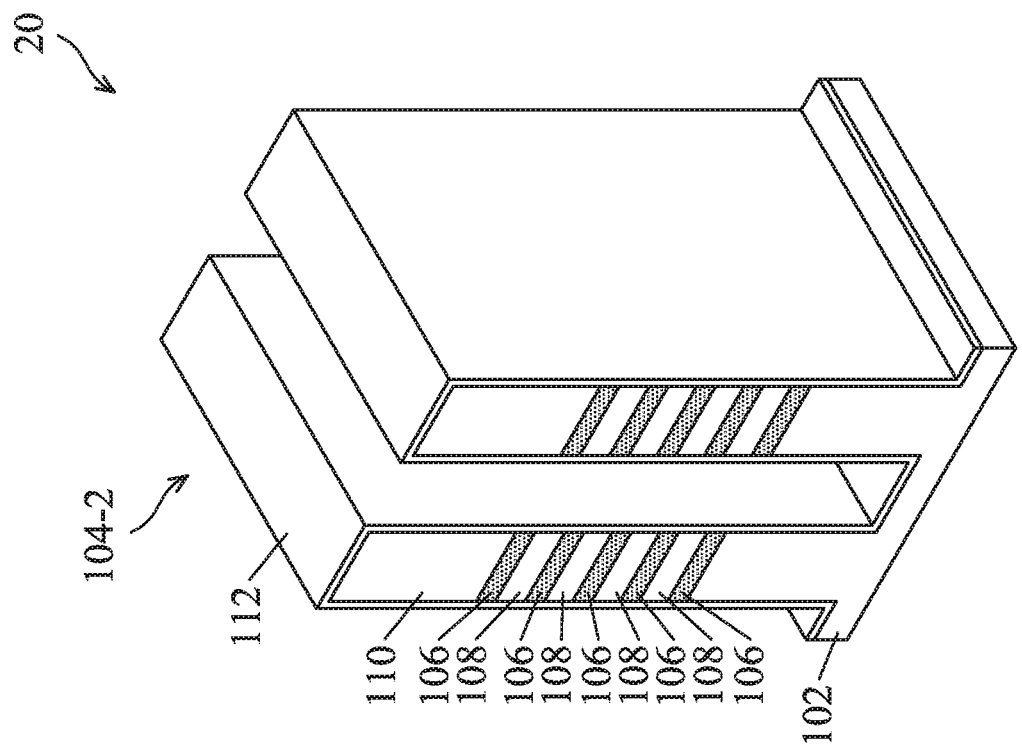

After the fin structures 104-1 and 104-2 are formed, liner layer 112 are conformally formed on the first region 10 and the second region 20 to cover the fin structures 104-1 and 104-2, as shown in FIGS. 1B-1 and 1B-2 in accordance with some embodiments. The liner layers 112 may be configured to help the capping layers formed afterwards to grow on fin structures 104-1 and 104-2 in subsequent manufacturing processes.

In some embodiments, the liner layers 112 are Si layers. In some embodiments, the liner layer 112 has a thickness in a range from about 3 nm to about 5 nm. The liner layer 112 may be thinned in subsequent processes, and therefore it may be grown relatively thick at first to prevent being etched through during subsequent processes.

Figures 1, 1C:
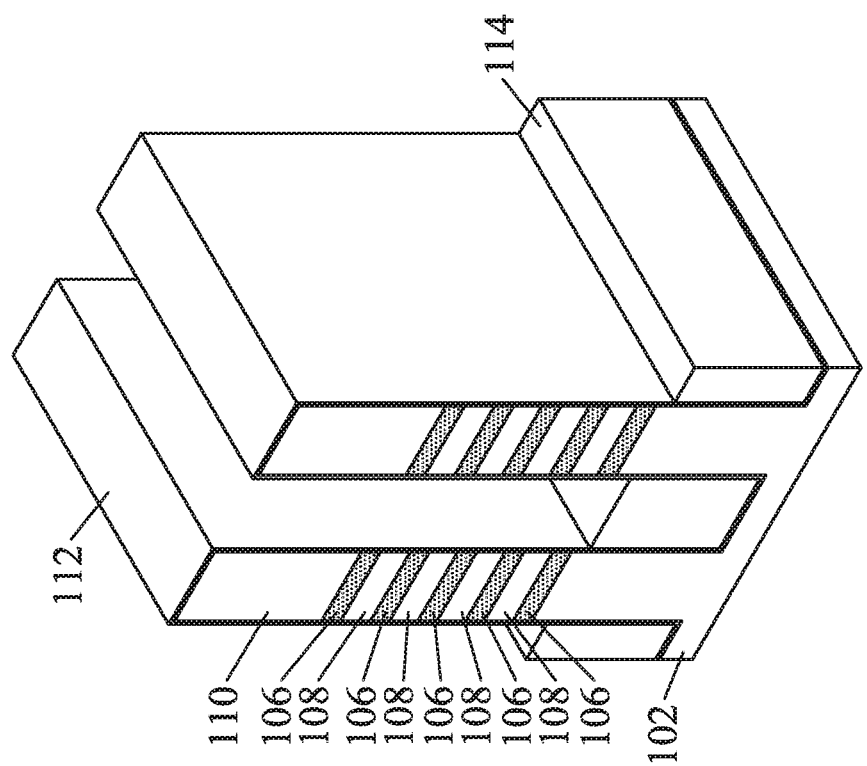
Figures 1, 1C, 2:
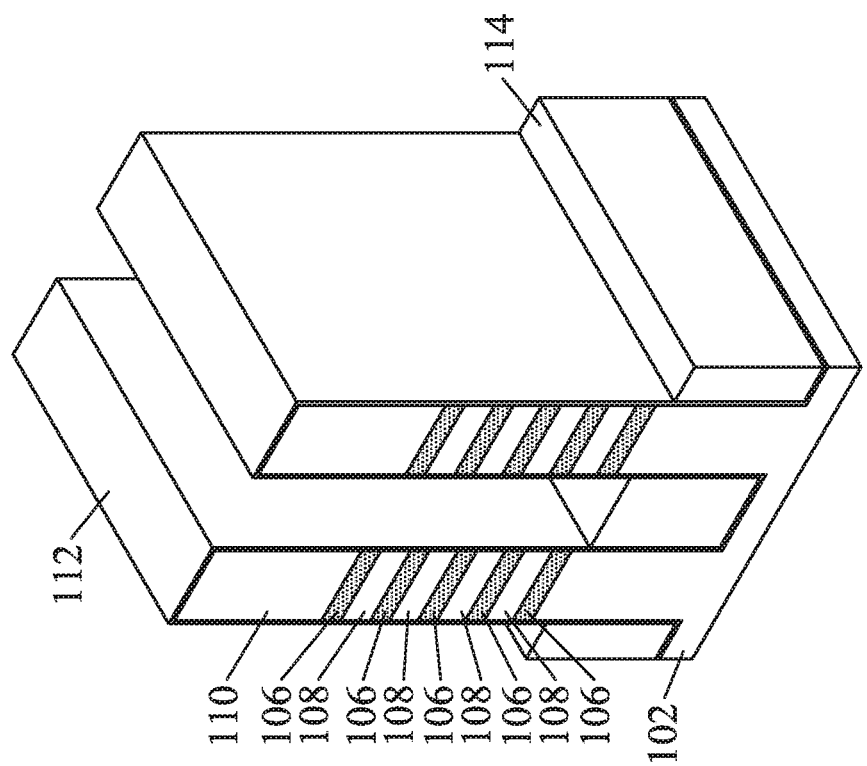

After the liner layers 112 are formed, an isolation structure 114 is formed around the fin structures 104-1 and 104-2, as shown in FIGS. 1C-1 and 1C-2 in accordance with some embodiments. The isolation structure 114 may be formed by depositing an insulating layer over the substrate 102 and recessing the insulating layer so that the fin structures 104-1 and 104-2 are protruded from the isolation structure 114.

In some embodiments, the isolation structure 114 is made of silicon oxide, silicon nitride, silicon oxynitride (SiON), another suitable insulating material, or a combination thereof. In some embodiments, a dielectric liner (not shown) is formed before the isolation structure 114 is formed, and the dielectric liner is made of silicon nitride and the isolation structure formed over the dielectric liner is made of silicon oxide. As shown in FIGS. 1C-1 and 1C-2, the liner layers 112 are thinned during the processes for forming the isolation structure 114 described above in accordance with some embodiments. In some embodiments, the liner layer 112 has a thickness in a range from about 1 nm to about 2 nm after the isolation structure 114 is formed.

Figures 1, 1D, 2:
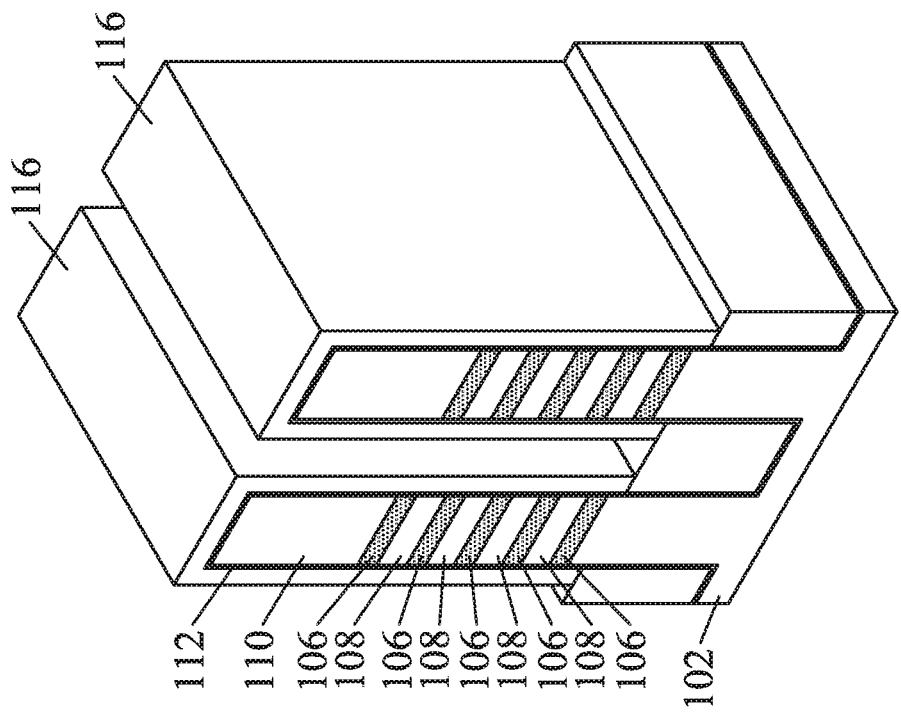
Figures 1, 1D:
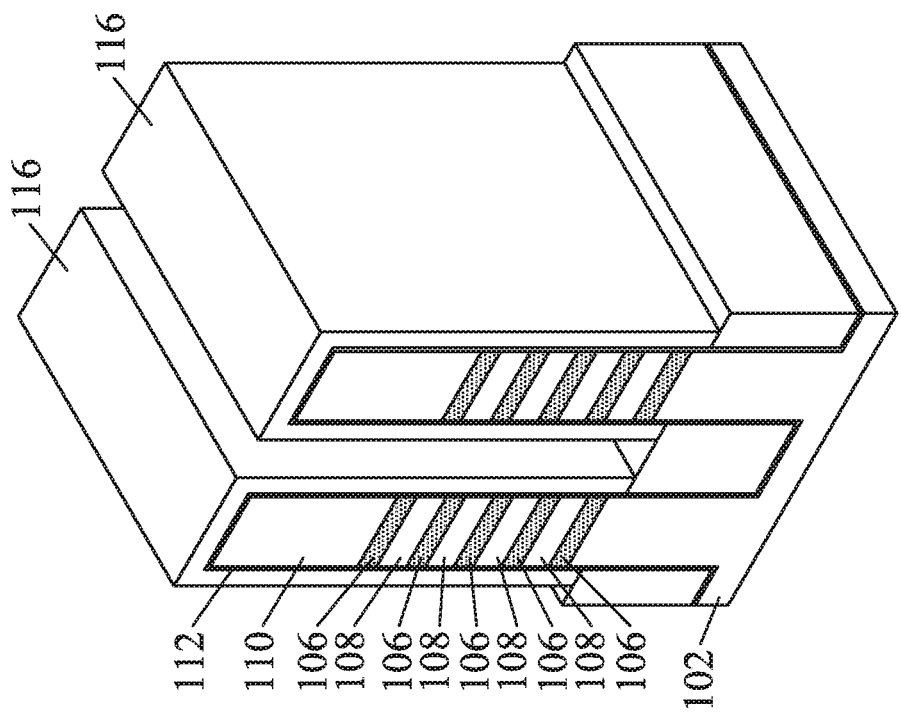

After the isolation structure 114 is formed, capping layers 116 are formed on the top surfaces and sidewalls of the fin structures 104-1 and 104-2, as shown in FIGS. 1D-1 and 1D-2 in accordance with some embodiments. In some embodiments, the capping layers 116 are directly formed on the isolation structure 114 and therefore are in direct contact with the isolation structure 114.

In some embodiments, the capping layers 116 are made of a semiconductor material of which the first semiconductor material layers 106 are made of. In some embodiments, the capping layers 116 are made of SiGe. The capping layers 116 may be formed by performing an epitaxial growth process. In some embodiments, the capping layers 116 has a thickness in a range from about 6 nm to about 10 nm. The capping layer 116 may be designed to be thick enough to help the removal of the first semiconductor material layers 106 during the channel releasing process but not to be too thick or the device size may be increased (details will be described later).

Figures 1, 1E, 2:
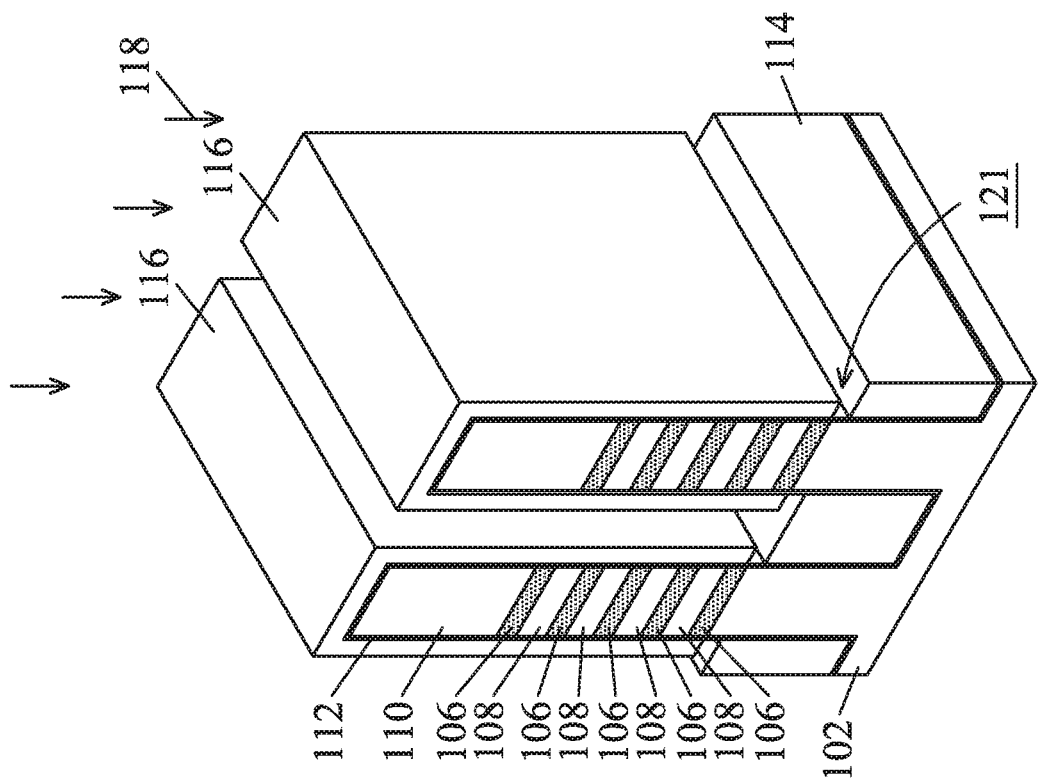
Figures 1, 1E:
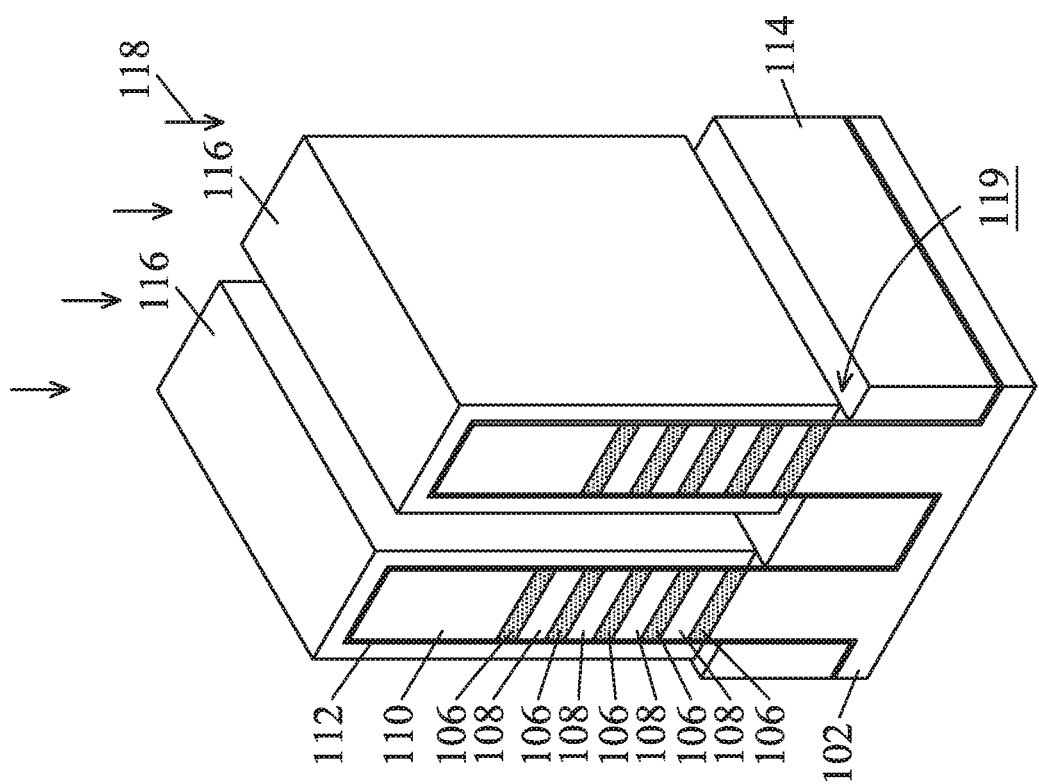

Next, an etching process 118 is performed to recess the isolation structure 114, as shown in FIGS. 1E-1 and 1E-2 in accordance with some embodiments. More specifically, the isolation structure 114 is recessed to form first gaps 119 in the first region 10 so that the capping layer 116 is separated from the isolation structure 114, as shown in FIG. 1E-1 in accordance with some embodiments. In addition, in the second region 20, the isolation structure 114 is recessed to form second gaps 121 so that the capping layer 116 is separated from the isolation structure 114, as shown in FIG. 1E-2 in accordance with some embodiments. In some embodiments, the isolation structure 114 is recessed for a depth (e.g. the heights of the first gaps 119 and the second gaps 121) in a range from about 1 nm to about 10 nm. In some embodiments, the isolation structure 114 is recessed for a depth in a range from about 3 nm to about 6 nm. The depth of the first gaps 119 and the second gaps 121 will determine the thicknesses of the protection layers formed therein and therefore will affect the performance of the resulting semiconductor structure (details will be described later). In some embodiments, the etching process 118 is a wet etching process or a dry etching process.

Figures 1, 1F:
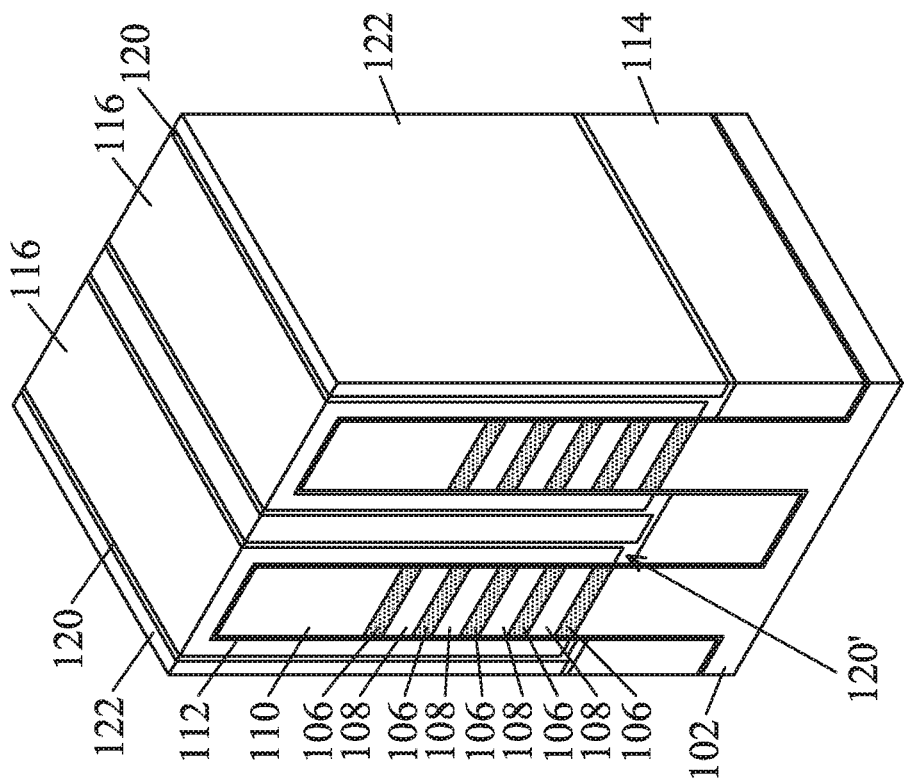
Figures 1, 1F, 2:
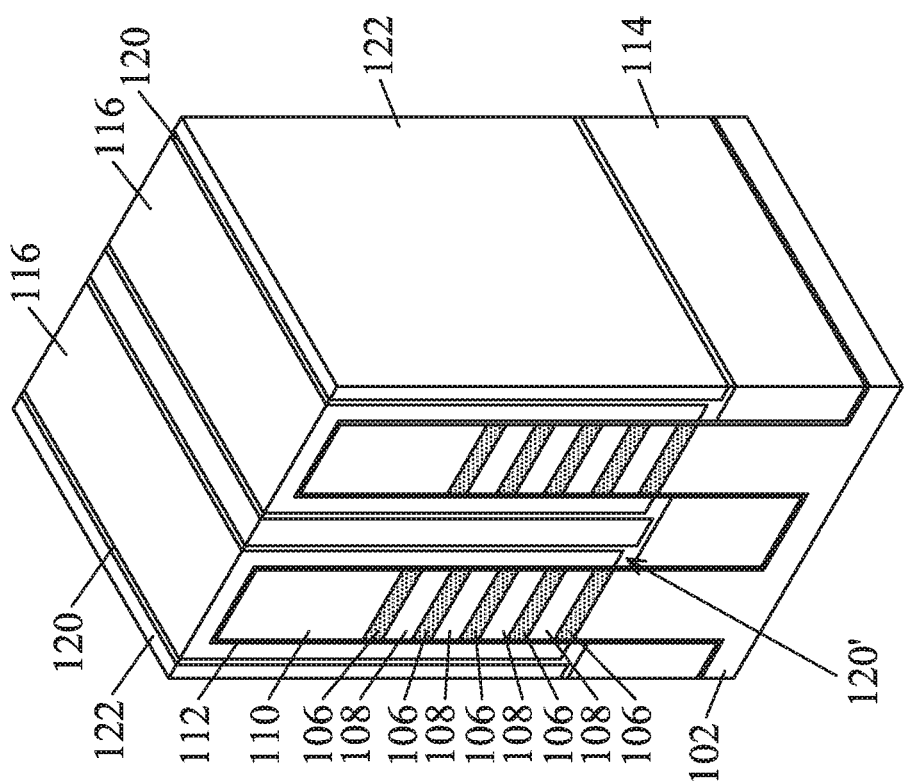

After the first gaps 119 and the second gaps 121 are formed, protection layers 120 are formed over the isolation structure 114 and the capping layers 116, and dielectric fin structures 122 are formed over the protection layers 120, as shown in FIGS. 1F-1 and 1F-2 in accordance with some embodiments. In addition, extending portions 120' of the protection layers 120 are formed in the first gaps 119 and the second gaps 121, so that the capping layer 116 and the isolation structure 114 are separated by the extending portions 120' of the protection layers 120 in accordance with some embodiments.

In some embodiments, be protection layers 120 are conformally formed over the isolation structure 114 and the capping layers 116, and trenches are formed between two neighboring fin structures 104-1 and 104-2. Next, a dielectric material is formed over the protection layers 120 and fills in the trenches between the fin structures 104-1 and 104-2 in accordance with some embodiments. Afterward, a polishing process is performed to expose the top surfaces of the capping layers 116, thereby forming the dielectric fin structures 122 between the fin structures 104-1 and 104-2 in accordance with some embodiments.

In some embodiments, the protection layers 120 are made of a dielectric material being different from the dielectric material that is used to form the isolation structure 114, so that the protection layers 120 may protect the isolation structure 114 from being damaged during subsequent manufacturing processes. In some embodiments, the protection layers 120 are made of SiCN, SiCON, SiN, or a combination thereof.

In some embodiments, the dielectric fin structures 122 are made of a low k dielectric material, such as SiCN, SiCON, or $SiO_2$. In some embodiments, the dielectric fin structures and the isolation structure 114 are made of the same material.

Figures 1, 1G:
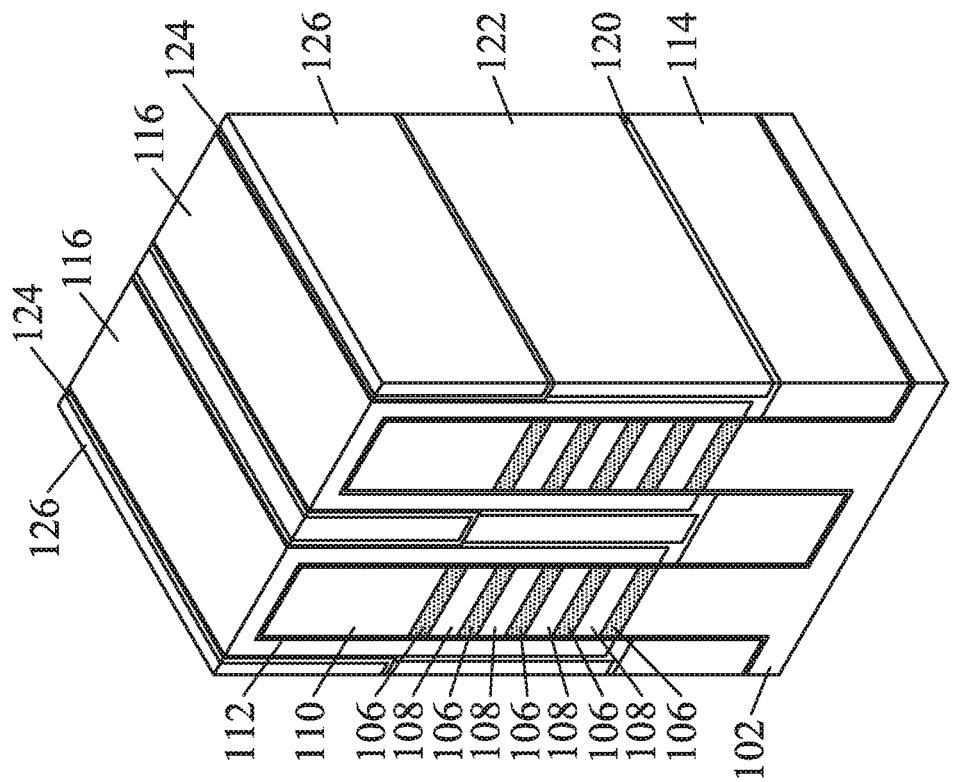
Figures 1, 1G, 2:
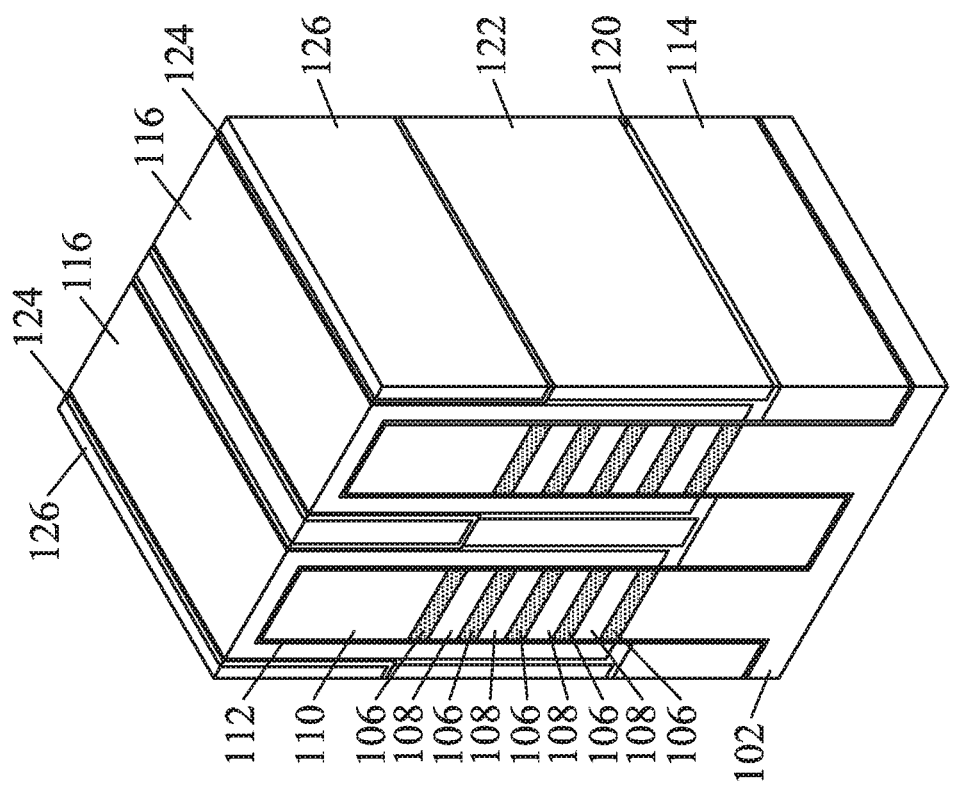

Afterwards, the dielectric fin structures 122 are recessed, and barrier layers 124 and dielectric capping layers 126 are formed in the recesses over the dielectric fin structure 122, as shown in FIGS. 1G-1 and 1G-2 in accordance with some embodiments. In some embodiments, the barrier layers 124 are made of a low k dielectric material, and the dielectric capping layers 126 are made of a high k dielectric material.

In some embodiments, the barrier layers 124 are made of a dielectric material that is the same as the dielectric material used to form the protection layers 120. In some embodiments, the barrier layers 124 are made of SiCN, SiCON, SiN, or a combination thereof. In some embodiments, the dielectric capping layers 126 are made of high-k dielectric material such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

Figures 1, 1H:
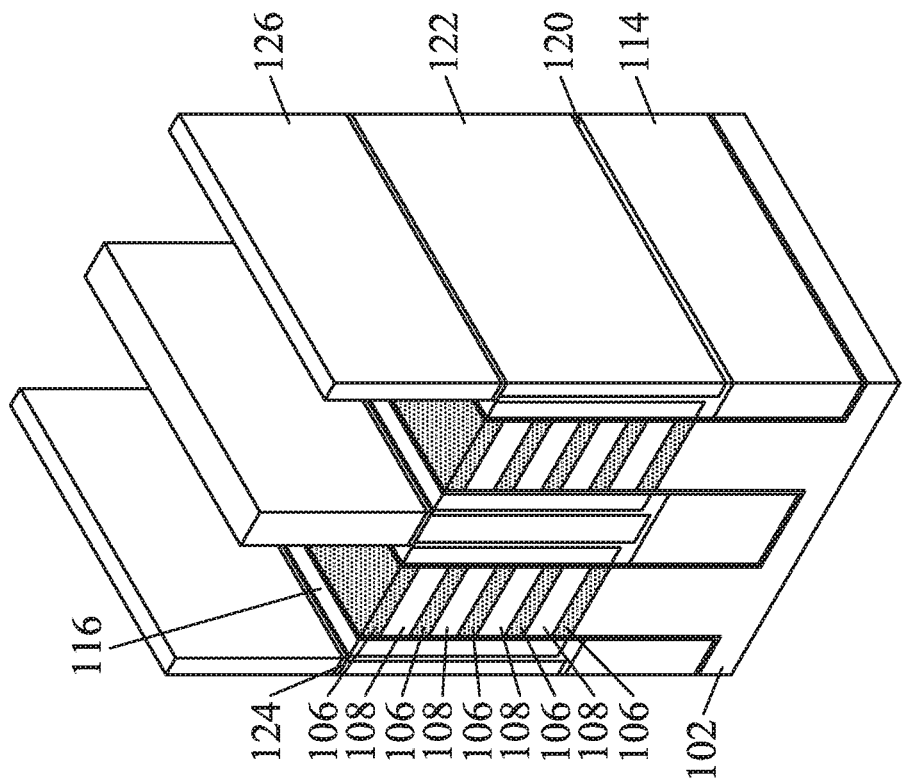
Figures 1, 1H, 2:
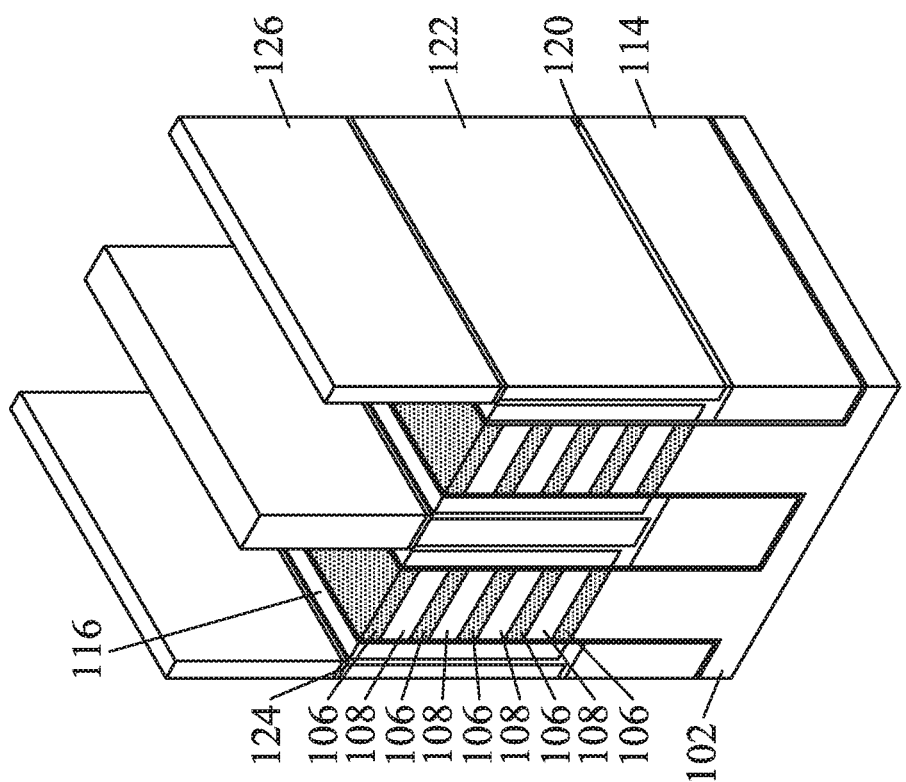

Next, the upper portions of the capping layers 116 and the hard mask layers 110 are removed, as shown in FIGS. 1H-1 and 1H-2 in accordance with some embodiments. More specifically, the upper portions of the capping layers 116 and the liner layer 112 are removed first, and the hard mask layers 110 are removed afterwards in accordance with some embodiments. In some embodiments, the barrier layers 124 formed on the sidewalls of the dielectric capping layers 126 are also removed with the hard mask layers 110.

Figures 1, 1I:
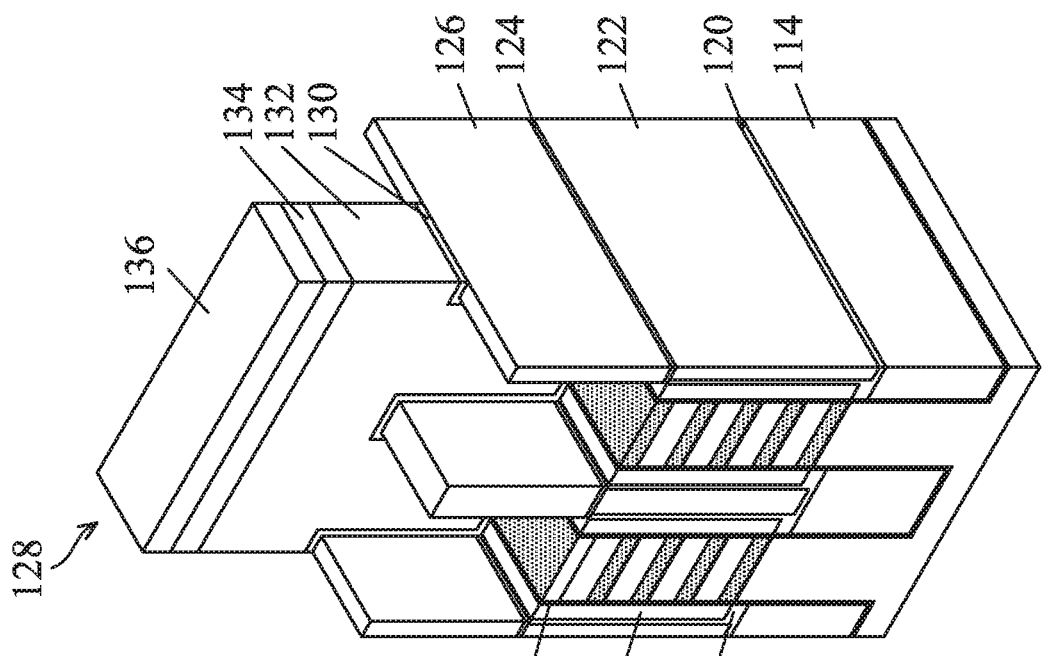
Figures 1, 1I, 2:
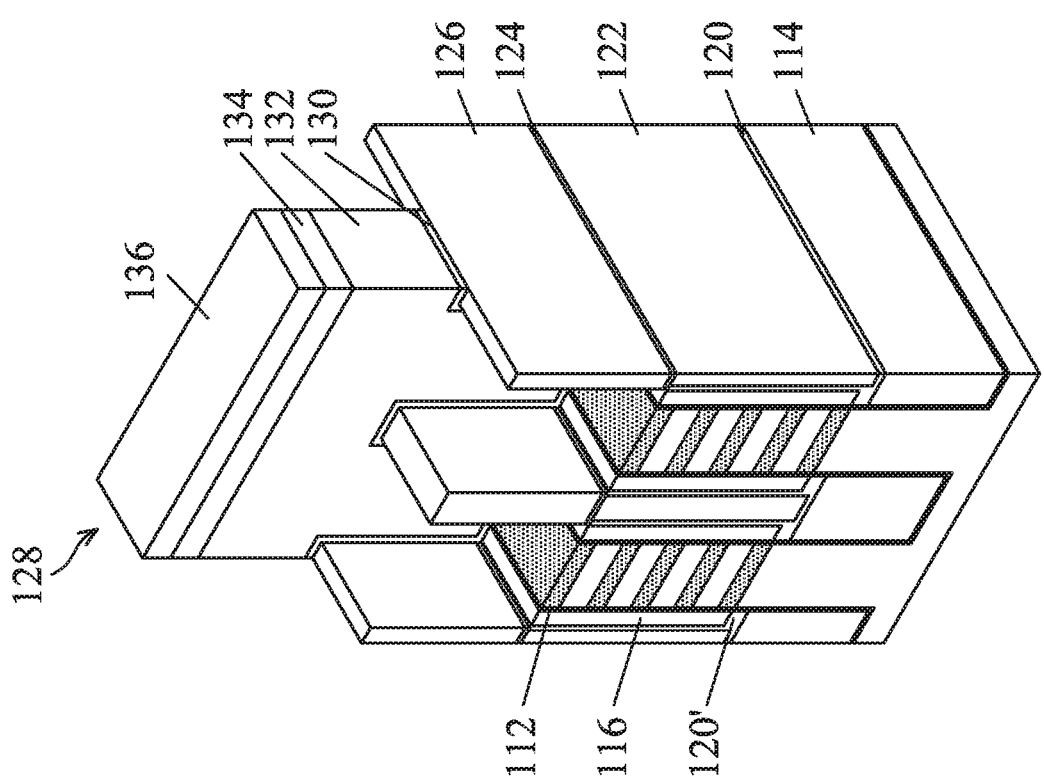

Afterwards, dummy gate structures 128 are formed over the fin structures 104-1 and 104-2, the capping layers 116, and the dielectric capping layers 126, as shown in FIGS. 1I-1 and 1I-2 in accordance with some embodiments. The dummy gate structures 128 may be used to define the source/drain regions and the channel regions of the resulting semiconductor structure 100.

In some embodiments, the dummy gate structures 128 include dummy gate dielectric layers 130 and dummy gate electrode layers 132. In some embodiments, the dummy gate dielectric layers 130 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 130 are formed using thermal oxidation, CVD, ALD, physical vapor deposition (PVD), another suitable method, or a combination thereof.

In some embodiments, the dummy gate electrode layers 132 are made of a conductive material. In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 132 are formed using CVD, PVD, or a combination thereof.

In some embodiments, bi-layered hard mask layers are formed over the dummy gate structure 128. In some embodiments, the bi-layered hard mask layers include an oxide layer 134 and a nitride layer 136. In some embodiments, the oxide layer 134 is silicon oxide, and the nitride layer 136 is silicon nitride.

The formation of the dummy gate structures 128 may include conformally forming a dielectric material as the dummy gate dielectric layers 130 in the first region 10 and the second region 20. Afterwards, a conductive material may be formed over the dielectric material as the dummy gate electrode layers 132, and the bi-layered hard mask layers, including the oxide layer 134 and the nitride layer 136, may be formed over the conductive material. Next, the dielectric material and the conductive material may be patterned through the bi-layered hard mask layers to form the dummy gate structures 128.

Figures 1, 1J:
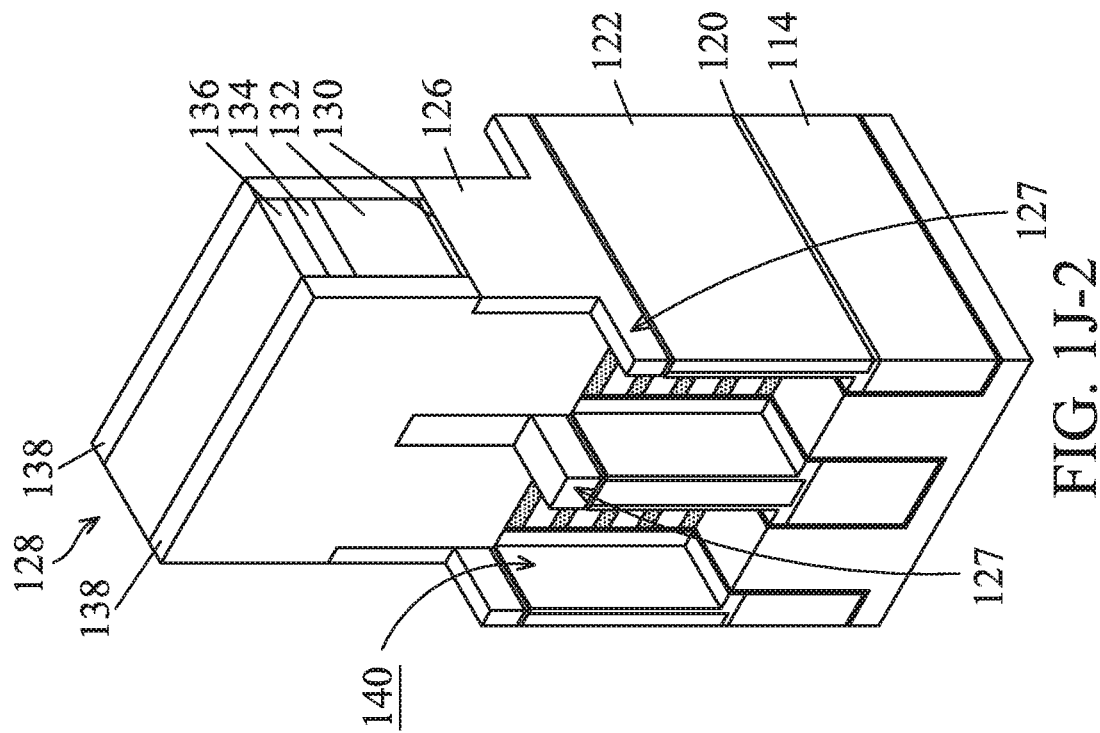
Figures 1, 1J, 2:
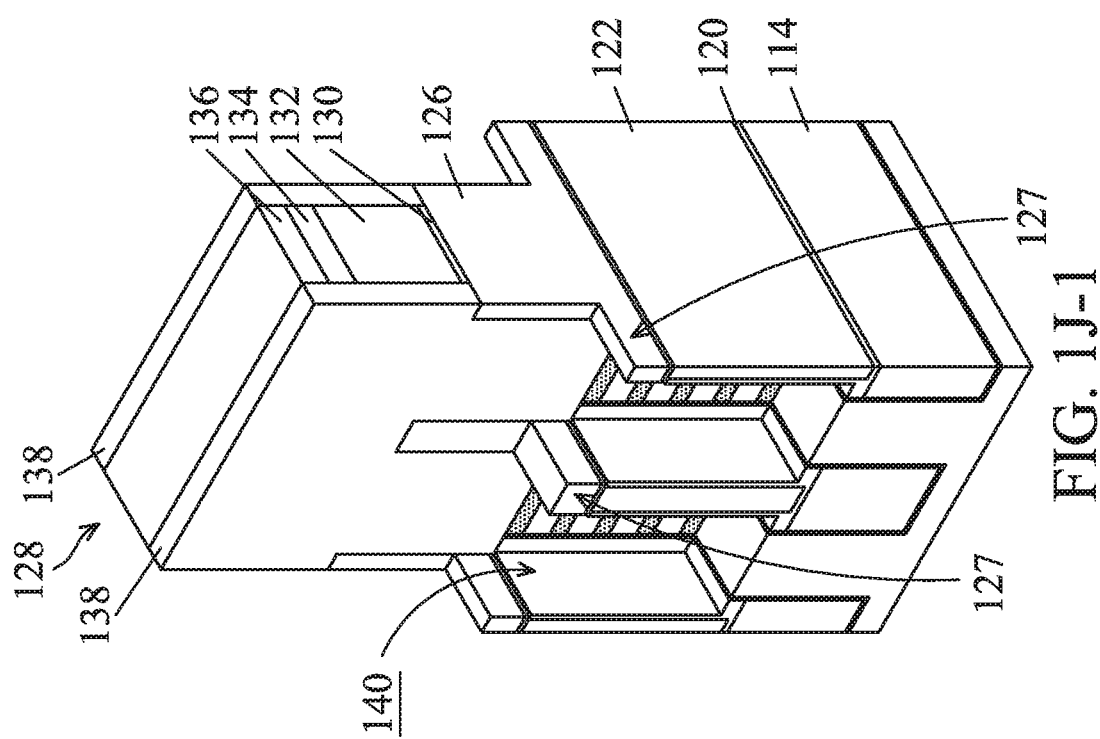

After the dummy gate structures 128 are formed, gate spacers 138 are formed on the sidewalls of the dummy gate structures 128, as shown in FIGS. 1J-1 and 1J-2 in accordance with some embodiments. In some embodiments, the gate spacers 138 are made of one or more dielectric materials, such as silicon oxide, silicon nitride, silicon oxynitride (SiON), or a combination thereof. In some embodiments, the dielectric material is formed using thermal oxidation, CVD, ALD, physical vapor deposition (PVD), another suitable method, or a combination thereof.

After the gate spacers 138 are formed, the fin structures 104-1 and 104-2, the capping layers 116 and the liner layer 112 not covered by the dummy gate structures 128 and the gate spacers 138 are etched to form the trenches 140, as shown in FIGS. 1J-1 and 1J-2 in accordance with some embodiments. In some embodiments, the protection layers 120 are exposed by the trenches 140.

In some embodiments, the fin structures 104-1 and 104-2, the capping layers 116 and the liner layer 112 are recessed by performing a number of etching processes. That is, the first semiconductor material layers 106 and the second semiconductor material layers 108 of the fin structures 104-1 and 104-2, the capping layers 116 and the liner layer 112 may be etched in different etching processes. In addition, the dielectric capping layers 126 not covered by the dummy gate structures 128 and the gate spacers 138 are also partially etched to form recessed portions 127 during the etching processes in accordance with some embodiments. That is, the dielectric capping layers 126 at different regions have different thickness, as shown in FIGS. 1J-1 and 1J-2 in accordance with some embodiments.

Figures 1, 1K:
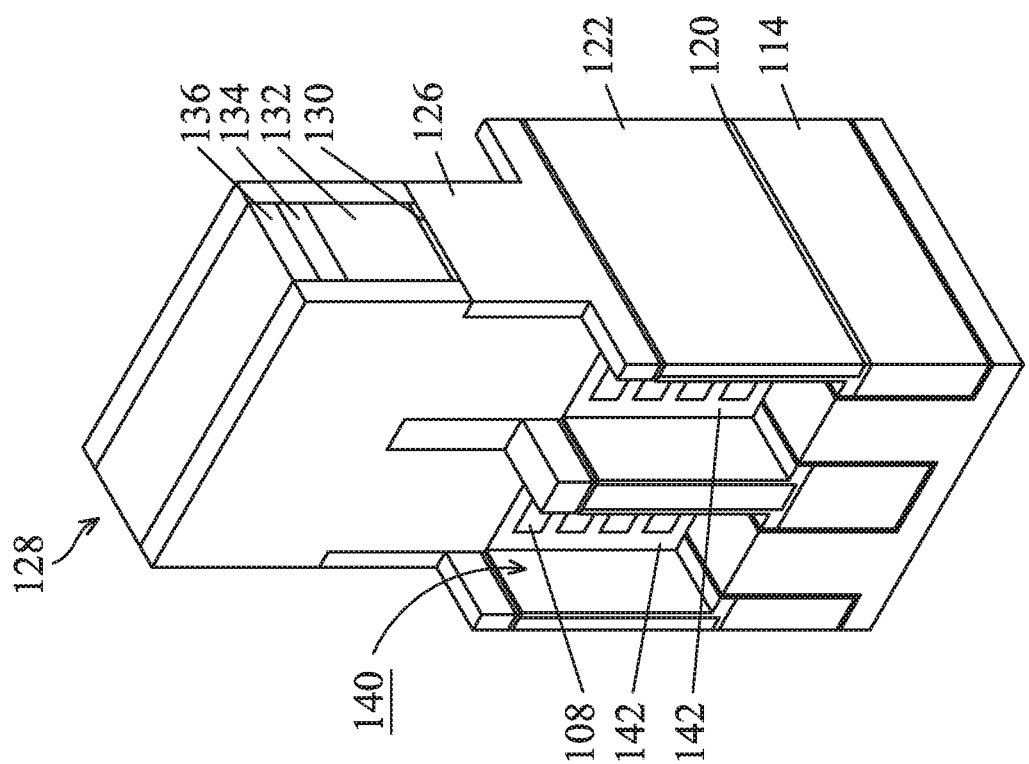
Figures 1, 1K, 2:
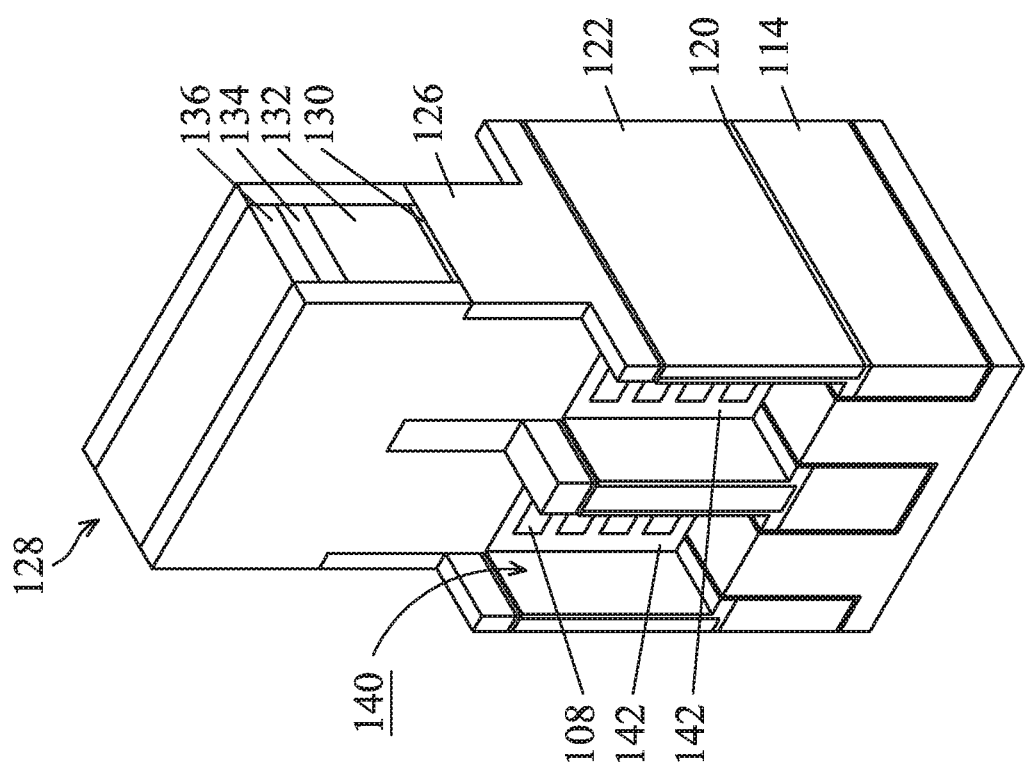

Next, the first semiconductor material layers 106 and the liner layers 112 are laterally etched from the trenches 140 to form cavities, and inner spacers 142 are formed in the cavities, as shown in FIGS. 1K-1 and 1K-2 in accordance with some embodiments. In some embodiments, the first semiconductor material layers 106 are Ge or SiGe and the second semiconductor material layers 108 are Si, and the first semiconductor material layers 106 are selectively etched to form the cavities by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions, or the like. In addition, since the liner layers 112 are relatively thin, the liner layers 112 are also etched during the etching process.

After the cavities are formed, inner spacers 142 are formed in the cavities in accordance with some embodiments. The inner spacers 142 may be configured to separate the source/drain structures and the gate structures formed in subsequent manufacturing processes. In some embodiments, the inner spacers 142 are made of a dielectric material, such as silicon oxide (SiO$_2$), silicon nitride (SiN), silicon carbide (SiC), silicon oxynitride (SiON), silicon carbon nitride (SiCN), silicon oxide carbonitride (SiOCN), or a combination thereof.

Figures 1, 1L, 2:
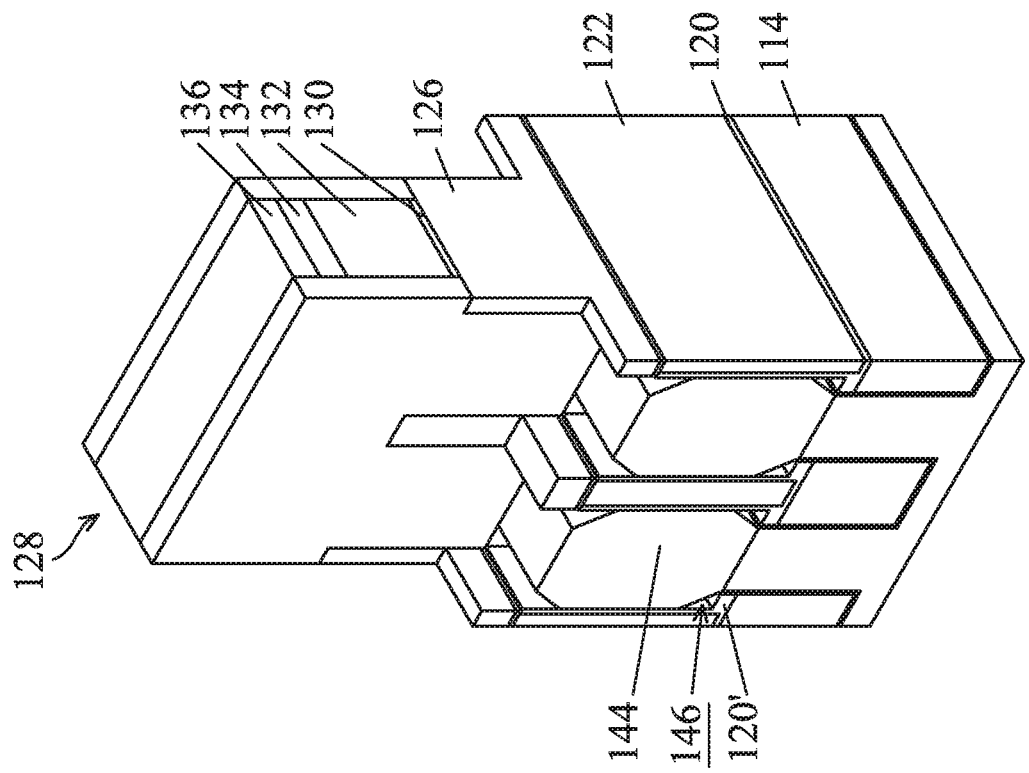
Figures 1, 1L:
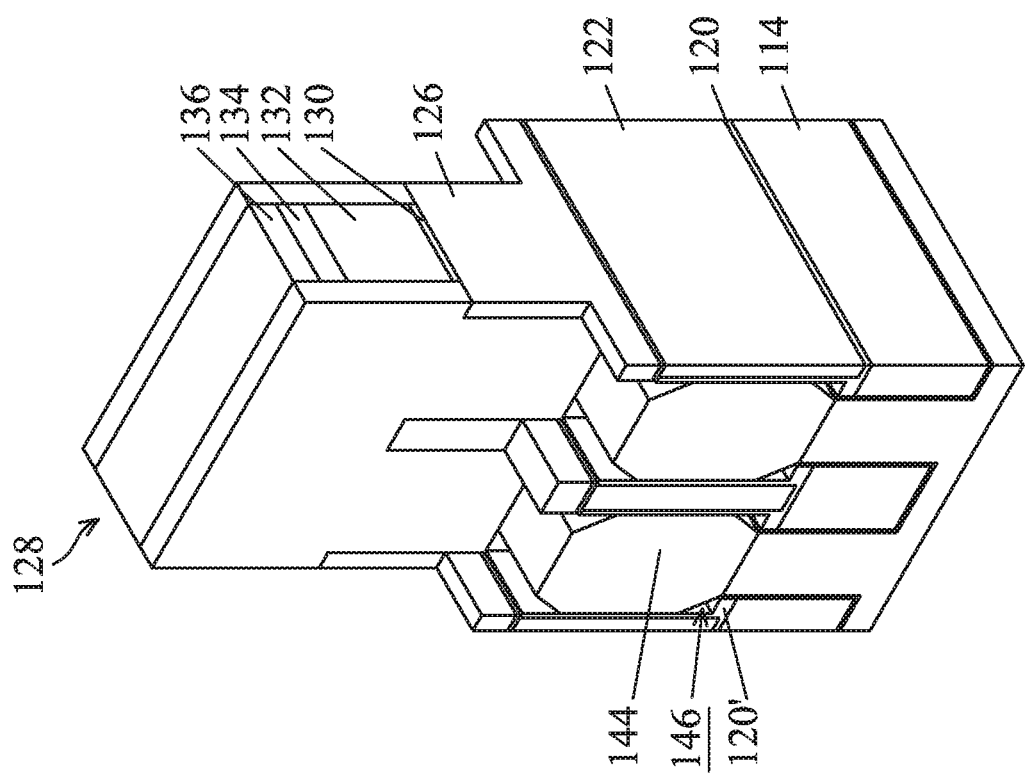

Next, source/drain structures 144 are formed in the trenches 140, as shown in FIGS. 1L-1 and 1L-2 in accordance with some embodiments. In addition, the source/drain structures 144 are between the dielectric fin structures 122 and are in direct contact with the protection layers 120 in accordance with some embodiments. In some embodiments, air gaps 146 are formed between the source/drain structures 144 and the protection layers 120.

In some embodiments, the source/drain structures 144 are formed using an epitaxial growth process, such as MBE, MOCVD, VPE, another suitable epitaxial growth process, or a combination thereof. In some embodiments, the source/drain structures 144 are made of any applicable material for an n-type semiconductor device and a p-type semiconductor device, such as Ge, Si, GaAs, AlGaAs, SiGe, GaAsP, SiP, SiC, SiCP, or a combination thereof.

In some embodiments, the source/drain structures 144 are in-situ doped during the epitaxial growth process. For example, the source/drain structures 144 may be the epitaxially grown SiGe doped with boron (B). For example, the source/drain structures 144 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain structures 144 are doped in one or more implantation processes after the epitaxial growth process.

Figures 1, 1M, 2:
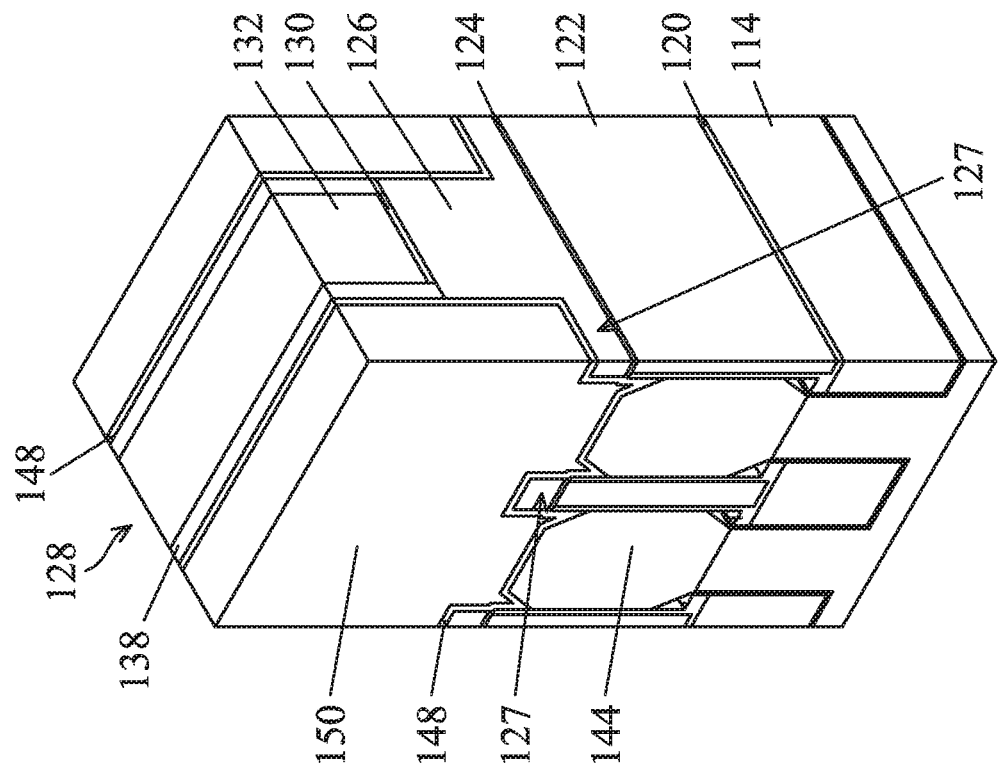
Figures 1, 1M:
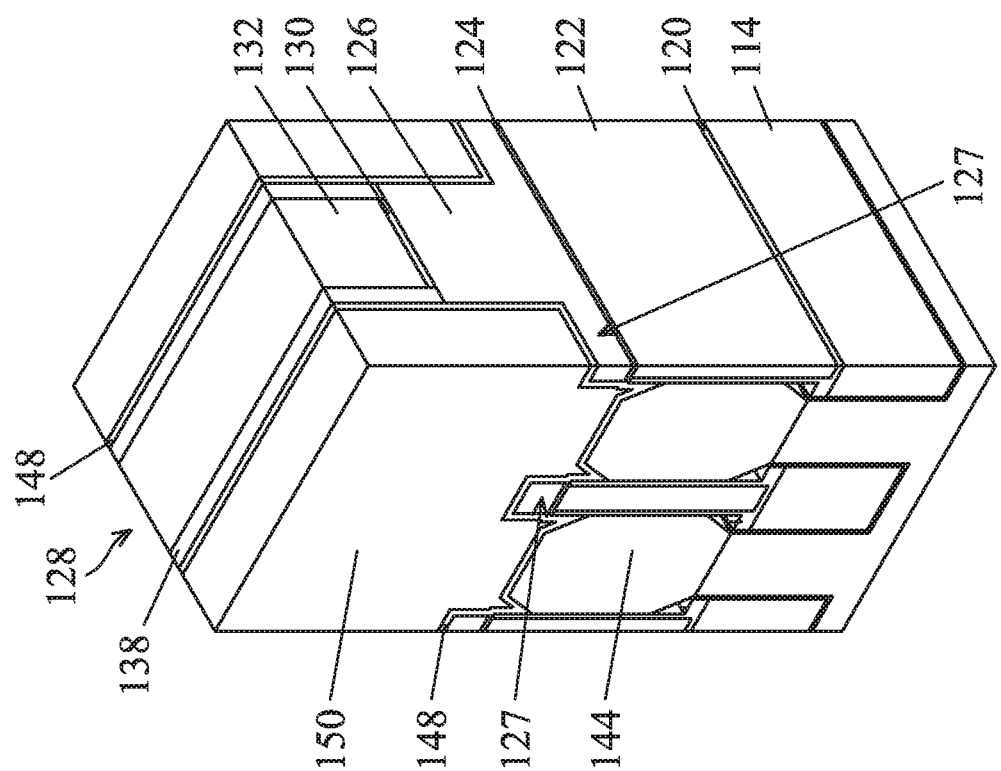

After the source/drain structures 144 are formed, contact etch stop layers (CESL) 148 are formed over both the first region 10 and the second region 20 of the semiconductor structure, as shown in FIGS. 1M-1 and 1M-2 in accordance with some embodiments. More specifically, the contact etch stop layers 148 cover the sidewalls of the gate spacers 138, the top surfaces and sidewalls of the recessed dielectric capping layers 126, and the source/drain structures 144 in accordance with some embodiments. In addition, the contact etch stop layers 148 further cover and in direct contact with the protection layers 120 in accordance with some embodiments.

In some embodiments, the contact etch stop layers 148 are made of a dielectric material, such as silicon nitride, silicon oxide, silicon oxynitride, another suitable dielectric material, or a combination thereof. The dielectric material for the contact etch stop layers 148 may be conformally deposited over the semiconductor structure by performing CVD, ALD, other application methods, or a combination thereof.

Afterwards, interlayer dielectric (ILD) layers 150 are formed over the contact etch stop layers 148, as shown in FIGS. 1M-1 and 1M-2 in accordance with some embodiments. The interlayer dielectric layers 150 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The interlayer dielectric layers 150 may be formed by chemical vapor deposition (CVD), physical vapor deposition, (PVD), atomic layer deposition (ALD), or other applicable processes.

After the contact etch stop layer 148 and the interlayer dielectric layer 150 are deposited, a planarization process such as CMP or an etch-back process may be performed until the dummy gate electrode layers 132 of the dummy gate structures 128 are exposed.

Afterwards, the dummy gate structures 128 are removed to form trenches 152-1 and 152-2, as shown in FIGS. 1N-1 and 1N-2 in accordance with some embodiments. More specifically, the dummy gate electrode layers 132 and the dummy gate dielectric layers 130 are removed to form trenches 152-1 and 152-2 between the gate spacers 138 in accordance with some embodiments. The removal process may include one or more etching processes. For example, when the dummy gate electrode layers 132 are polysilicon, a wet etchant such as a tetramethylammonium hydroxide (TMAH) solution may be used to selectively remove the dummy gate electrode layers 132. Afterwards, the dummy gate dielectric layers 130 may be removed using a plasma dry etching, a dry chemical etching, and/or a wet etching.

Figures 2, 2A:
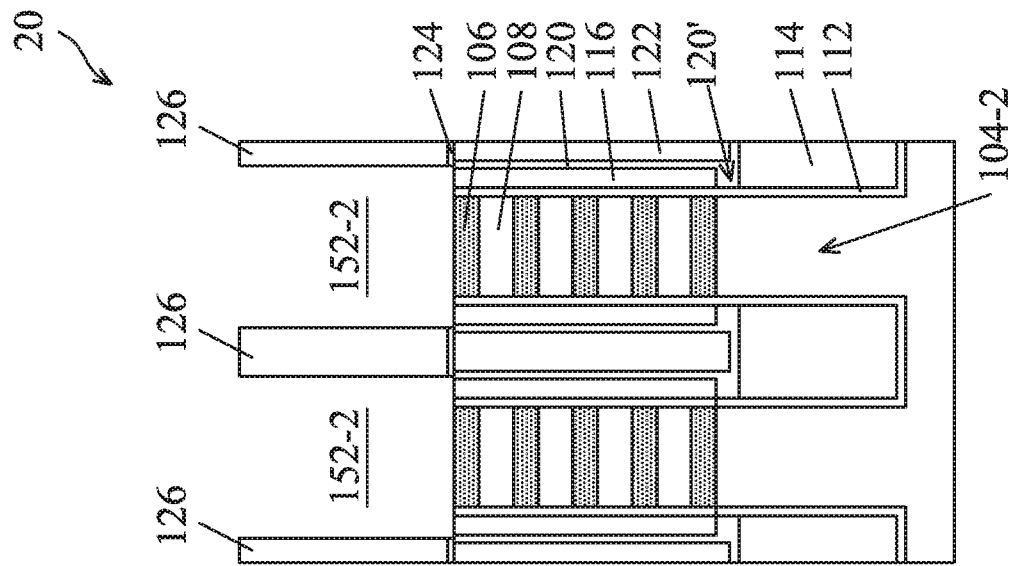
Figures 1, 2A:
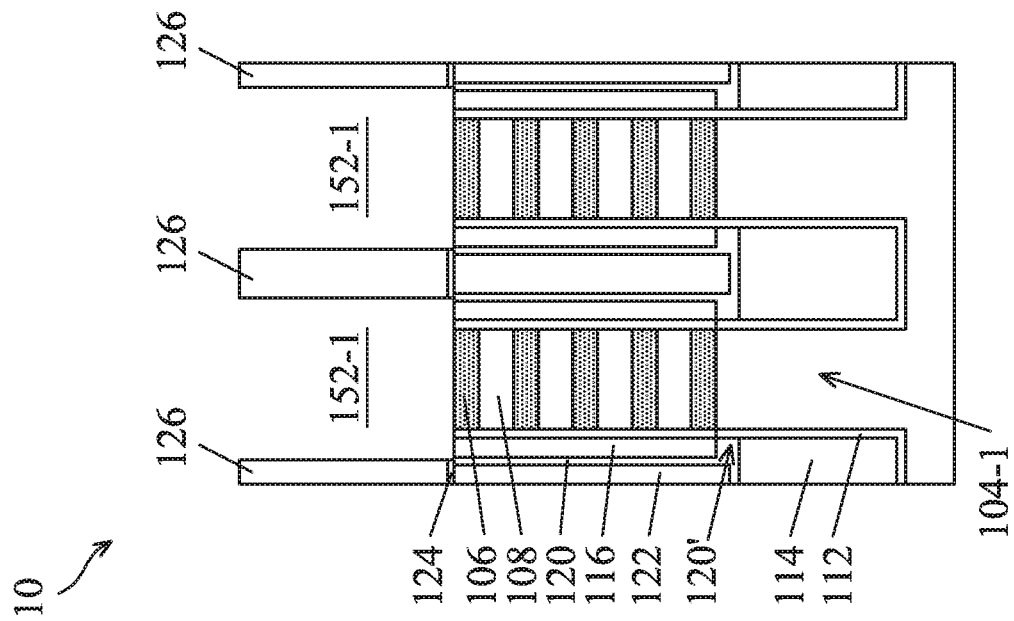
Figures 2, 2B:
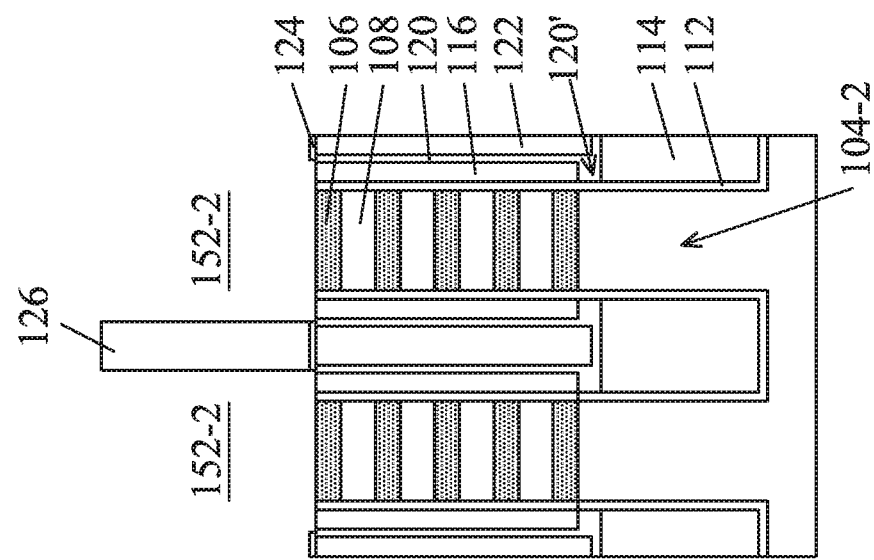
Figures 1, 2B:
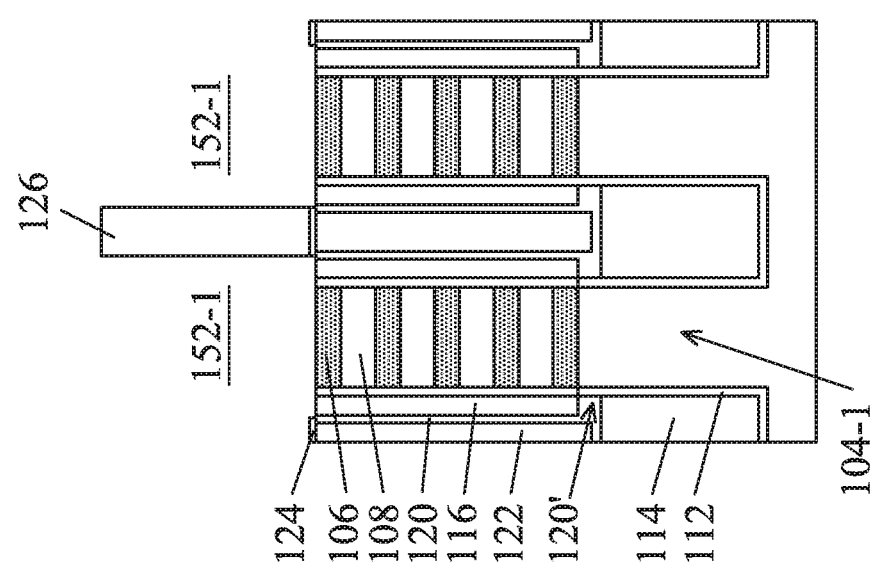
Figures 1, 2, 2D:
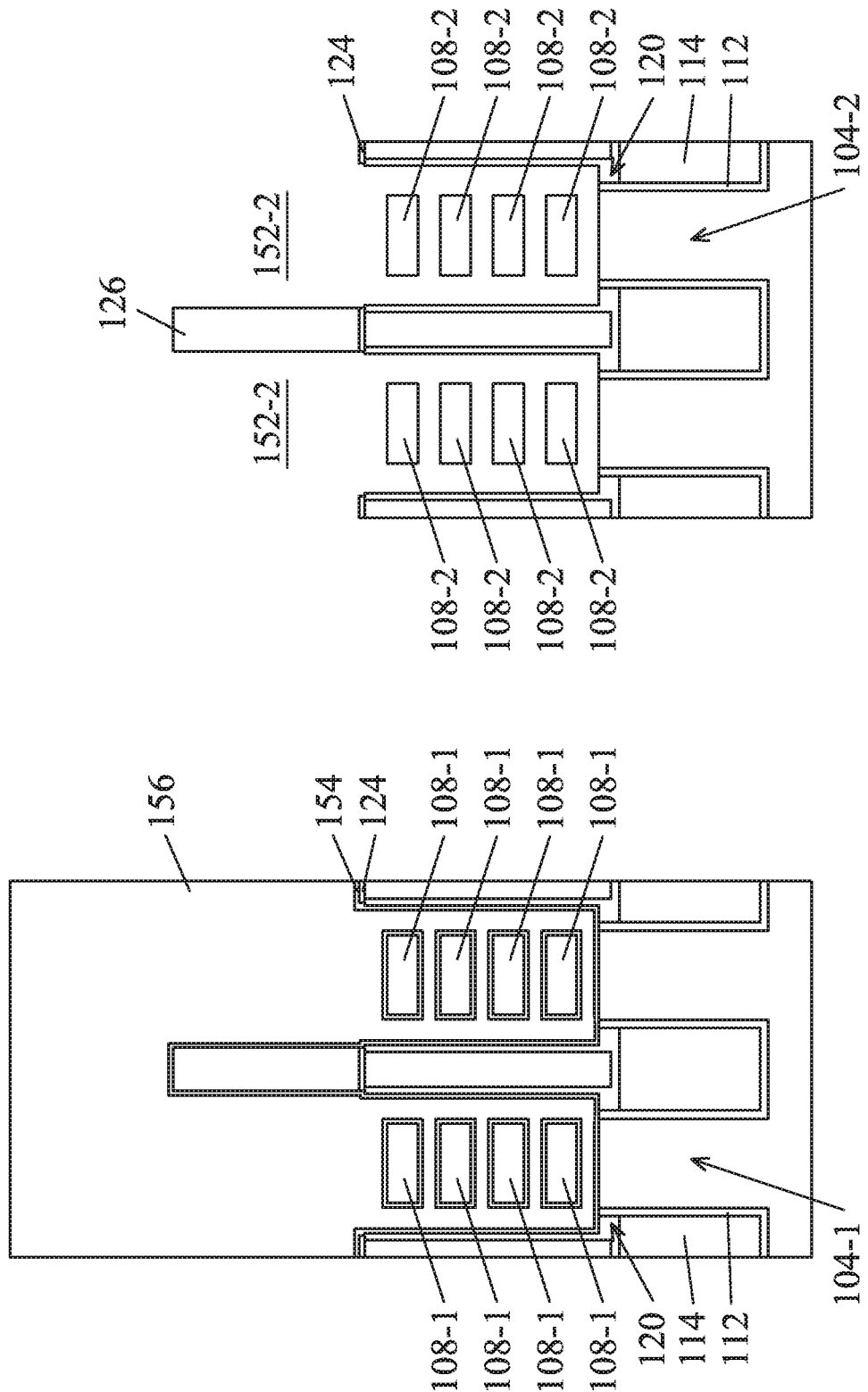
Figures 1, 2G:
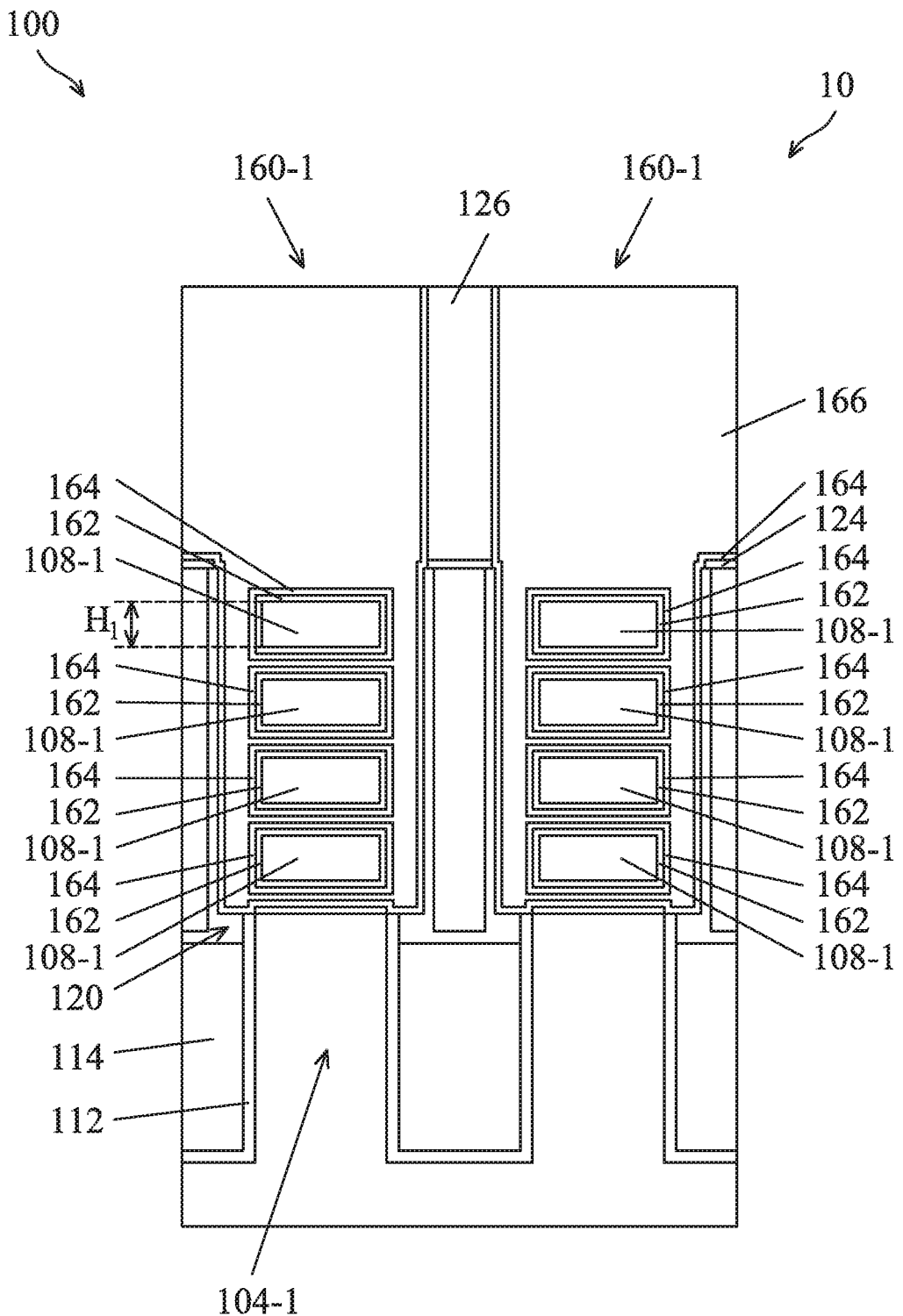
Figures 2, 2G:
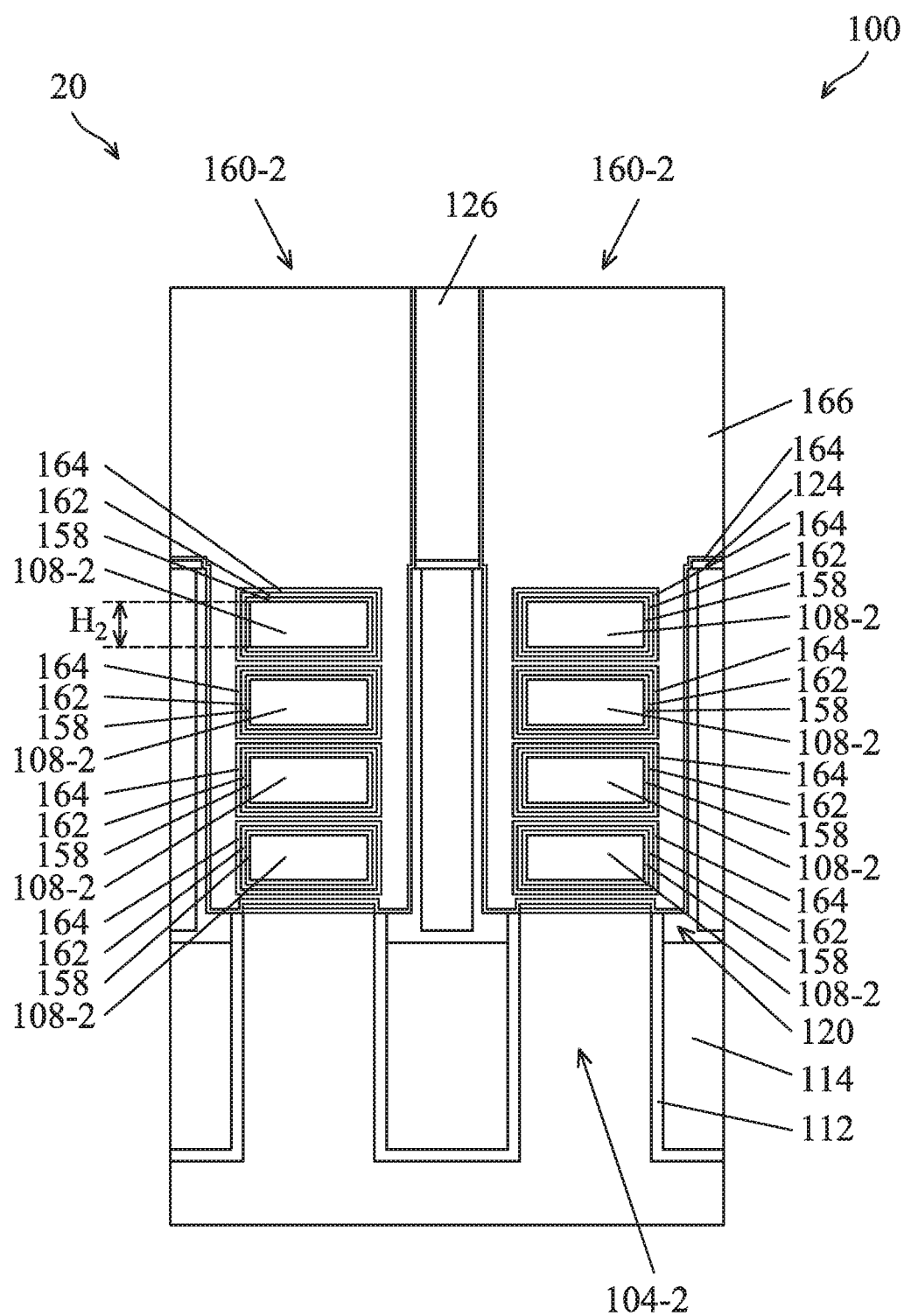

FIGS. 2A-1 to 2G-1 illustrate cross-sectional representations of various stages of manufacturing the semiconductor structure 100 shown along line A-A' in the first region 10 in FIGS. 1N-1 to 1T-1 in accordance with some embodiments. FIGS. 2A-2 to 2G-2 illustrate cross-sectional representations of various stages of manufacturing the semiconductor structure 100 shown along line B-B' in the second region 20 in FIG. 1N-2 to 1T-2 in accordance with some embodiments. As shown in FIG. 2A-1, the fin structures 104-1 in the first region 10 are exposed by the trenches 152-1, and the fin structures 104-2 in the second region 20 are exposed by the trenches 152-2 in accordance with some embodiments.

After the dummy gate structures 128 are removed, the dielectric capping layers 126 exposed by the trenches 152-1 and 152-2 are patterned, as shown in FIGS. 1O-1, 1O-2, 2B-1, and 2B-2 in accordance with some embodiments. The remaining portions of the dielectric capping layers 126 may be configured to separate the gate structures formed afterwards into various portions and may therefore be left over the dielectric fin structures 122, while other portions may be removed. In some embodiments, the barrier layers 124 are not removed with the dielectric capping layers 126 and therefore remain covering the top of the dielectric fin structures 122, as shown in FIGS. 2B-1 and 2B-2 in accordance with some embodiments.

After the dielectric capping layers 126 are patterned, the first semiconductor material layers 106, the capping layers 116, and the liner layers 112 are removed, as shown in FIGS. 1P-1, 1P-2, 2C-1, and 2C-2 in accordance with some embodiments. More specifically, the second semiconductor material layers 108 exposed by the trenches 152-1 and 152-2 form nanostructures 108-1 in the first region 10 and nanostructures 108-2 in the second region 20, and the nanostructures 108-1 and 108-2 are configured to function as channel regions in the resulting semiconductor devices in accordance with some embodiments.

The first semiconductor material layers 106, the capping layers 116, and the liner layers 112 may be removed by performing one or more etching processes. For example, the capping layers 116 and the liner layer 112 may be etched to form gaps between protection layers 120, and the first semiconductor material layers 106 may be removed through the gaps afterwards. That is, the capping layers 116 may help to remove the first semiconductor material layers 106 and to form the nanostructures 108-1 and 108-2 more efficiently.

The etching process may include a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

Next, the first region 10 is covered by a mask layer 154 and a photoresist layer 156, as shown in FIGS. 1Q-1, 1Q-2, 2D-1, and 2D-2 in accordance with some embodiments. The mask layer 154 may be conformally formed over the first region 10 and the second region 20 first and may be patterned through the photoresist layer 156 afterwards to expose the second region 20.

In some embodiments, the mask layer 154 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

Afterwards, the photoresist layer 156 over the first region 10 is removed, and additional semiconductor material layers 158 are formed in the second region 20, as shown in FIGS. 1R-1, 1R-2, 2E-1, and 2E-2 in accordance with some embodiments. More specifically, the photoresist layer 156 may be removed by performing an etching process. After the photoresist layer 156 is removed, the semiconductor material layers 158 are grown over the nanostructures 108-2 and the exposed top surfaces of the fin structures 104-2 in accordance with some embodiments. In addition, since the nanostructures 108-1 and the fin structures 104-1 in the first region 10 are covered by the mask layer 154, the semiconductor material layers 158 are not grown in the first region 10 in accordance with some embodiments.

In some embodiments, the semiconductor material layer 158 has a thickness in a range from about 1 nm to about 4 nm. In some embodiments, the semiconductor material layers 158 are made of Si, Ge, or SiGe. In some embodiments, the semiconductor material layers 158 and the nanostructures 108-2 (e.g. the second semiconductor material layers 108) are made of different semiconductor materials. In some embodiments, the first region 10 is used in a NMOS device and the second region 20 is used in a PMOS device, and the semiconductor material layers 158 are made of SiGe and the nanostructures 108-1 and 108-2 are made of Si, and the semiconductor material layers 158 in the PMOS device may help to improve the speed of the PMOS device.

In some embodiments, the semiconductor material layers 158 and the nanostructures 108-2 are made of the same semiconductor material, such as Si, and the additional semiconductor material layers 158 may be used to adjust the spacing of neighboring nanostructures so that the spaces in the first region 10 and the second region 20 are different.

After the semiconductor material layers 158 are formed, the mask layer 154 is removed, as shown in FIGS. 1S-1, 1S-2, 2F-1, and 2F-2 in accordance with some embodiments. The mask layer 154 may be removed by performing an etching process.

Next, gate structures 160-1 are formed in the trenches 152-1 and the gaps between the nanostructures 108-1, and gate structures 160-2 are formed in the trenches 152-2 and the gaps between the nanostructures 108-2, as shown in FIGS. 1T-1, 1T-2, 2G-1, and 2G-2 in accordance with some embodiments.

The gate structures 160-1 and 160-2 surround the nanostructures 108-1 and 108-2 to form gate-all-around transistor structures in accordance with some embodiments. In some embodiments, the gate structures 160-1 and 160-2 individually include an interfacial layer 162, a gate dielectric layer 164 and a gate electrode layer 166.

In some embodiments, the interfacial layers 162 are oxide layers formed around the nanostructures 108-1 and on the top of the fin structures 104-1 in the first region 10 and over the semiconductor material layers 158 in the second region 20. In some embodiments, the interfacial layers 162 are formed by performing a thermal process.

In some embodiments, the gate dielectric layers 164 are formed over the interfacial layers 162, so that the nanostructures 108-1 and 108-2 are surrounded by the gate dielectric layers 164. In addition, the gate dielectric layers 164 also cover the sidewalls and the top surfaces of the extending portions 120' of the protection layers 120 in accordance with some embodiments. Furthermore, the gate dielectric layers 164 further cover the sidewalls of the dielectric capping layers 126 and the sidewalls of the gate spacers 138 in accordance with some embodiments.

In some embodiments, the gate dielectric layers 164 are made of one or more layers of dielectric materials, such as HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, another suitable high-k dielectric material, or a combination thereof. In some embodiments, the gate dielectric layers 164 are formed using CVD, ALD, another applicable method, or a combination thereof.

The gate electrode layers 166 are formed on the gate dielectric layer 164 and filled in the trenches 152-1 and 152-2 and the gaps between the nanostructures 108-1 and 108-2, so that the nanostructures 108-1 and 108-2 are surrounded by the gate structures 160-1 and 160-2 in accordance with some embodiments.

In some embodiments, the gate electrode layers 166 are made of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 166 are formed using CVD, ALD, electroplating, another applicable method, or a combination thereof. Other conductive layers, such as work function metal layers, may also be formed in the gate structures 160-1 and 160-2, although they are not shown in the figures.

After the interfacial layers 162, the gate dielectric layers 164, and the gate electrode layers 166 are formed, a planarization process such as CMP or an etch-back process is performed, as shown in FIGS. 1T-1, 1T-2, 2G-1, and 2G-2 in accordance with some embodiments.

More specifically, the upper portions of the gate dielectric layers 164, the gate electrode layers 166, the contact etch stop layer 148, the interlayer dielectric layer 162, and the gate spacer layers 138 are removed until the top surface of the dielectric capping layers 126 are exposed in accordance with some embodiments. After the planarization process, the gate structures 160-1 and 160-2 are respectively separated into two regions by the remaining portion of dielectric capping layer 126 in accordance with some embodiments. That is, different regions of the gate structures 160-1 and 160-2 may be isolated by the dielectric capping layers 126 over the dielectric fin structures 122 formed beforehand without performing complicated alignment processes.

Figures 1, 3A:
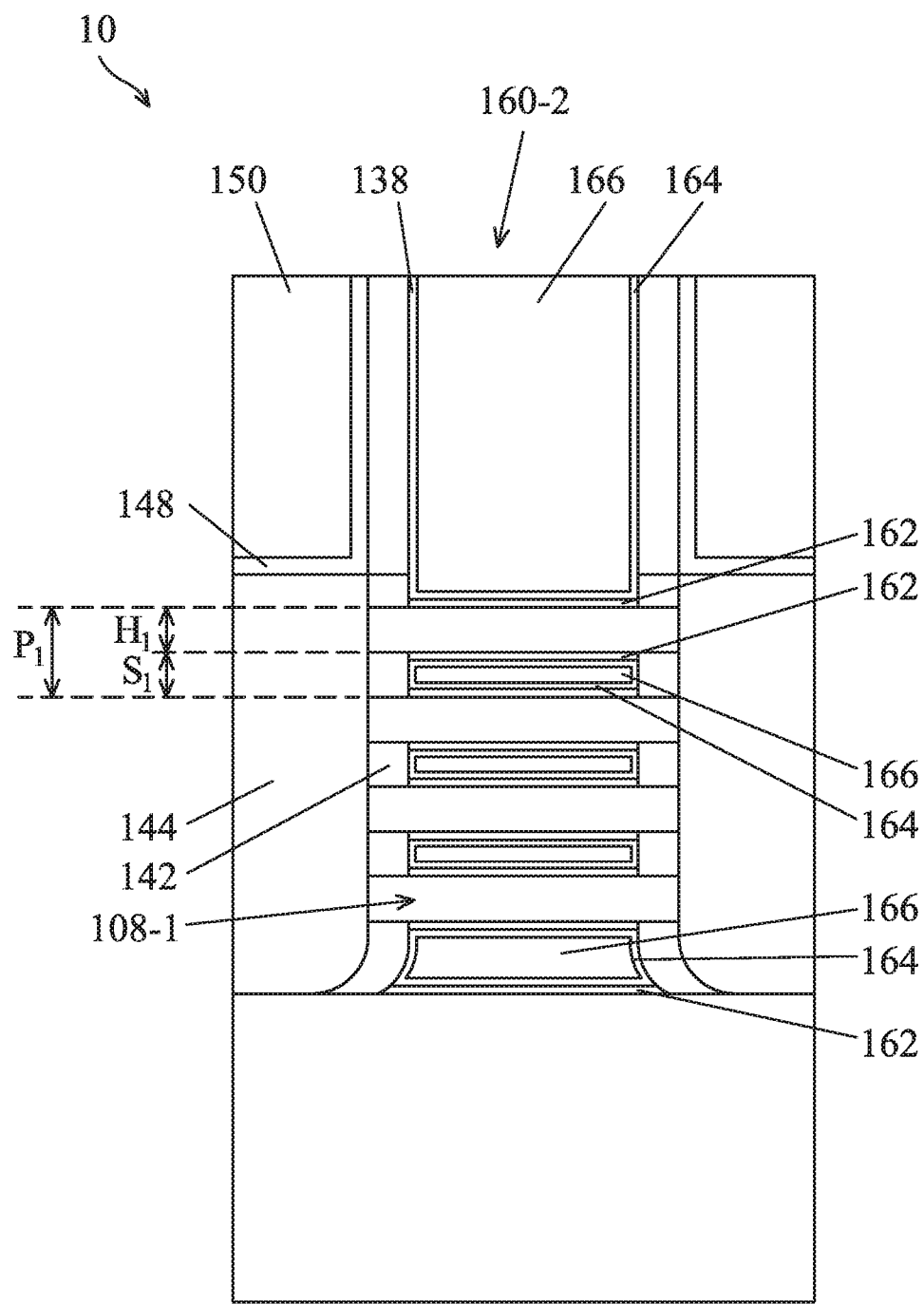
Figures 2, 3A:
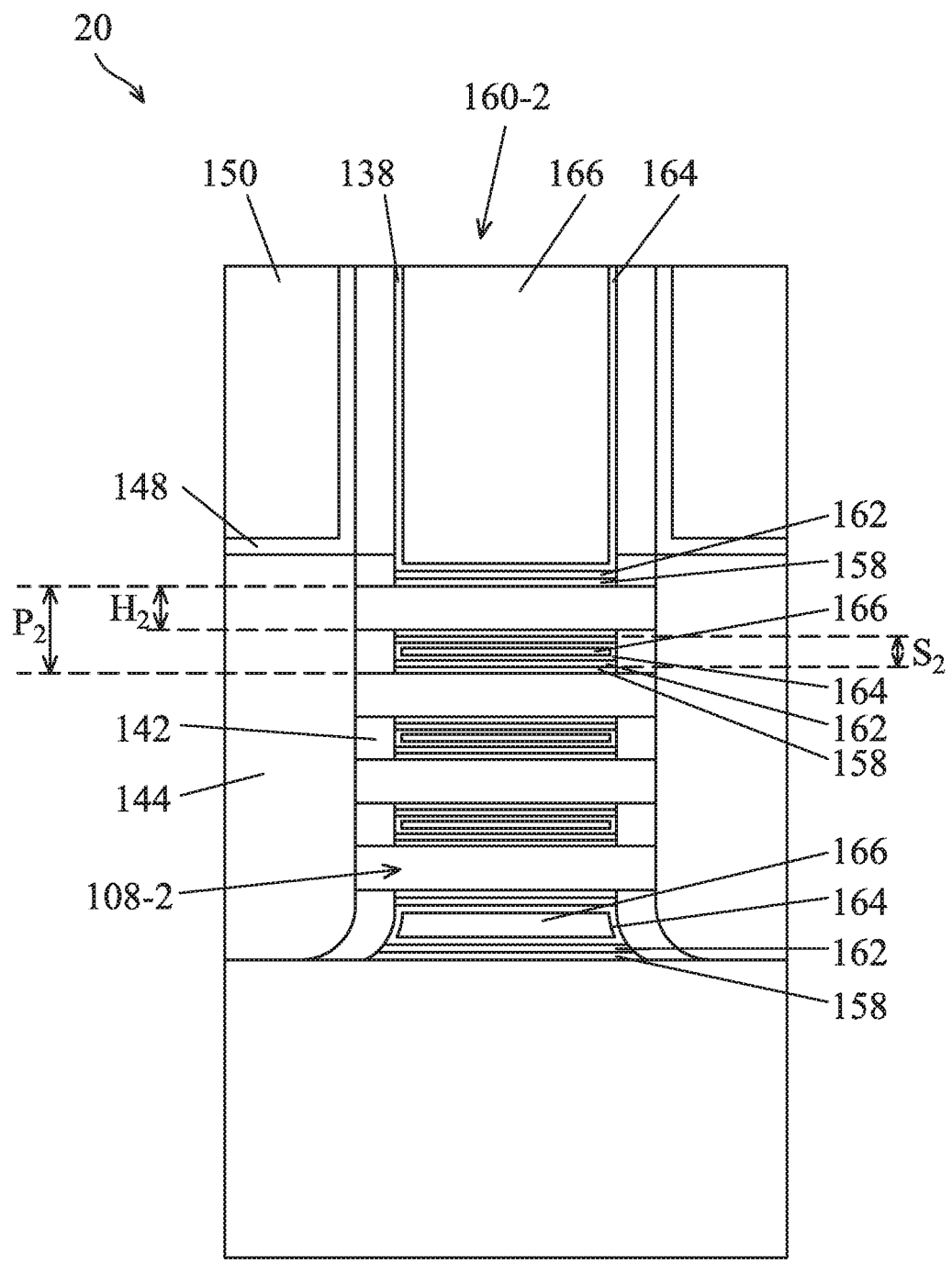

FIGS. 3A-1 and 3A-2 illustrate cross-sectional representations of the semiconductor structure 100 alone C-C' shown in FIGS. 1T-1 and 1T-2 respectively in accordance with some embodiments.

Since the nanostructures 108-1 and 108-2 formed in the first region 10 and the second region 20 are both formed from the second semiconductor material layers 108, the pitch P$_1$ between neighboring nanostructures 108-1 and the pitch P$_2$ between neighboring nanostructures 108-2 are substantially the same, as shown in FIGS. 3A-1 and 3A-2 in accordance with some embodiments. Similarly, the height H$_1$ of the nanostructure 108-1 and the height H$_2$ of the nanostructure 108-2 may be substantially the same.

In addition, since the semiconductor material layers 158 are formed around the nanostructures 108-2 but not around the nanostructures 108-1, the space S$_1$ between neighboring nanostructures 108-1 is greater than the space S$_2$ between neighboring nanostructures 108-2, as shown in FIGS. 3A-1 and 3A-2 in accordance with some embodiments. In some embodiments, the difference between the space S$_1$ between neighboring nanostructures 108-1 and the space S$_2$ between neighboring nanostructures 108-2 is in a range from about 1 nm to about 4 nm.

Figures 2, 3B:
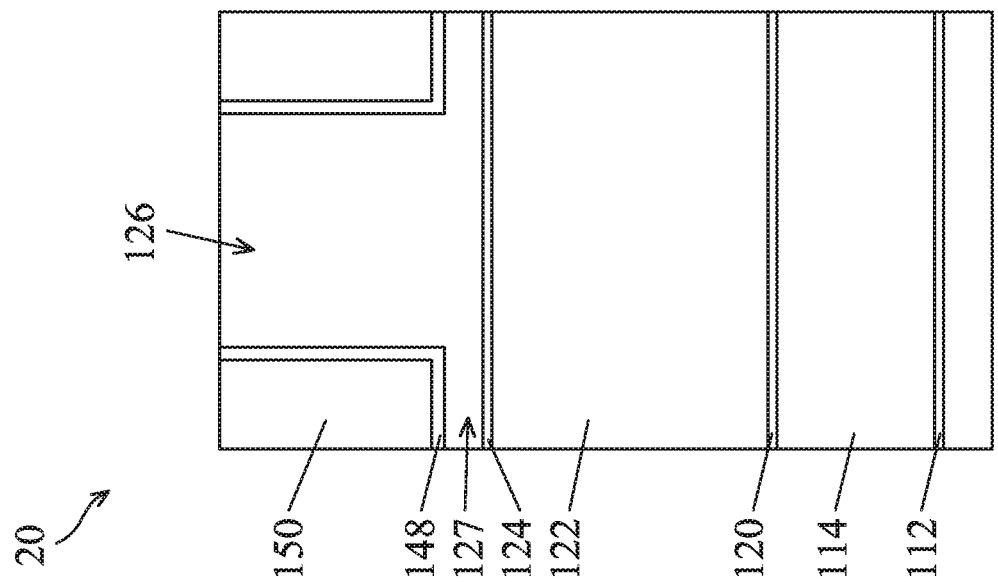
Figures 1, 3B:
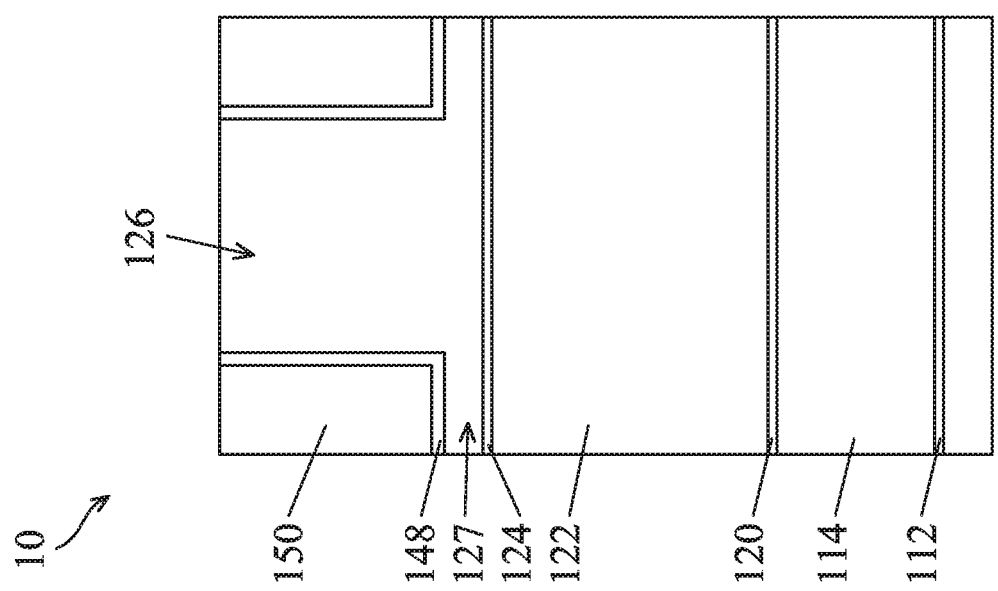

FIGS. 3B-1 and 3B-2 illustrates a cross-sectional representation of the semiconductor structure 100 alone D-D' shown in FIGS. 1T-1 and 1T-2 respectively in accordance with some embodiments.

As described previously, different regions of the gate structures 160-1 and 160-2 may be isolated by the dielectric capping layers 126 over the dielectric fin structures 122 formed beforehand without performing complicated alignment processes. In addition, the dielectric capping layers 126 not cover by the gate spacers 138 and the dummy gate structures 128 are recessed to form the recessed portions 127 (also see FIGS. 1K-1 and 1K-2), and therefore the thickness of the recessed portions 127 adjacent to the source/drain structures 144 are smaller than the thickness of the dielectric capping layers 126 adjacent to the gate structures 160-1 and 160-2, as shown in FIGS. 3B-1 and 3B-2 in accordance with some embodiments.

Figures 4A, 4B:
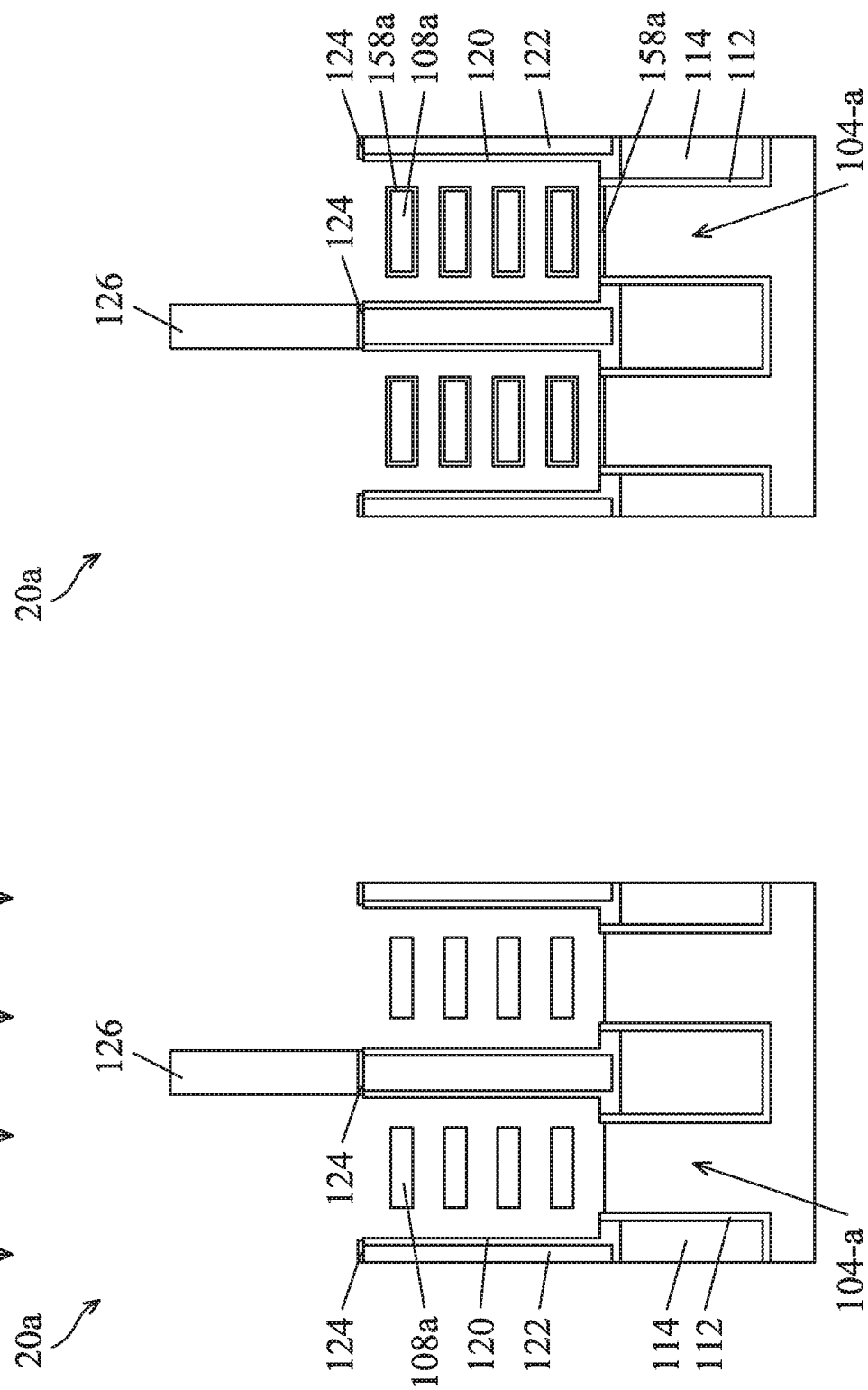
FIGS. 4A to 4C illustrate cross-sectional representations of various stages of manufacturing the semiconductor structure in accordance with some embodiments.
Figure 4C:
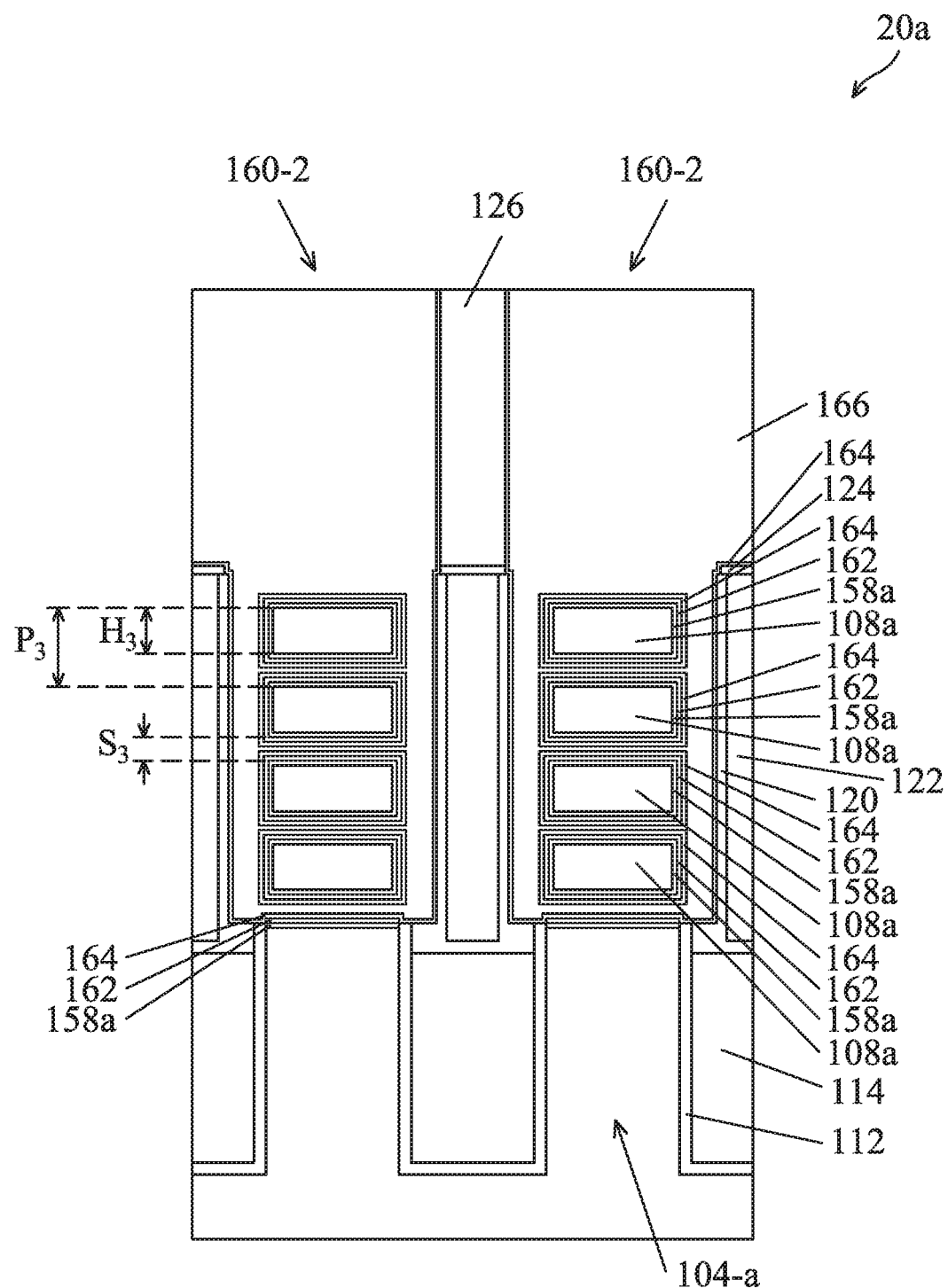

FIGS. 4A to 4C illustrate cross-sectional representations of various stages of manufacturing the semiconductor structure 100a in accordance with some embodiments. Processes and materials for forming the semiconductor structure 100a are substantially similar to, or the same as, those shown in FIGS. 1A-1 to 1T-1, 1A-2 to 1T-2, 2A-1 to 2G-1, FIGS. 2A-2 to 2G-2, FIGS. 3A-1 and 3B-1, and FIGS. 3A-2 and 3B-2, except a trimming process is performed before the additional semiconductor material layer is formed in accordance with some embodiments. Processes and materials similar to, or the same as, those shown in FIGS. 1A-1 to 1T-1, 1A-2 to 1T-2, 2A-1 to 2G-1, FIGS. 2A-2 to 2G-2, FIGS. 3A-1 and 3B-1, and FIGS. 3A-2 and 3B-2 and described previously are not repeated herein.

More specifically, after the processes shown in FIGS. 1A-2 to 1Q-2 and 2A-2 to 2D-2 are performed, a trimming process 257 is performed to a second region 20a, as shown in FIG. 4A in accordance with some embodiments. The trimming process 257 may be configured to diminish (e.g. thin) the size of nanostructures 108a, so that the thickness of each nanostructure 108a shown in FIG. 4A is smaller than the thickness of each nanostructure 108-2 shown in FIG. 2D-2. In some embodiments, the top portions of the fin structures 104a are also trimmed. In some embodiments, the trimming process 257 is a plasma process.

After the trimming process 257 is performed to form the nanostructures 108a, semiconductor material layers 158a are formed around the nanostructures 108a and over the top surface of fin structures 104a, as shown in FIG. 4B in accordance with some embodiments.

In some embodiments, the semiconductor material layers 158a are made of Si, Ge, or SiGe. In some embodiments, the semiconductor material layers 158a and the nanostructures 108a are made of different semiconductor materials. For example, the semiconductor material layers 158a are made of SiGe and the nanostructures 108a are made of Si, thereby the second region 20 may be used in a PMOS device.

After the semiconductor material layers 158a are formed, gate structures 160a are formed, as shown in FIG. 4C in accordance with some embodiments. In some embodiments, the gate structures 160a are similar to the gate structures 160-2 described previously and include the interfacial layers 162, the gate dielectric layers 164, and the gate electrode layers 166.

It should be noted that, although not shown in FIG. 4C, the semiconductor structure 100a may be combined with the semiconductor structure 100 described previously. For example, a semiconductor device may include the structure shown in FIG. 2G-1, and/or the structure shown in FIG. 2G-2, and/or the structure shown in FIG. 4C and the concept of the present application is not intended to be limiting.

In such embodiments, the pitch $P_3$ between neighboring nanostructures 108a may be substantially the same as the pitch $P_1$ between neighboring nanostructures 108-1 and the pitch $P_2$ between neighboring nanostructures 108-2. On the other hand, since the additional trimming process 257 is performed, the height $H_3$ of the nanostructure 108a may be smaller than the height $H_1$ of the nanostructure 108-1 and the height $H_2$ of the nanostructure 108-2. In some embodiments, the difference between the height $H_3$ of the nanostructure 108a and the height $H_1$ of the nanostructure 108-1 is in a range from about 1 nm to about 4 nm.

In addition, since the additional trimming process 257 is performed to the nanostructures 108a and the semiconductor material layers 158a are formed around the nanostructures 108a, the space $S_3$ between neighboring nanostructures 108a may be substantially the same as the space $S_1$ between neighboring nanostructures 108-1 and may be greater than the space $S_2$ between neighboring nanostructures 108-2. In some embodiments, the difference between the space $S_3$ between neighboring nanostructures 108a and the space $S_2$ between neighboring nanostructures 108-2 is in a range from about 1 nm to about 4 nm.

Figure 5:
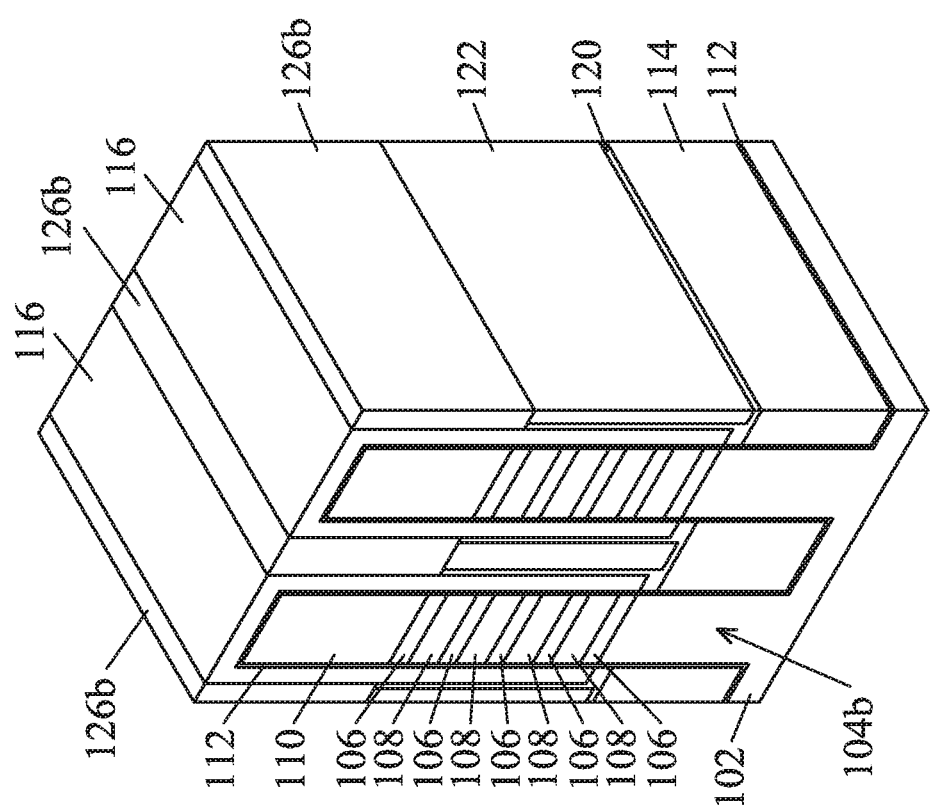
FIG. 5 illustrates a perspective view of an intermediate stage of manufacturing a semiconductor structure and FIG. 6 illustrates a cross-sectional representation of the semiconductor structure in accordance with some embodiments.
Figure 6:
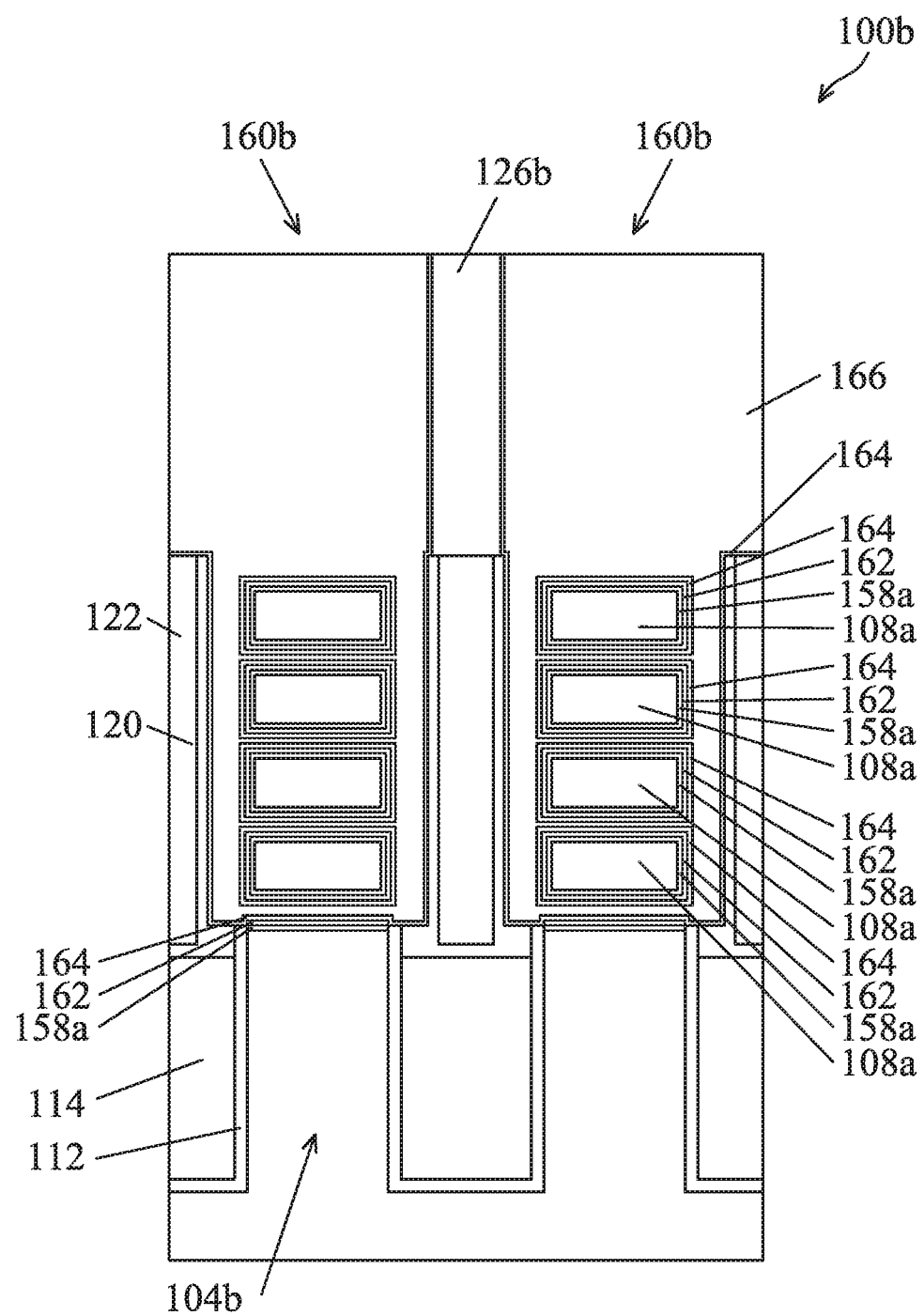

FIG. 5 illustrates a perspective view of an intermediate stage of manufacturing a semiconductor structure 100b in accordance with some embodiments. FIG. 6 illustrates a cross-sectional representation of the semiconductor structure 100b in accordance with some embodiments. Processes and materials for forming the semiconductor structure 100b are similar to, or the same as, those for forming the semiconductor structure 100a, except the barrier layer 124 are not formed in accordance with some embodiments. Processes and materials similar to, or the same as, those for forming the semiconductor structure 100a described previously are not repeated herein.

More specifically, instead of forming both barrier layers 124 and the dielectric capping layers 126, only dielectric capping layers 126b are formed over the dielectric fin structure 122, as shown in FIG. 5 in accordance with some embodiments. In some embodiments, the dielectric capping layers 126b are made of high-k dielectric material such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

After the dielectric capping layers 126b are formed, processes similar to those for forming the semiconductor structure 100a (e.g. shown in FIGS. 4A to 4C) are performed to form the semiconductor structure 100b, as shown in FIG. 6 in accordance with some embodiments. As shown in FIG. 6, gate structures 160b, similar to the gate structure 160a, include the interfacial layers 162, the gate dielectric layers 164, and the gate electrode layer 166 in accordance with some embodiments. In addition, the gate dielectric layers 164 are in direct contact with the top surfaces of the dielectric fin structures 122 in accordance with some embodiments.

It should be noted that, although not shown in FIG. 6, the semiconductor structure 100b may be combined with the semiconductor structures 100 and 100a described previously. For example, a semiconductor device may include the structure shown in FIG. 2G-1, and/or the structure shown in FIG. 2G-2, and/or the structure shown in FIG. 4C, and/or the structure shown in FIG. 6 and the concept of the present application is not intended to be limiting.

Figure 7:
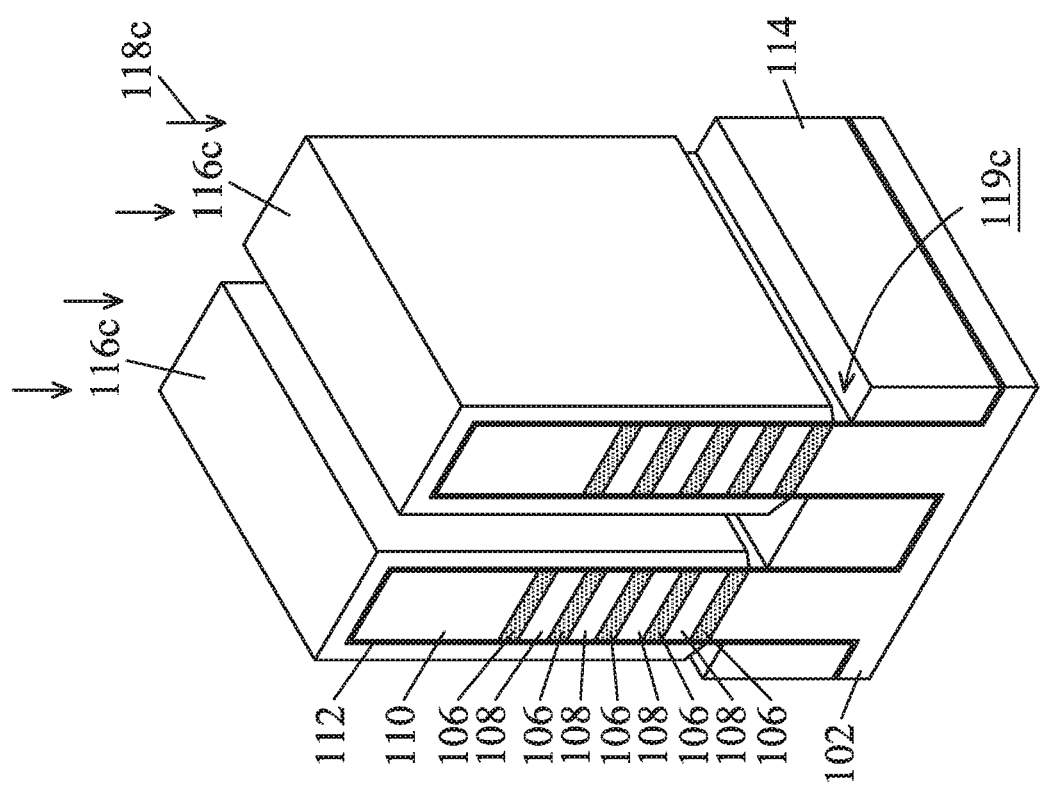
FIG. 7 illustrates a perspective view of an intermediate stage of manufacturing a semiconductor structure and FIG. 8 illustrates a cross-sectional representation of the semiconductor structure in accordance with some embodiments.
Figure 8:
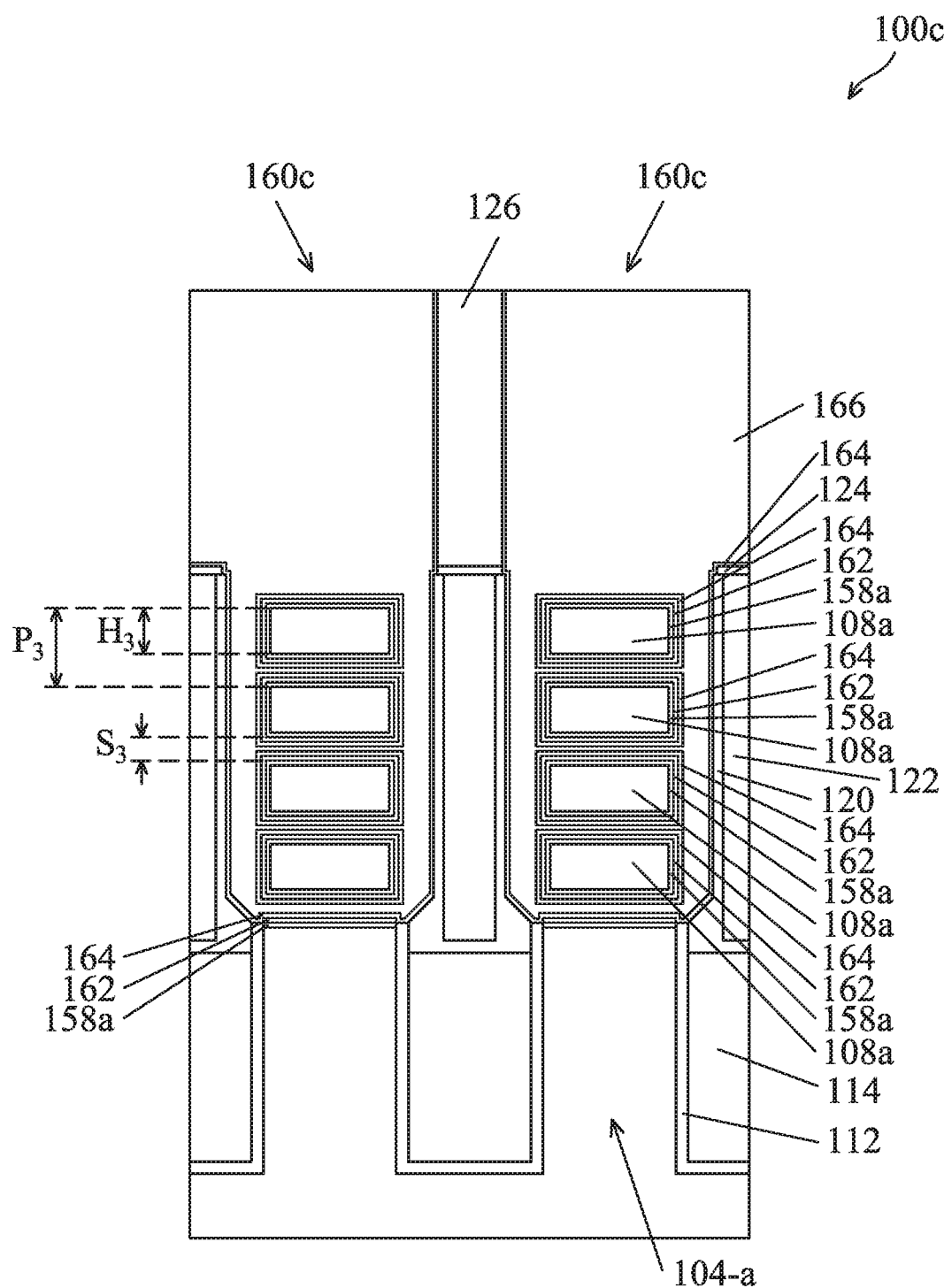

FIG. 7 illustrates a perspective view of an intermediate stage of manufacturing a semiconductor structure 100c in accordance with some embodiments. FIG. 8 illustrates a cross-sectional representation of the semiconductor structure 100c in accordance with some embodiments. Processes and materials for forming the semiconductor structure 100c are similar to, or the same as, those for forming the semiconductor structure 100a, except bottom portions of the capping layers 116 are removed during the etching process for recessing the isolation structure 114 in accordance with some embodiments. Processes and materials similar to, or the same as, those for forming the semiconductor structure 100a described previously are not repeated herein.

More specifically, after the capping layers are formed on the liner layer 112 over fin structures 104c and over the isolation structure 114, an etching process 118c is performed to recess the isolation structure 114, as shown in FIG. 7 in accordance with some embodiments. In addition, bottom portions of the capping layers are also etched during the etching process 118c, such that the resulting capping layers 116c have slope bottom surfaces in accordance with some embodiments. Accordingly, the height of gaps 119c formed between the capping layers 116c and the isolation structure 114 gradually increases from the edge of the fin structures 104c to away from the fin structures 104c in accordance with some embodiments. Since the openings of the gaps 119c are wider, they can be filled by the protection layers formed afterwards more easily. In some embodiments, the etching process 118c is a wet etching process or a dry etching process.

After the etching process 118c is performed, processes similar to those for forming the semiconductor structure 100a (e.g. shown in FIGS. 4A to 4C) are performed to form the semiconductor structure 100c, as shown in FIG. 8 in accordance with some embodiments. As described previously, protection layers 120c are filled into the gaps 119c, and therefore the extending portions 120c' of the protection layers 120c have thicknesses increase gradually from the sidewall of the nanostructures 108a to away from the nanostructures 108a in accordance with some embodiments. In addition, gate structures 160c formed between the protection layers 120c therefore have bottom surfaces that are not flat, as shown in FIG. 8 in accordance with some embodiments. In some embodiments, the gate structures 160c, similar to the gate structure 160a, include the interfacial layers 162, the gate dielectric layers 164, and the gate electrode layer 166 in accordance with some embodiments.

It should be noted that, although not shown in FIG. 8, the semiconductor structure 100c may be combined with the semiconductor structures 100, 100a, and 100b described previously. For example, a semiconductor device may include the structure shown in FIG. 2G-1, and/or the structure shown in FIG. 2G-2, and/or the structure shown in FIG. 4C, and/or the structure shown in FIG. 6, and/or the structure shown in FIG. 8 and the concept of the present application is not intended to be limiting.

Figure 9:
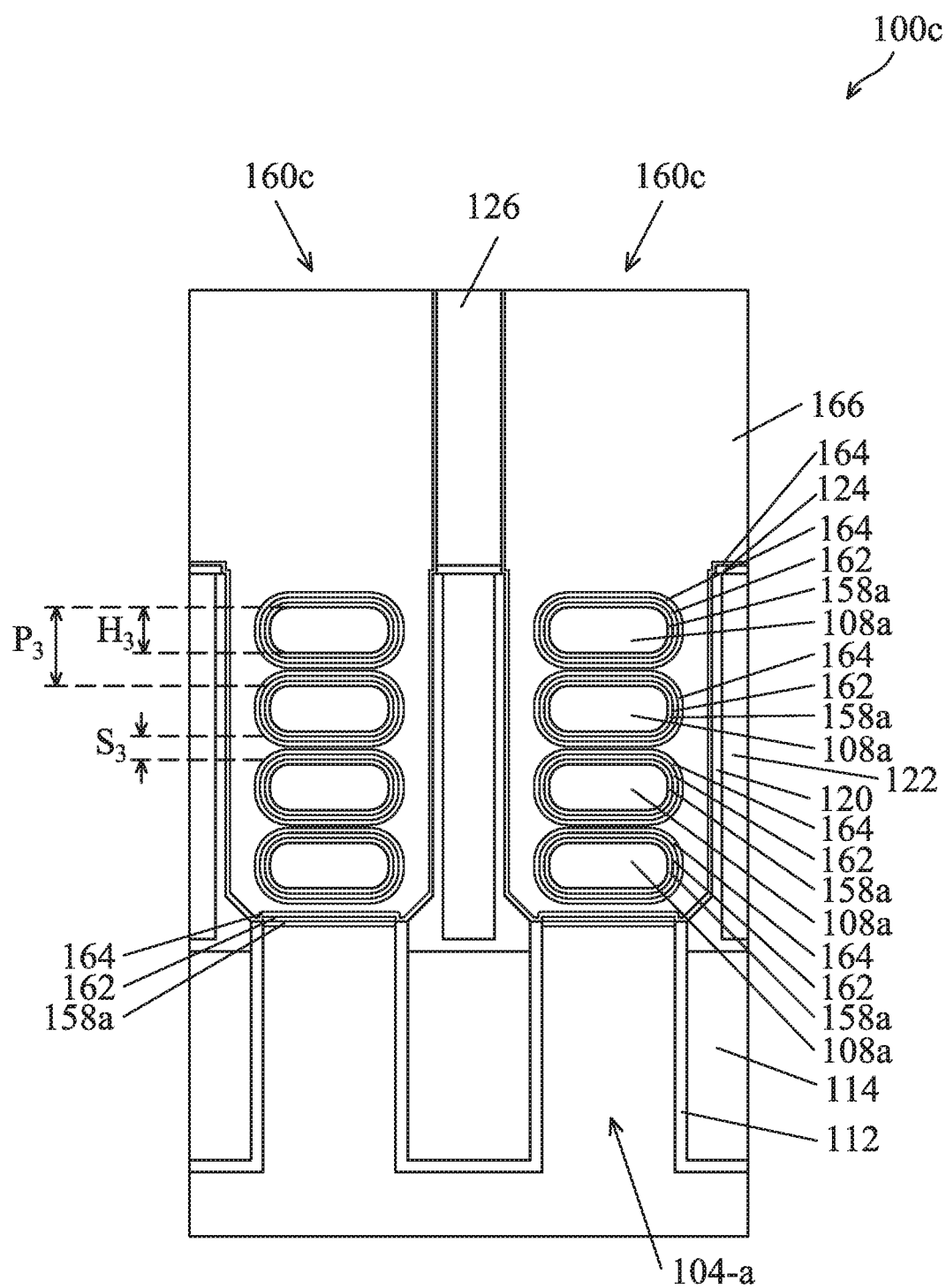
FIG. 9 illustrates a cross-sectional representation of the semiconductor structure in accordance with some embodiments.

FIG. 9 illustrates a cross-sectional representation of the semiconductor structure 100d in accordance with some embodiments. Processes and materials for forming the semiconductor structure 100d are similar to, or the same as, those for forming the semiconductor structure 100c, except nanostructures 108d have rounded corners in accordance with some embodiments. Processes and materials similar to, or the same as, those for forming the semiconductor structure 100c described previously are not repeated herein.

More specifically, after the capping layers, the liner layers, and the first semiconductor material layers are removed (e.g. the capping layers 116, the liner layers 112, and the first semiconductor material layers 106 described previously), a trimming process (similar to the trimming process 247) is performed onto the nanostructures 108d, so that the nanostructures 108d are diminished and rounded at their corners, as shown in FIG. 9 in accordance with some embodiments. In some embodiments, the trimming process is a plasma process.

After the trimming process is performed, processes similar to those for forming the semiconductor structure 100c are performed to form the semiconductor structure 100d, as shown in FIG. 9 in accordance with some embodiments. As described previously, the nanostructures 108d have rounded corners in accordance with some embodiments. In addition, similar to the semiconductor structure 100c, gate structures 160d include the interfacial layers 162, the gate dielectric layers 164, and the gate electrode layer 166 formed around the rounded nanostructures 108d in accordance with some embodiments.

It should be noted that, although not shown in FIG. 9, the semiconductor structure 100d may be combined with the semiconductor structures 100, 100a, 100b, and 100c described previously. For example, a semiconductor device may include the structure shown in FIG. 2G-1, and/or the structure shown in FIG. 2G-2, and/or the structure shown in FIG. 4C, and/or the structure shown in FIG. 6, and/or the structure shown in FIG. 8, and/or the structure shown in FIG. 9 and the concept of the present application is not intended to be limiting.

FIGS. 10A-1 to 10E-1, 10A-2 to 10E-2, and 10A-3 to 10E-3 illustrate cross-sectional representations of various stages of manufacturing the semiconductor structure 100e in accordance with some embodiments. Processes and materials for forming the semiconductor structure 100e are substantially similar to, or the same as, those for forming the semiconductor structure 100 and are not repeated herein.

More specifically, processes shown in FIGS. 2A-1 to 2C-1 are performed to form nanostructures 108e-1, 108e-2, and 108e-3 over fin structures 104e-1, 104e-2, and 104e-3 in regions 30, 40, and 50 respectively in accordance with some embodiments. In some embodiments, the regions 30, 40, 50 are located in the same substrate 102. After the nanostructures 108e-1, 108e-2, and 108e-3 are formed, a mask layer 254 is conformally formed over the regions 30, 40, and 50 first and is patterned through a photoresist layer 256 to remove the mask layers 254 formed over the region 50, as shown in FIGS. 10A-1, 10A-2, and 10A-3 in accordance with some embodiments. That is, nanostructures 108e-1 and 108e-2, the protection layers 120, the barrier layers 124, and the dielectric capping layers 126' in the regions 30 and 40 are covered by the mask layer 254, and the structure in the region 50 is exposed in accordance with some embodiments.

Figures 1, 10:
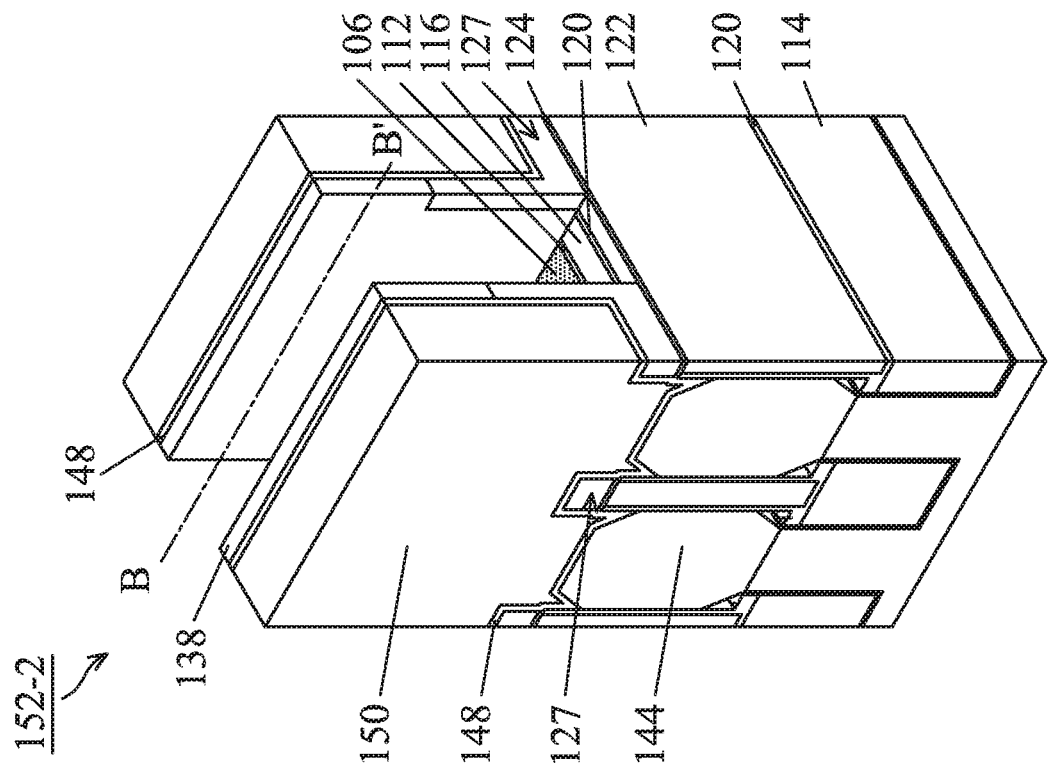
Figures 2, 10:
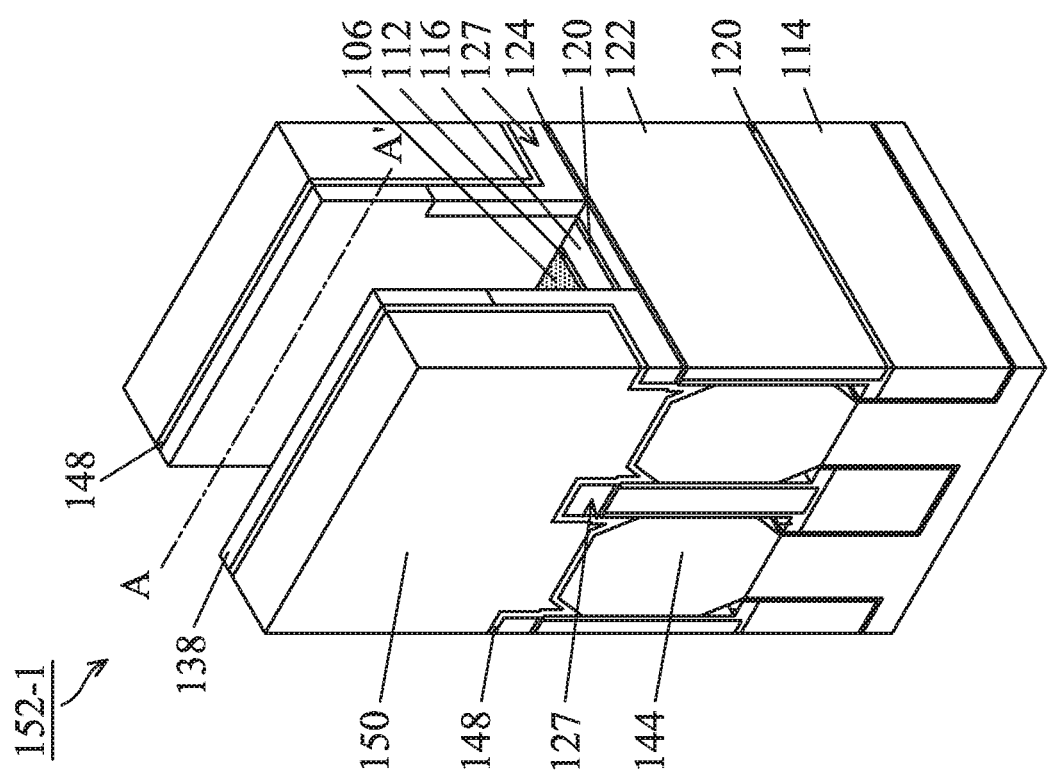
Figures 1, 1P, 2:
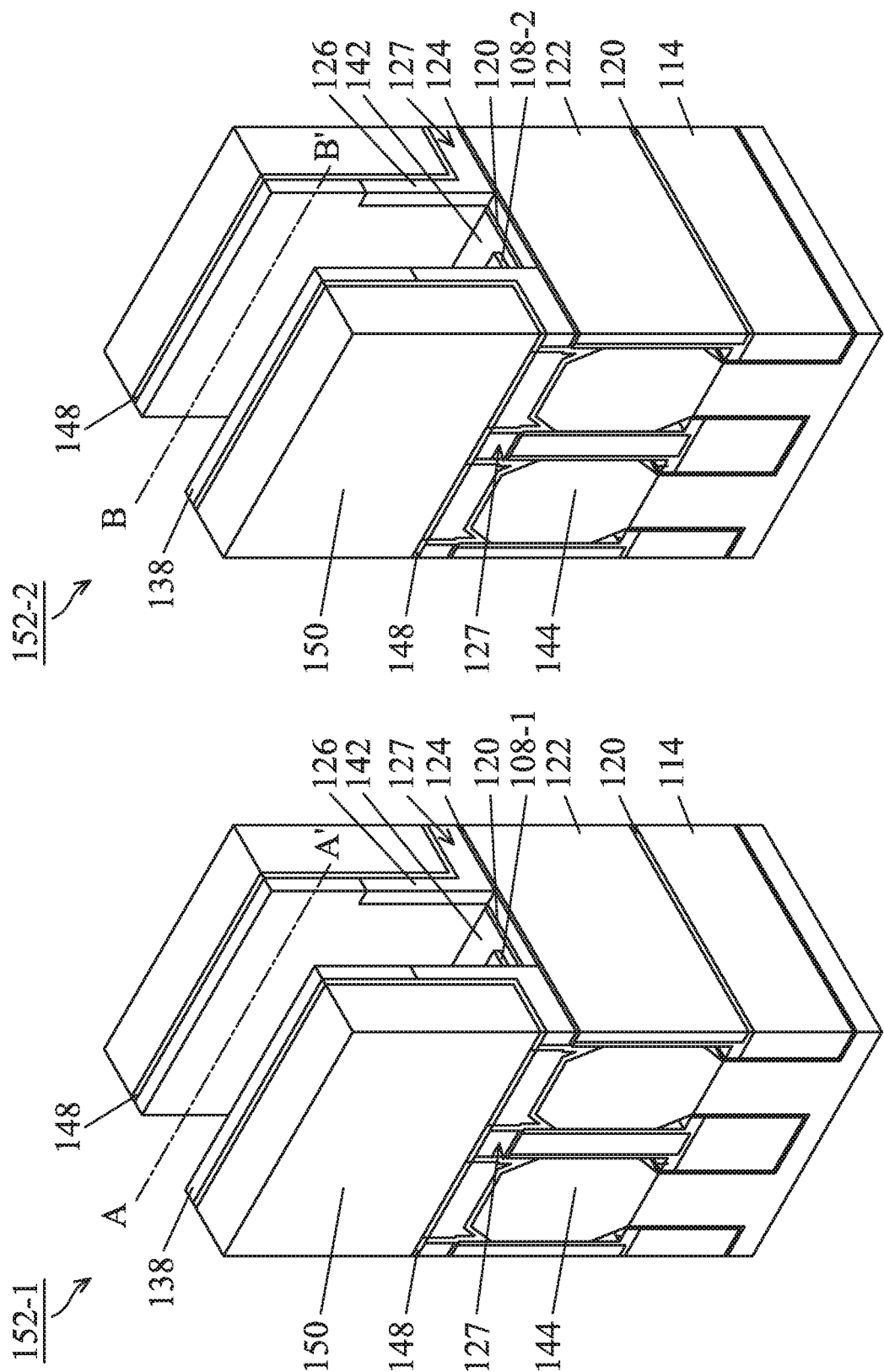
Figures 1, 2, 3, 10B:
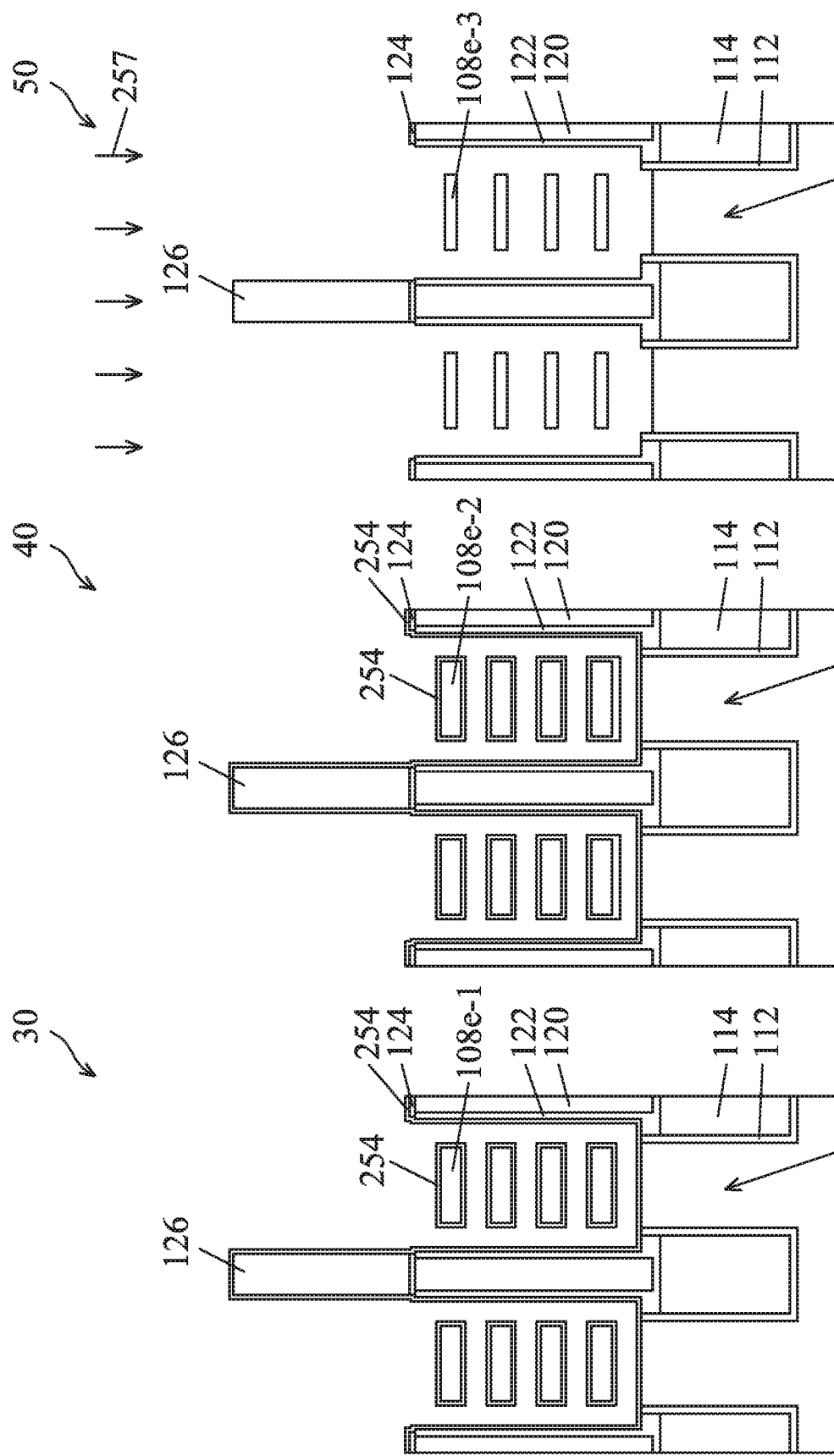
Figures 1, 10F:
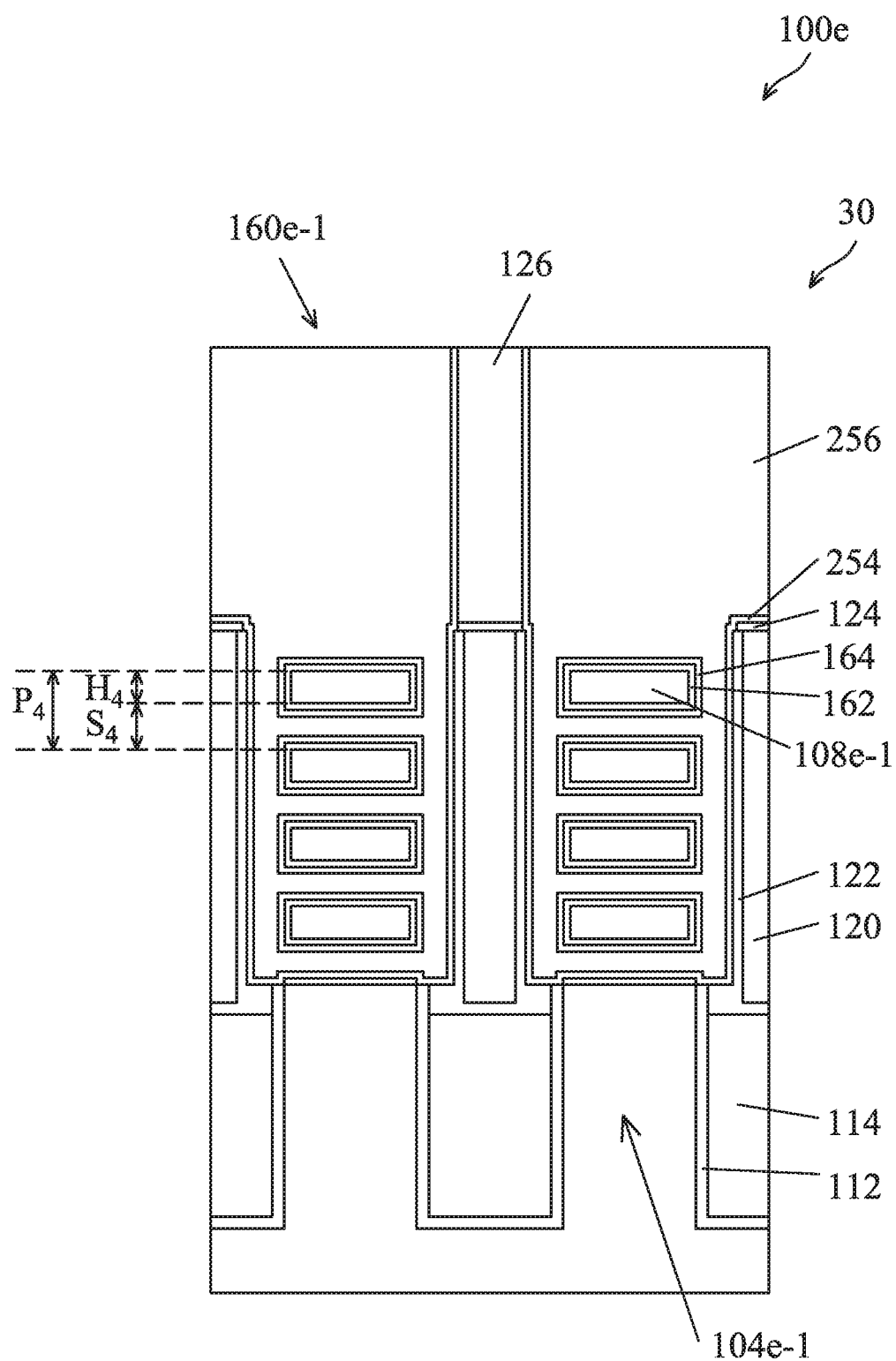
Figures 2, 10F:
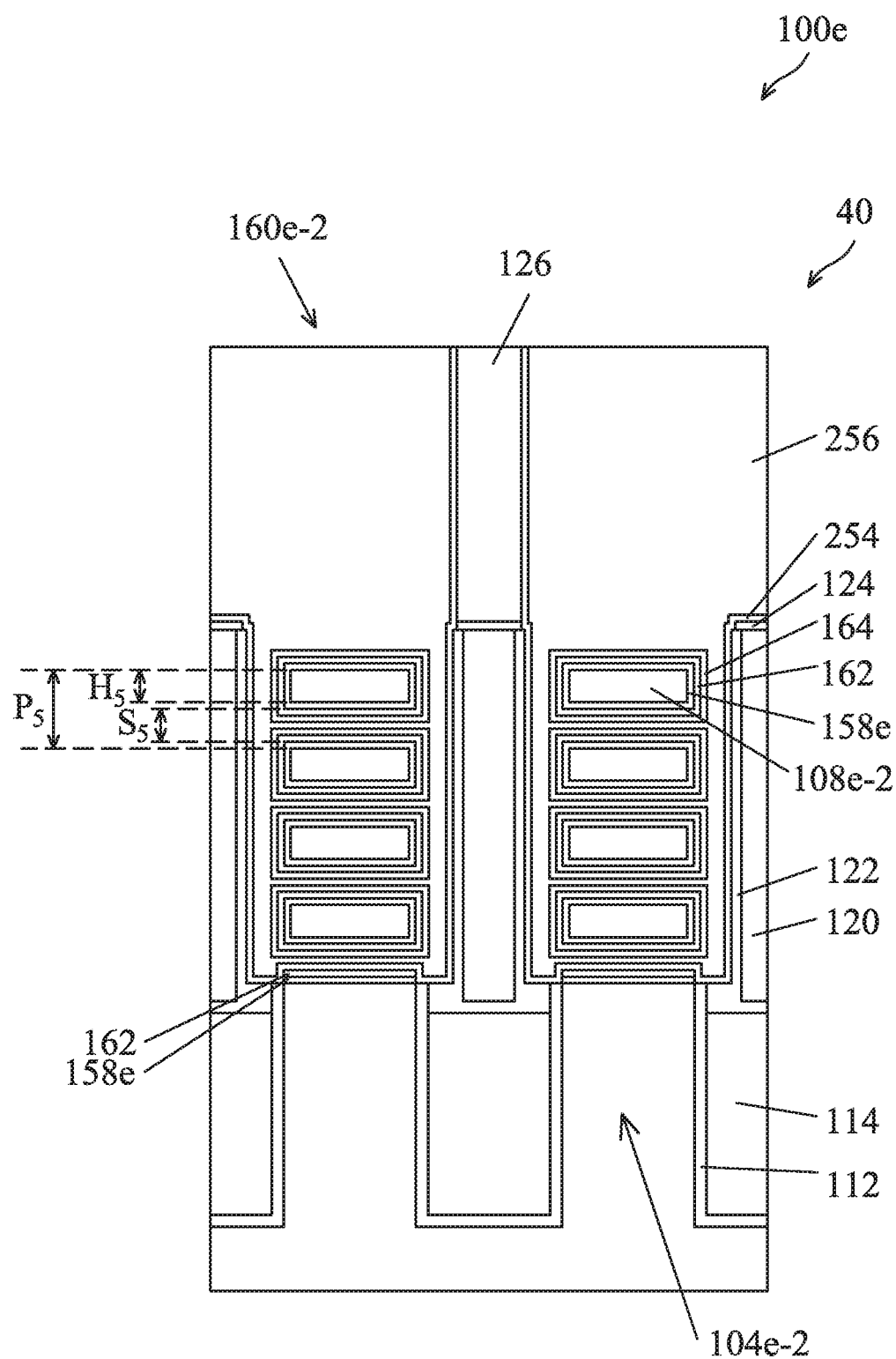
Figures 3, 10F:
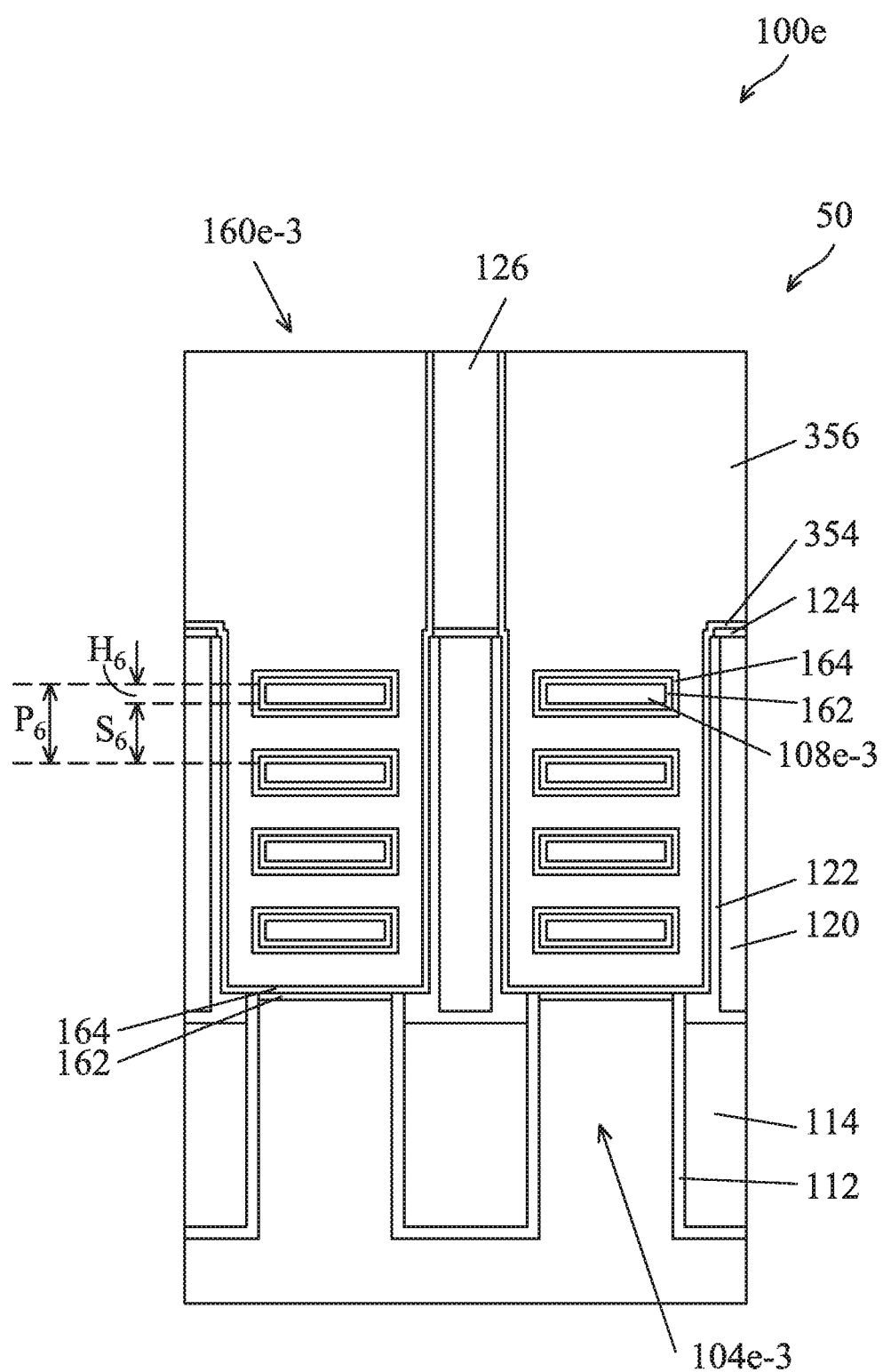

Next, the photoresist layer 256 is removed, and the trimming process 257 is performed to the region 50, while the regions 30 and 40 are protected by the mask layers 254, as shown in FIGS. 10B-1, 10B-2, and 10B-3 in accordance with some embodiments. As shown in FIG. 10B-3, the nanostructures 108e-3 are treated by the trimming process 257, so that the size of the nanostructures 108e-3 are diminished and the spaces between neighboring nanostructures are enlarged in accordance with some embodiments.

After the trimming process 257 is performed, the mask layer 254 is removed and a mask layer 354 is formed in the regions 30 and 50, as shown in FIGS. 10C-1, 10C-2, and 10C-3 in accordance with some embodiments. Similarly, the mask layer 354 may be formed over all the regions 30, 40, and 50 and may be patterned through a photoresist layer 356 so that the mask layer 354 cover the structures in the regions 30 and 50 but not cover the structure in the regions 40.

Next, the photoresist layer 356 is removed, and additional semiconductor material layers 158e are grown in the region 40, while the regions 30 and 40 are protected by the mask layer 354, as shown in FIGS. 10D-1, 10D-2, and 10D-3 in accordance with some embodiments. As shown in FIG. 10D-2, the nanostructures 108e-2 are surrounded by the semiconductor material layers 158e, so that the spaces between neighboring nanostructures 108e-2 are diminished in accordance with some embodiments. Processes and materials for forming semiconductor material layers 158e may be similar to, or the same as, those for forming semiconductor material layers 158 described previously and are not repeated herein.

After the semiconductor material layers 158e are formed, the mask layer 354 is removed, as shown in FIGS. 10E-1, 10E-2, and 10E-3 in accordance with some embodiments. Since the nanostructures 108e-3 are trimmed, the spaces between the neighboring nanostructures 108e-3 are greater than those between the neighboring nanostructures 108e-1 and 108e-2 in accordance with some embodiments. In addition, since the nanostructures 108e-2 are surrounded by the semiconductor material layers 158e, the spaces between the neighboring nanostructures 108e-2 are smaller than those between the neighboring nanostructures 108e-1 and 108e-3 in accordance with some embodiments Next, gate structures 160e-1, 160e-2, and 160e-3 are formed around the nanostructures 108e-1, 108e-2, and 108e-3, as shown in FIGS. 10E-1, 10E-2, and 10E-3 in accordance with some embodiments. In some embodiments, gate structures 160e-1, 160e-2, and 160e-3, similar to the gate structure 160, include the interfacial layers 162, the gate dielectric layers 164, and the gate electrode layer 166.

Since the nanostructures 108e-1, 108e-2, and 108e-3 formed in the regions 30, 40, and 50 are both formed from the same semiconductor material stack, the pitch $P_3$ between neighboring nanostructures 108e-1, the pitch $P_4$ between neighboring nanostructures 108e-2, and the pitch $P_5$ between neighboring nanostructures 108e-3 are substantially the same, as shown in FIGS. 10E-1, 10E-2 and 10E-3 in accordance with some embodiments.

In addition, since the rimming process 257 is performed, the height $H_6$ of the nanostructure 108e-3 may be smaller than the height $H_4$ of the nanostructure 108e-1 and the height $H_5$ of the nanostructure 108e-2. In some embodiments, the difference between the height $H_6$ of the nanostructure 108e-3 and the height $H_4$ of the nanostructure 108e-1 or the height $H_5$ of the nanostructure 108e-2 is in a range from about 1 nm to about 4 nm.

Furthermore, since the semiconductor material layers 158e are formed around the nanostructures 108e-2 but not around the nanostructures 108e-1 and 108e-3, the space $S_6$ between neighboring nanostructures 108e-3 is greater than the space $S_4$ between neighboring nanostructures 108e-1, and the space $S_4$ between neighboring nanostructures 108e-1 is greater than the space $S_5$ between neighboring nanostructures 108e-2, as shown in FIGS. 10E-1, 10E-2, and 10E-3 in accordance with some embodiments.

As described previously, the semiconductor structures (e.g. semiconductor structures 100, 100a, 100b, 100c, 100d, and 100e) with various channel regions are formed in accordance with some embodiments. In addition, although the material used in forming the nanostructures (e.g. with/ without the additional semiconductor material layers 158/ 158a/158e) and/or the thicknesses of the nanostructures (e.g. the nanostructures 108a/108e-3) and/or the spacing of neighboring nanostructures (e.g. the semiconductor structure 100/100e) in different regions of the semiconductor structure may be different, these nanostructures can be patterned from the same semiconductor material stack. Therefore, the formation of several semiconductor stacks that have different thickness, spacing, and materials over a semiconductor substrate is not required, and the defects that tend to occur at the boundaries of different semiconductor stacks can be avoided.

In addition, in some embodiments, additional semiconductor material layers (e.g. the semiconductor material layers 158/158a/158e) are formed around the nanostructures. In some embodiments, the additional semiconductor material layers may be formed to adjust the spacing of neighboring nanostructures, so that although the nanostructures in different regions may have the same pitch since they are patterned from the same semiconductor material stack but can still have different spacing.

Furthermore, the additional semiconductor material layers and the nanostructures may be made of different materials. For example, the nanostructures are made of Si and the semiconductor material layers are made of SiGe, and the regions without the additional semiconductor material layers (e.g. the first region 10) may be used in a PMOS transistor and the regions with the additional semiconductor material layers (e.g. the second region 20) may be used in a NMOS transistor.

Before the nanostructures are formed from the fin structures, capping layers 116 are formed over the fin structure to help the removal of the first semiconductor material layers 106 in the channel releasing process in accordance with some embodiments. In addition, protection layers 112 are formed around the capping layers 116 and cover the top surface of the isolation structure 114, so that the isolation structure 114 can be protected by the protection layers 112 during the processes for removing the capping layers 116 and the first semiconductor material layers 106 in accordance with some embodiments. Accordingly, risks of circuit short between the source/drain structures 144 and the gate structures due to the loss of the isolation structure may be reduced.

Embodiments for forming semiconductor structures may be provided. The semiconductor structure may include nanostructure, isolation structures, gate structures formed around the nanowire structures, and source/drain structures. In addition, a protection layer may be formed over the isolation structure, so the isolation structure may be protected during the process for forming the nanostructures, and the risk of circuit short between the source/drain structures and the gate structures due to the loss of the isolation structure may be reduced. Accordingly, the performance of the resulting semiconductor structures may be improved.

In some embodiments, a method for manufacturing a semiconductor structure is provided. The method for manufacturing the semiconductor structure includes forming a first fin structure comprising first semiconductor material layers and second semiconductor material layers alternately stacked over a substrate and forming an isolation structure surrounding the first fin structure. The method for manufacturing the semiconductor structure also includes forming a first capping layer over the isolation structure and covering the top surface and sidewalls of the first fin structure and etching the isolation structure to form a first gap between the first capping layer and the top surface of the isolation structure. The method for manufacturing the semiconductor structure also includes forming a protection layer covering a sidewall of the first capping layer and filling in the first gap.

In some embodiments, a method for manufacturing a semiconductor structure is provided. The method for manufacturing the semiconductor structure includes alternately stacking first semiconductor material layers and second semiconductor material layers over a substrate and patterning the first semiconductor material layers and the second semiconductor material layers to form a first fin structure in a first region of the substrate and a second fin structure in a second region of the substrate. The method for manufacturing the semiconductor structure also includes forming an isolation structure around the first fin structure and the second fin structure and forming a first capping layer covering the first fin structure and a second capping layer covering the second fin structure over the isolation structure. The method for manufacturing the semiconductor structure also includes recessing the isolation structure to form a first gap under the first capping layer and a second gap under the second capping layer and forming a protection layer covering the top surface of the isolation layer and filling in the first gap and the second gap.

In some embodiments, a semiconductor structure is provided. The semiconductor structure includes a substrate and a first fin structure formed over the substrate. The semiconductor structure also includes an isolation structure formed around the first fin structure and a protection layer formed on the isolation structure. The semiconductor structure also includes first nanostructures formed over the first fin structure and a gate structure surrounding the first nanostructures. In addition, a bottom surface of the gate structure and the top surface of the isolation structure are separated by the protection layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a first fin structure comprising first semiconductor material layers and second semiconductor material layers alternately stacked over a substrate;
    forming an isolation structure surrounding the first fin structure;
    forming a first capping layer over the isolation structure and covering a top surface and sidewalls of the first fin structure;
    etching the isolation structure to form a first gap between the first capping layer and a top surface of the isolation structure;

forming a protection layer covering a sidewall of the first capping layer and filling in the first gap;

removing the first capping layer and the first semiconductor material layers of the first fin structure;

forming a gate structure wrapping around the second semiconductor material layers of the first fin structure after the first capping layer is removed; and forming a source/drain structure connecting to the second semiconductor material layers of the first fin structure, wherein the protection layer is separated from the second semiconductor material layers by the gate structure.

2. The method for manufacturing the semiconductor structure as claimed in claim 1, further comprising:

thinning the second semiconductor material layers after the first semiconductor material layers and the first capping layer are removed;

forming a third semiconductor material layer surrounding the second semiconductor material layers, wherein the gate structure surrounds the third semiconductor material layer.

3. The method for manufacturing the semiconductor structure as claimed in claim 2, wherein the first semiconductor material layers, the first capping layer, and the third semiconductor material layer are made of SiGe, and the second semiconductor material layers are made of Si.

4. The method for manufacturing the semiconductor structure as claimed in claim 1, further comprising:

forming a second fin structure comprising the first semiconductor material layers and the second semiconductor material layers alternately stacked over the substrate, wherein the second fin structure is surrounded by the isolation structure;

forming a second capping layer over the isolation structure and covering a top surface and sidewalls of the second fin structure;

etching the isolation structure to form a second gap between the second capping layer and the top surface of the isolation structure, wherein the protection layer extends from the sidewall of the first capping layer to a sidewall of the second capping layer and fills in the second gap.

5. The method for manufacturing the semiconductor structure as claimed in claim 4, further comprising:

forming a dielectric fin structure between the first fin structure and the second fin structure, and forming a dielectric capping layer over the dielectric fin structure, wherein the dielectric fin structure and the dielectric capping layer are separated from the first capping layer and the second capping layer by the protection layer.

6. The method for manufacturing the semiconductor structure as claimed in claim 5, wherein the dielectric fin structure is separated from the isolation structure by the protection layer.

7. The method for manufacturing the semiconductor structure as claimed in claim 5, further comprising:

removing the first capping layer and the first semiconductor material layers of the first fin structure to form first nanostructures from the second semiconductor material layers of the first fin structure and removing the second capping layer and the first semiconductor material layers of the second fin structure to form second nanostructures from the second semiconductor material layers of the second fin structure;

forming third semiconductor layers surrounding each of the first nanostructures and each of the second nanostructures;

forming the gate structure over the third semiconductor layers and surrounding the first nanostructures and the second nanostructures; and polishing the gate structure until a top surface of the dielectric capping layer is exposed.

8. A method for manufacturing a semiconductor structure, comprising:

alternately stacking first semiconductor material layers and second semiconductor material layers over a substrate;

patterning the first semiconductor material layers and the second semiconductor material layers to form a first fin structure in a first region of the substrate and a second fin structure in a second region of the substrate;

forming an isolation structure around the first fin structure and the second fin structure;

forming a first capping layer covering the first fin structure and a second capping layer covering the second fin structure over the isolation structure;

recessing the isolation structure to form a first gap under the first capping layer and a second gap under the second capping layer;

filling in the first gap and the second gap by a protection layer, wherein the protection layer extends from the first fin structure to the second fin structure;

removing the first capping layer, the first semiconductor material layers of the first fin structure and the second fin structure, and the second capping layer to form first nanostructures in the first region and second nanostructures in the second region;

forming a first gate structure around the first nanostructures in the first region;

forming a first source/drain structure electrically connected to the first nano structures, wherein the protection layer is separated from the second semiconductor material layers by the first gate structure.

9. The method for manufacturing the semiconductor structure as claimed in claim 8, further comprising:

forming a first mask layer over the first nanostructures and exposing the second nano structures;

growing third semiconductor material layers around the second nanostructures;

removing the first mask layer;

forming a second gate structure around the third semiconductor material layers in the second region.

10. The method for manufacturing the semiconductor structure as claimed in claim 9, further comprising:

trimming the second nanostructures before the third semiconductor material layers are formed.

11. The method for manufacturing the semiconductor structure as claimed in claim 8, further comprising:

forming a first mask layer over the first nanostructures and exposing the second nano structures;

thinning the second nano structures;

removing the first mask layer; and forming a second gate structure around the second nanostructures in the second region, wherein a first space between two neighboring first nano structures is smaller than a second space between two neighboring second nano structures.

12. The method for manufacturing the semiconductor structure as claimed in claim 11, further comprising:

patterning the first semiconductor material layers and the second semiconductor material layers to form a third fin structure in a third region of the substrate, wherein the isolation structure is formed around the third fin structure;

forming a third capping layer covering the third fin structure over the isolation structure, wherein a third gap is formed under the third capping layer when the isolation structure is recessed and is filled with the protection layer;

removing the third capping layer and the first semiconductor material layers of the third fin structure to form third nanostructures in the third region;

forming a first mask layer covering the first region and the second region of the substrate and exposing the third region of the substrate;

trimming the third nanostructures exposed by the first mask layer; and removing the first mask layer.

13. The method for manufacturing the semiconductor structure as claimed in claim 12, further comprising:

forming a second mask layer covering the first region and the third region of the substrate and exposing the second region of the substrate;

growing third semiconductor material layers surrounding each of the second nanostructures exposed by the second mask layer;

removing the second mask layer, wherein a first space between two neighboring first nanostructures is greater than a second space between two neighboring third semiconductor material layers formed on the second nanostructures and is smaller than a third space between two neighboring third nano structures.

14. A method for manufacturing a semiconductor structure, comprising:

alternately stacking first semiconductor material layers and second semiconductor material layers over a substrate;

patterning the first semiconductor material layers and the second semiconductor material layers to form a fin structure;

forming a liner layer covering the fin structure;

forming an isolation structure surrounding the fin structure over the liner layer;

forming a capping layer covering the liner layer and in direct contact with a top surface of the isolation structure;

removing an upper portion of the isolation structure to form a gap between the capping layer and the isolation structure, wherein a portion of the liner layer is exposed by the gap;

forming a protection layer cover the top surface of the isolation structure and extending into the gap;

removing the capping layer and the first semiconductor material layers to form nano structures;

forming a gate structure around the nanostructures;

forming a source/drain structure attached to the nanostructures; and forming a dielectric fin interposed in the gate structure, wherein a sidewall of the dielectric fin is covered by the protection layer.

15. The method for manufacturing the semiconductor structure as claimed in claim 14, further comprising:

recessing the fin structure to form a recess; and forming the source/drain structure in the recess, wherein the source/drain structure vertically overlaps the protection layer.

16. The method for manufacturing the semiconductor structure as claimed in claim 15, wherein the source/drain structure is in direct contact with the protection layer.

17. The method for manufacturing the semiconductor structure as claimed in claim 15, further comprising:

an etch stop layer formed over the source/drain structure, wherein the etch stop layer is in direct contact with the protection layer.

18. The method for manufacturing the semiconductor structure as claimed in claim 14, wherein a portion of the protection layer is sandwiched between the dielectric fin and the isolation structure.

19. The method for manufacturing the semiconductor structure as claimed in claim 1, wherein the protection layer is in direct contact with a bottom surface of the gate structure.

20. The method for manufacturing the semiconductor structure as claimed in claim 14, wherein the portion of the liner layer exposed by the gap is covered by the protection layer.

* * * * *